United States Patent
Achour

(10) Patent No.: US 8,334,734 B2
(45) Date of Patent: Dec. 18, 2012

(54) PRINTED MULTILAYER FILTER METHODS AND DESIGNS USING EXTENDED CRLH (E-CRLH)

(75) Inventor: Maha Achour, San Diego, CA (US)

(73) Assignee: Hollinworth Fund, L.L.C., Dover, DE (US)

( * ) Notice: Subject to any disclaimer, the term of this patent is extended or adjusted under 35 U.S.C. 154(b) by 606 days.

(21) Appl. No.: 12/547,273

(22) Filed: Aug. 25, 2009

(65) Prior Publication Data

US 2011/0050364 A1   Mar. 3, 2011

(51) Int. Cl.
H03H 7/00   (2006.01)
(52) U.S. Cl. ......... 333/185; 333/136; 333/175; 333/236
(58) Field of Classification Search .................. 333/136, 333/185, 175, 236, 239, 246
See application file for complete search history.

(56) References Cited

U.S. PATENT DOCUMENTS

| | | |
|---|---|---|
| 6,859,114 B2 | 2/2005 | Eleftheriades et al. |
| 7,012,484 B2 | 3/2006 | Chang et al. |
| 7,330,090 B2 | 2/2008 | Itoh et al. |
| 7,391,288 B1 | 6/2008 | Itoh et al. |
| 7,446,712 B2 | 11/2008 | Itoh et al. |
| 2005/0253667 A1 | 11/2005 | Itoh et al. |
| 2008/0001684 A1 | 1/2008 | Itoh et al. |
| 2008/0048917 A1 | 2/2008 | Achour et al. |
| 2008/0204327 A1 | 8/2008 | Lee et al. |
| 2008/0258981 A1 | 10/2008 | Achour et al. |
| 2009/0160578 A1 | 6/2009 | Achour |

FOREIGN PATENT DOCUMENTS

| | | |
|---|---|---|
| EP | 1376743 | 1/2004 |
| EP | 1376745 | 1/2004 |

OTHER PUBLICATIONS

Y. Horii, C Caloz and T. Itoh, "Super Compact Multi-Layered Left Handed Transmission Line and Diplexer Application," IEEE Tans. Microwave Theory Tech., vol. 53 No. 4, pp. 1527-1534, Apr. 2005.*
L. Qiang, H.-M. Lu, W. Zhao, J.-K. Wang and B. Lin "Simplified Extended Composite Right/Left Handed Transmission Line Structure for Dual Band Applications," Progress in Electromagnetic Research Letters, vol. 15, pp. 137-144, 2010.*
Caloz, C., et al., Electromagnetic Metamaterials: Transmission Line Theory and Microwave Applications, John Wiley & Sons (2006).
Itoh, T., "Invited Paper: Prospects for Metamaterials," Electronics Letters, 40(16):972-973, Aug. 2004.
Lai, A., et al., "Infinite Wavelength Resonant Antennas with Monopolar Radiation Pattern Based on Periodic Structures," IEEE Transactions on Antennas and Propagation, 55(3):868-876, Mar. 2007.
Matthaei, G., et al., Microwave Filters, Impedance-Matching Networks, and Coupling Structures, Artech House, Inc., 1980.

(Continued)

Primary Examiner — Robert Pascal
Assistant Examiner — Kimberly Glenn
(74) Attorney, Agent, or Firm — Connolly Bove Lodge & Hutz LLP

(57) ABSTRACT

Printed multilayer filter design techniques and filters based on metamaterial structures including an extended composite left and right handed (E-CRLH) metamaterial unit cell.

17 Claims, 51 Drawing Sheets

OTHER PUBLICATIONS

Rennings, A., et al., "Extended Composite Right/Left-Handed (E-CRLH) Metamaterial and its Application as Quadband Quarter-Wavelength Transmission Line," Proceedings of Asia-Pacific Microwave Conference, pp. 1405-1408, Dec. 2006.

Sievenpiper, D.F., "High-Impedance Electromagnetic Surfaces," Ph.D. Dissertation, University of California, Los Angeles, 1999.

Eleftheriades, G.V., "A Generalized Negative-Refractive-Index Transmission-Line (NRI-TL) Metamaterial for Dual-Band and Quad-Band Applications," IEEE Microwave and Wireless Components Letters, 17(6):415-417, Jun. 2007.

Guan, X., et al., "Synthesis of Dual-Band Bandpass Filters Using Successive Frequency Transformations and Circuit Conversions," IEEE Microwave and Wireless Components Letters, 16(3):110-112, Mar. 2006.

Studniberg, M., et al., "A Dual-Band Bandpass Filter Based on Generalized Negative-Refractive-Index Transmission-Lines," IEEE Microwave and Wireless Components Letters, 19(1):18-20, Jan. 2009.

* cited by examiner

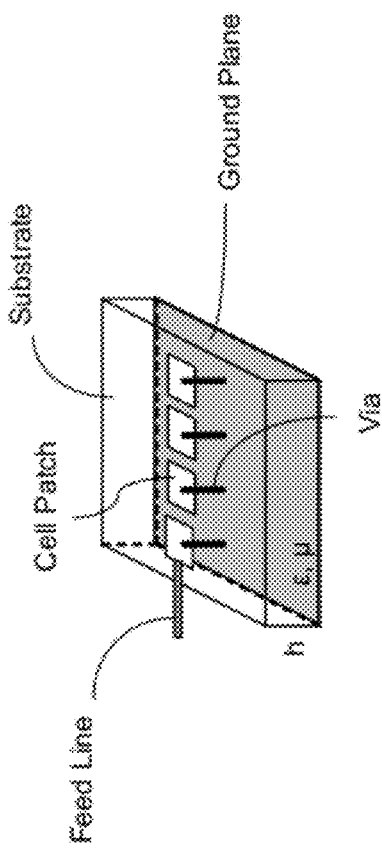
FIG. 5
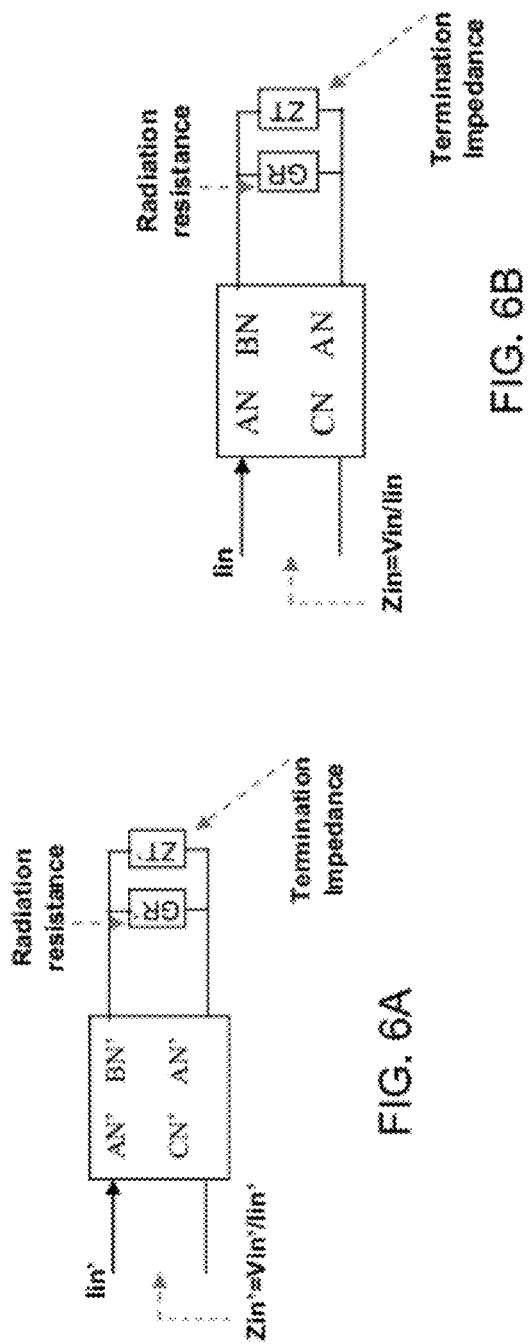
FIG. 6A
FIG. 6B

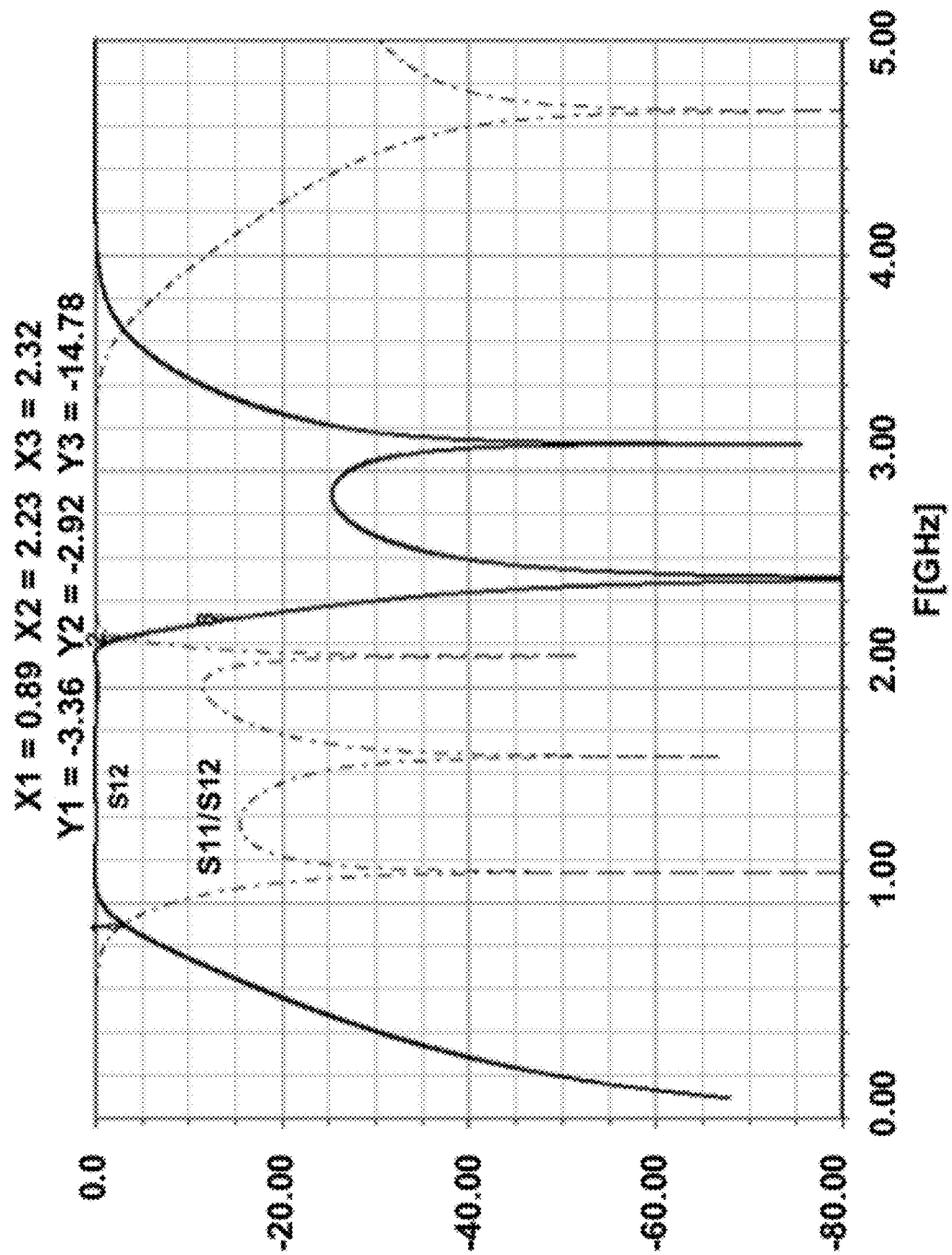

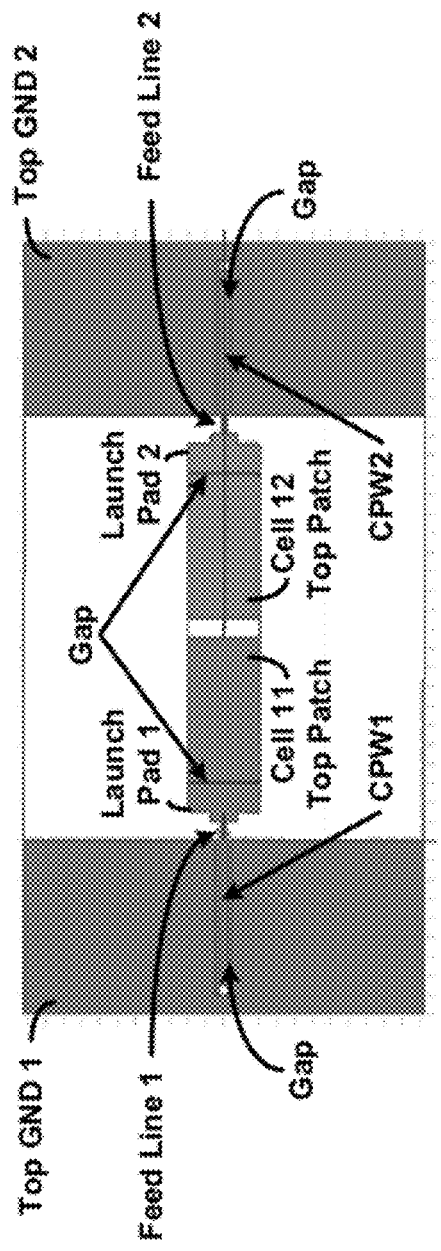
FIG. 19A Layer 1
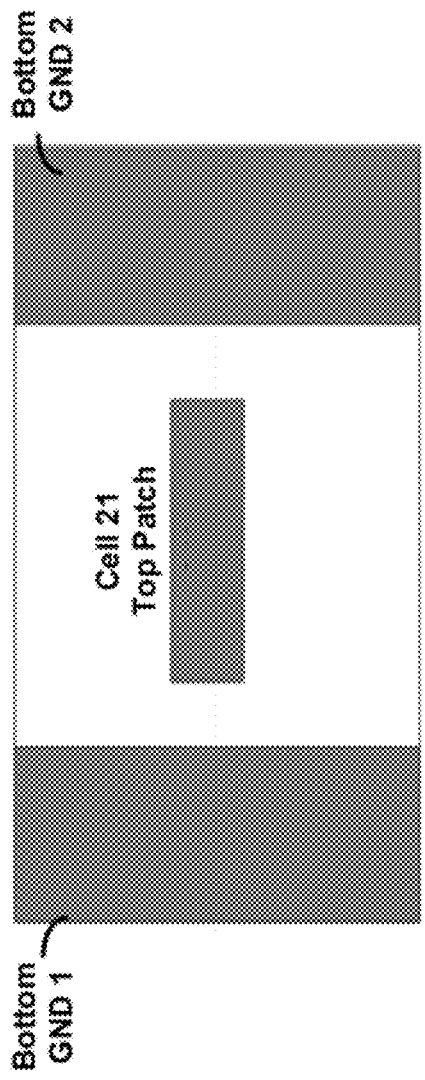
FIG. 19B Layer 2

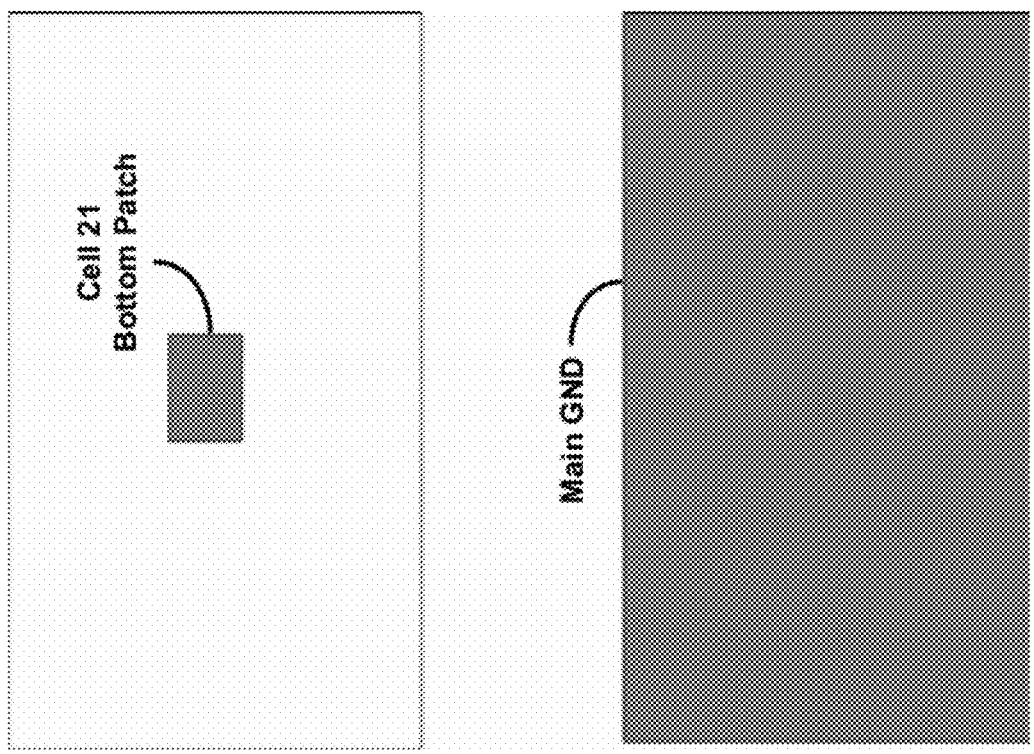

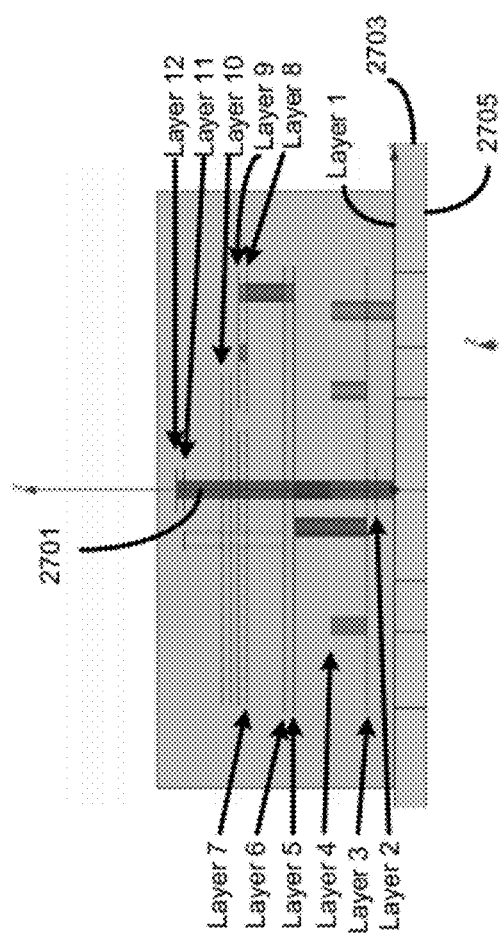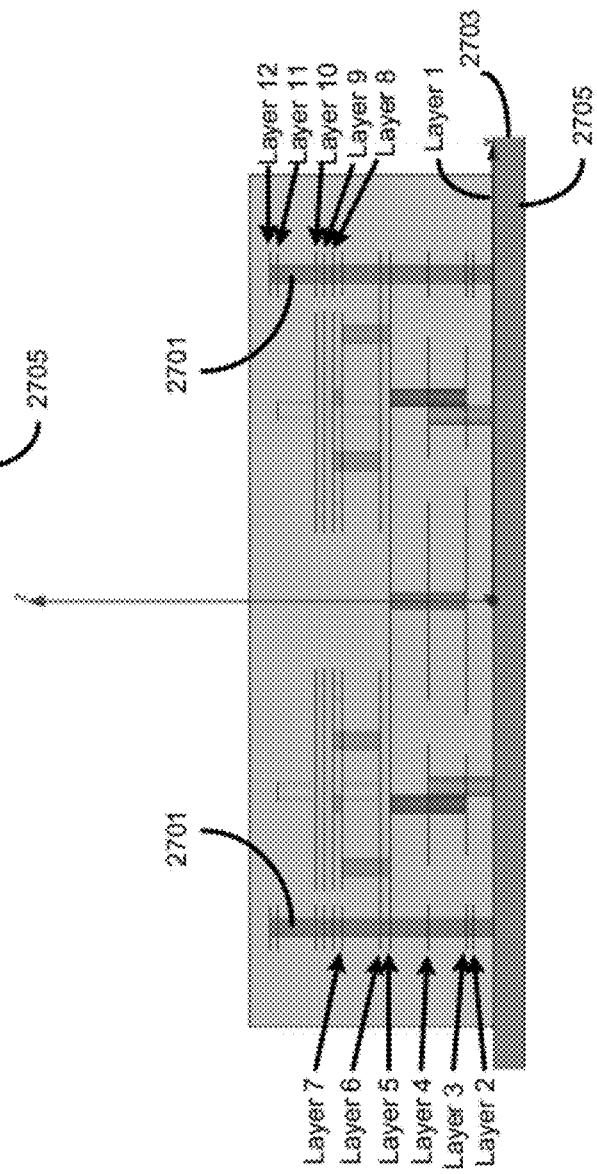
FIG. 27A
FIG. 27B

PRINTED MULTILAYER FILTER METHODS AND DESIGNS USING EXTENDED CRLH (E-CRLH)

BACKGROUND

The propagation of electromagnetic waves in most materials obeys the right handed rule for the (E,H,β) vector fields, where E is the electrical field, H is the magnetic field, and β is the wave vector. The phase velocity direction is the same as the direction of the signal energy propagation (group velocity) and the refractive index is a positive number. Such materials are "right handed" (RH). Most natural materials are RH materials. Artificial materials can also be RH materials.

A metamaterial (MTM) has an artificial structure. When designed with a structural average unit cell size p much smaller than the wavelength of the electromagnetic energy guided by the metamaterial, the metamaterial can behave like a homogeneous medium to the guided electromagnetic energy. Unlike RH materials, a metamaterial can exhibit a negative refractive index with permittivity ∈ and permeability μ being simultaneously negative, and the phase velocity direction is opposite to the direction of the signal energy propagation where the relative directions of the (E,H,β) vector fields follow the left handed rule. Metamaterials that support only a negative index of refraction with permittivity ∈ and permeability μ being simultaneously negative are pure "left handed" (LH) metamaterials.

Many metamaterials are mixtures of LH metamaterials and RH materials and thus are Composite Left and Right Handed (CRLH) metamaterials. A CRLH metamaterial can behave like a LH metamaterial at low frequencies and a RH material at high frequencies. Designs and properties of various CRLH metamaterials are described in, Caloz and Itoh, "Electromagnetic Metamaterials: Transmission Line Theory and Microwave Applications," John Wiley & Sons (2006). CRLH metamaterials and their applications in antennas are described by Tatsuo Itoh in "Invited paper: Prospects for Metamaterials," Electronics Letters, Vol. 40, No. 16 (August, 2004).

CRLH metamaterials can be structured and engineered to exhibit electromagnetic properties that are tailored for specific applications and can be used in applications where it may be difficult, impractical or infeasible to use other materials. In addition, CRLH metamaterials may be used to develop new applications and to construct new devices that may not be possible with RH materials.

Various filters based on CRLH metamaterials are examples and are described below.

SUMMARY

This application describes filter design techniques and filters based on metamaterial structures including an extended composite left and right handed (E-CRLH) metamaterial unit cell. In one aspect, a metamaterial filter is provided and includes: a mounting assembly; a printed multilayer assembly having a multiple printed conductive, vertically stacked, dielectric layers, where the top or bottom layer is attached to the mounting assembly; multiple inductors and capacitors, where each inductor and each capacitor are formed on up to six layers of the printed multilayer assembly, the number of inductors formed is greater than or equal to 4, and the number of capacitors formed is greater than 4; and multiple vias formed in the printed multilayer assembly to connect the inductors and capacitors, where the inductors, capacitors, and vias are structured to produce an E-CRLH filter.

In another aspect, a method is provided for identifying target filter performance parameters of a filter circuit, including an impedance, a frequency band, and a filter bandwidth of the filter circuit; deriving a plurality of initial circuit parameters based on the identified target filter performance parameters, cutoff frequencies, and impedance matching conditions of the filter circuit; evaluating a beta curve, return loss, transmission bands, and impedances of the filter circuit; and creating a spreadsheet to iteratively optimize and verify the circuit parameters of the filter circuit to search for a final set of circuit parameters that meet the identifying target filter performance parameters.

The filter designs and design methods described here may be implemented to provide an optimum circuit based filter design utilizing an E-CRLH type structure that is efficient, easily scales to any band, can provide for matching conditions over a targeted frequency band, and also integrates into front-end module packages. Metamaterial (MTM) that generally exhibit rich dispersion behavior to allow better control of one or more of the following filter characteristics: frequency bands, quality factor, side-band filter rejection, low insertion loss.

These and other implementations and their variations are described in detail in the attached drawings, the detailed description and the claims.

BRIEF DESCRIPTION OF THE DRAWINGS

FIG. 5 illustrates an example of a 1D CRLH MTM antenna based on four unit cells;

FIG. 6A illustrates a two-port network matrix representation for the 1D CRLH antenna equivalent circuit analogous to the TL case shown in FIG. 4A;

FIG. 6B illustrates another two-port network matrix representation for the 1D CRLH antenna equivalent circuit analogous to the TL case shown in FIG. 4B;

FIG. 11 illustrates a circuit response of the E-CRLH parameters in Table 3;

FIG. 19A-19E illustrate different views of the E-CRLH structure in FIG. 9;

FIGS. 27A-27B illustrate a short side view and long side view, respectively, of vertically stacked layers of a printed multilayer E-CRLH design;

DETAILED DESCRIPTION

Figure 1:
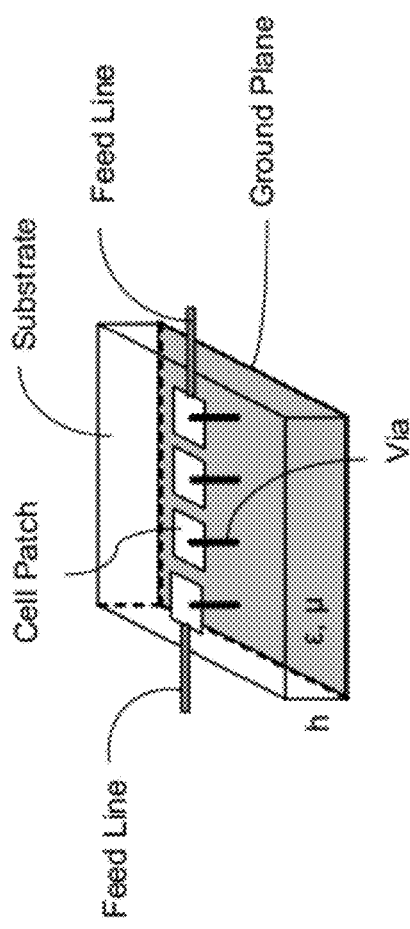
FIG. 1 illustrates an example of a 1D CRLH MTM TL based on four unit cells.

Metamaterial (MTM) structures can be used to construct antennas, transmission lines, filters and other electrical components and devices, allowing for a wide range of technology advancements such as size reduction and performance improvements. The MTM antenna structures can be fabricated on various circuit platforms, for example, a conventional FR-4 Printed Circuit Board (PCB) or a Flexible Printed Circuit (FPC) board. Examples of other fabrication techniques include thin film fabrication technique, system on chip (SOC) technique, low temperature co-fired ceramic (LTCC) technique, and monolithic microwave integrated circuit (MMIC) technique.

CRLH metamaterial structures can be applied to modern filter designs which enable communication links to remove unwanted signals and enhance selective signals from a band of frequencies. Examples of modern filter designs and techniques utilizing CRLH structures include a high-pass filter, a band-pass filter, or an impedance transformer. A few of these filter designs are described by G. Matthaei, L. Young, E. N. T. Jones, "Microwave Filters, Impedance-matching Networks, and Coupling Structures", Artech House publisher, 1980. Matthaei et al., for example, discloses a high-pass filter that is based on a pure left-handed unit cells. Other filter designs described include a band-pass and an impedance transformer filter based on CRLH unit cells. As indicated by Matthaei, the implementation of the CRLH unit cell structure is difficult to achieve in a practical microwave structure. Instead, Matthaei provides filter designs based on series inductances and impedance inverters. In Matthaei's filter design, a high number of unit cells are required to create sharp filters such as a Conventional CRLH (C-CRLH), which results in an increase in filter insertion loss due to ripples appearing in the pass band of the filter. The unit cell parameters and number of cells can be derived from coefficients listed in tables generated for different unit cells. Alternative approaches to filter designs are also available, but generally require brute force techniques to achieve optimum results.

Other CRLH structures, such as Extended Composite Right/Left-Handed (E-CRLH), are described by Rennings et al., "Extended Composite Right/Left-Handed (E-CRLH) Metamaterial and its Application as Quadband Quarter-Wavelength Transmission Line," Proceedings of Asia-Pacific Microwave Conference (2006), which is incorporated by reference as part of the specification of this application.

Conventional filter design methods, as described hereinabove, are generally difficult and cumbersome to apply in real filter designs, use too many parameters, require a large range, and difficult to match over a targeted frequency band, among other limitations. Another practical limitation includes the inability to simplify the RF Front End Module (FEM) of small wireless communication devices, such as handsets and client cards. In current FEM designs, for example, the use of Surface Acoustic Wave (SAW) based filters, rather than microwave circuit structures, can make it difficult and impractical to integrate in RFIC packages or on FEM substrates.

The present application discloses examples and implementations of filter designs and filters based on MTM structures. The MTM structures for filters are based on MTM antenna structures and MTM transmission line structures, which can be configured to generate two different frequency bands: a "low band" and a "high band." The low band includes at least one left-handed (LH) mode resonance and the high band includes at least one right-handed (RH) mode resonance. Some of the implementations in the present application are directed to cell phone applications, handheld device applications (e.g., Blackberry) and other mobile device applications, in which the antenna is expected to support multiple frequency bands with adequate performance under limited space constraints. The MTM antenna designs disclosed in the present application provide advantages over conventional antennas such as but not limited to smaller sizes, multiple resonances based on a single antenna solution, stable resonances that do not shift with the user interaction and resonant frequencies that are independent of the physical size. The frequency bands in cell phone and mobile device applications are comprised of: the cellular band (824-960 MHz) which actually includes two bands, CDMA and GSM bands; and the PCS/DCS band (1710-2170 MHz) which actually includes three bands: PCS, DCS and WCDMA bands. A quad-band antenna covers one of the CDMA and GSM bands in the cellular band and all three bands in the PCS/DCS band. A penta-band antenna covers all five bands (two in the cellular band and three in the PCS/DCS band).

Exemplary MTM antenna structures are described in U.S. patent application Ser. No. 11/741,674 entitled "Antennas, Devices, and Systems Based on Metamaterial Structures," filed on Apr. 27, 2007, and U.S. patent application Ser. No. 11/844,982 entitled "Antennas Based on Metamaterial Structures," filed on Aug. 24, 2007, which are hereby incorporated by reference as part of the specification of the present application.

An MTM antenna or MTM transmission line (TL) is a MTM structure with one or more MTM unit cells. The equivalent circuit for each MTM unit cell includes a right-handed series inductance (LR), a right-handed shunt capacitance (CR), a left-handed series capacitance (CL), and a left-handed shunt inductance (LL). LL and CL are structured and connected to provide the left-handed properties to the unit cell. This type of CRLH TLs or antennas can be implemented by using distributed circuit elements, lumped circuit elements or a combination of both. Each unit cell is smaller than about $\lambda/4$ where $\lambda$ is the wavelength of the electromagnetic signal that is transmitted in the CRLH TL or antenna.

A pure LH metamaterial follows the left-hand rule for the vector trio (E, H, β), and the phase velocity direction is opposite to the signal energy propagation. Both the permittivity $\in$ and permeability µ of the LH material are negative. A CRLH metamaterial can exhibit both left-hand and right-hand electromagnetic modes of propagation depending on the regime or frequency of operation. Under certain circumstances, a CRLH metamaterial can exhibit a non-zero group velocity when the wavevector of a signal is zero. This situation occurs when both left-hand and right-hand modes are balanced. In an unbalanced mode, there is a bandgap in which electromagnetic wave propagation is forbidden. In the balanced case, the dispersion curve does not show any discontinuity at the transition point of the propagation constant $\beta(\omega_o)=0$ between the left- and right-hand modes, where the guided wavelength is infinite, i.e., $\lambda_g = 2\pi/|\beta| \to \infty$, while the group velocity is positive:

$$v_g = \left.\frac{d\omega}{d\beta}\right|_{\beta=0} > 0.$$

This state corresponds to the zeroth order mode m=0 in a TL implementation in the LH region. The CRHL structure supports a fine spectrum of low frequencies with the dispersion relation that follows the negative β parabolic region. This allows a physically small device to be built that is electromagnetically large with unique capabilities in manipulating and controlling near-field radiation patterns. When this TL is used as a Zeroth Order Resonator (ZOR), it allows a constant amplitude and phase resonance across the entire resonator. The ZOR mode can be used to build MTM-based power combiners and splitters or dividers, directional couplers, matching networks, and leaky wave antennas.

In the case of RH TL resonators, the resonance frequency corresponds to electrical lengths $\eta_m=\beta_m l=m\pi$ (m=1, 2, 3 . . . ), where l is the length of the TL. The TL length should be long to reach low and wider spectrum of resonant frequencies. The operating frequencies of a pure LH material are at low frequencies. A CRLH MTM structure is very different from an RH or LH material and can be used to reach both high and low spectral regions of the RF spectral ranges. In the CRLH case $\theta_m=\beta_m l=m\pi$, where l is the length of the CRLH TL and the parameter m=0, ±1, ±2, ±3 . . . ±∞.

FIG. 1 illustrates an example of a 1D CRLH MTM TL based on four unit cells. One unit cell includes a cell patch and a via, and is a minimum unit that repeats itself to build the MTM structure. The four cell patches are placed on a substrate with respective centered vias connected to the ground plane.

Figure 2:
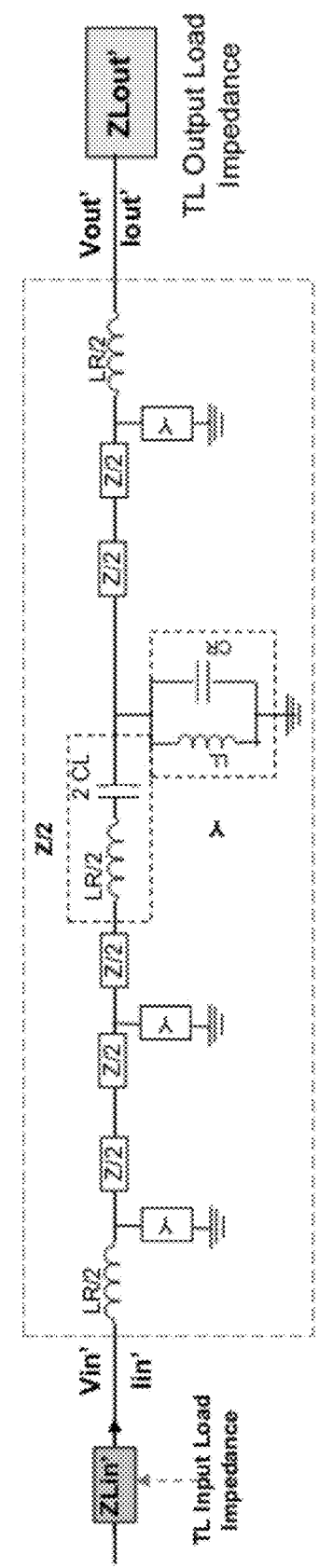
FIG. 2 illustrates an equivalent circuit of the 1D CRLH MTM TL shown in FIG. 1.

FIG. 2 shows an equivalent network circuit of the 1D CRLH MTM TL in FIG. 1. The ZLin' and ZLout' correspond to the TL input load impedance and TL output load impedance, respectively, and are due to the TL coupling at each end. This is an example of a printed two-layer structure. LR is due to the cell patch on the dielectric substrate, and CR is due to the dielectric substrate being sandwiched between the cell patch and the ground plane. CL is due to the presence of two adjacent cell patches, and the via induces LL.

Each individual unit cell can have two resonances $\omega_{SE}$ and $\omega_{SH}$ corresponding to the series (SE) impedance Z and shunt (SH) admittance Y. In FIG. 2, the Z/2 block includes a series combination of LR/2 and 2CL, and the Y block includes a parallel combination of LL and CR. The relationships among these parameters are expressed as follows:

$$\omega_{SH} = \frac{1}{\sqrt{LL\ CR}};\ \omega_{SE} = \frac{1}{\sqrt{LR\ CL}};\ \omega_R = \frac{1}{\sqrt{LR\ CR}};\quad \text{Eq. (1)}$$

$$\omega_L = \frac{1}{\sqrt{LL\ CL}}\ \text{where,}$$

$$Z = j\omega LR + \frac{1}{j\omega CL}\ \text{and}\ Y = j\omega CR + \frac{1}{j\omega LL}.$$

The two unit cells at the input/output edges in FIG. 1 do not include CL, since CL represents the capacitance between two adjacent cell patches and is missing at these input/output edges. The absence of the CL portion at the edge unit cells prevents $\omega_{SE}$ frequency from resonating. Therefore, only $\omega_{SH}$ appears as an m=0 resonance frequency.

Figure 3:
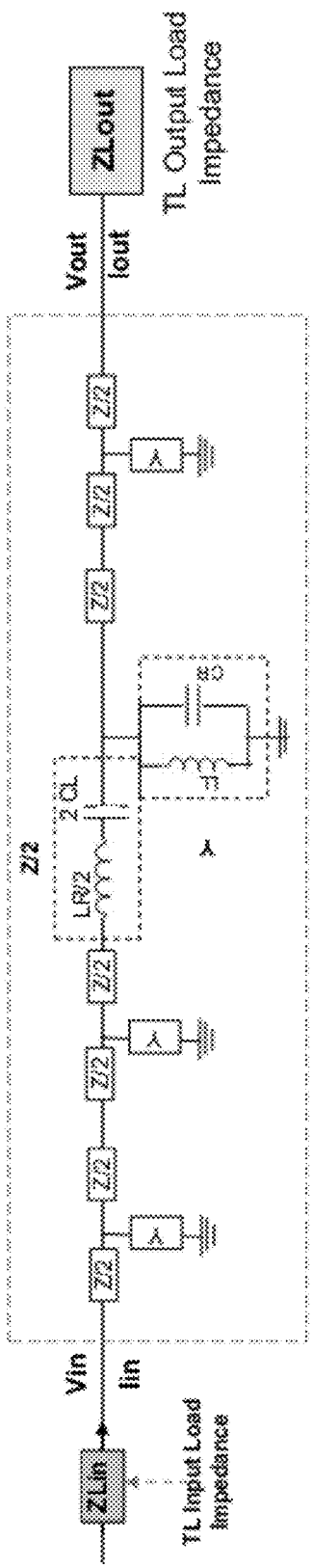
FIG. 3 illustrates another representation of the equivalent circuit of the 1D CRLH MTM TL shown in FIG. 1.

To simplify the computational analysis, a portion of the ZLin' and ZLout' series capacitor is included to compensate for the missing CL portion, and the remaining input and output load impedances are denoted as ZLin and ZLout, respectively, as seen in FIG. 3. Under this condition, all unit cells have identical parameters as represented by two series Z/2 blocks and one shunt Y block in FIG. 3, where the Z/2 block includes a series combination of LR/2 and 2CL, and the Y block includes a parallel combination of LL and CR.

Figure 4A:
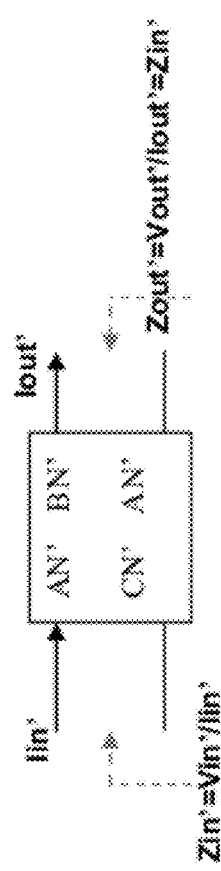
FIG. 4A illustrates a two-port network matrix representation for the 1D CRLH TL equivalent circuit shown in FIG. 2.
Figure 4B:
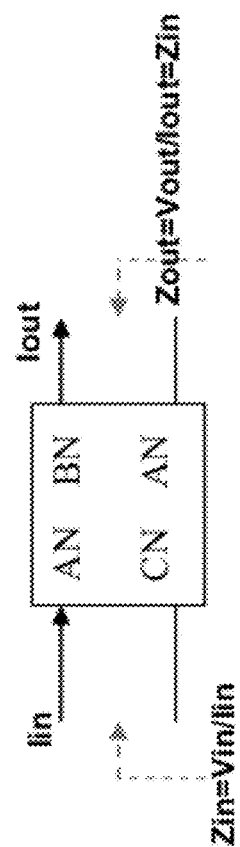
FIG. 4B illustrates another two-port network matrix representation for the 1D CRLH TL equivalent circuit shown in FIG. 3.

FIG. 4A and FIG. 4B illustrate a two-port network matrix representation for TL circuits without the load impedances as shown in FIG. 2 and FIG. 3, respectively, FIG. 5 illustrates an example of a 1D CRLH MTM antenna based on four unit cells. FIG. 6A shows a two-port network matrix representation for the antenna circuit in FIG. 5. FIG. 6B shows a two-port network matrix representation for the antenna circuit in FIG. 5 with the modification at the edges to account for the missing CL portion to have all the unit cells identical. FIGS. 6A and 6B are analogous to the TL circuits shown in FIGS. 4A and 4B, respectively.

In matrix notations, FIG. 4B represents the relationship given as below:

$$\begin{pmatrix} Vin \\ Iin \end{pmatrix} = \begin{pmatrix} AN & BN \\ CN & AN \end{pmatrix} \begin{pmatrix} Vout \\ Iout \end{pmatrix}, \qquad \text{Eq. (2)}$$

where AN=DN because the CRLH MTM TL circuit in FIG. 3 is symmetric when viewed from Vin and Vout ends.

In FIGS. 6A and 6B, the parameters GR' and GR represent a radiation resistance, and the parameters ZT' and ZT represent a termination impedance. Each of ZT', ZLin' and ZLout' includes a contribution from the additional 2CL as expressed below:

$$ZLin' = ZLin + \frac{2}{j\omega CL}, \quad ZLout' = ZLout + \frac{2}{j\omega CL}, \qquad \text{Eq. (3)}$$

$$ZT' = ZT + \frac{2}{j\omega CL}$$

Since the radiation resistance GR or GR' can be derived by either building or simulating the antenna, it may be difficult to optimize the antenna design. Therefore, it is preferable to adopt the TL approach and then simulate its corresponding antennas with various terminations ZT. The relationships in Eq. (1) are valid for the circuit in FIG. 2 with the modified values AN', BN', and CN', which reflect the missing CL portion at the two edges.

The frequency bands can be determined from the dispersion equation derived by letting the N CRLH cell structure resonate with $n\pi$ propagation phase length, where n=0, ±1, ±2, ... ±N. Here, each of the N CRLH cells is represented by Z and Y in Eq. (1), which is different from the structure shown in FIG. 2, where CL is missing from end cells. Therefore, one might expect that the resonances associated with these two structures are different. However, extensive calculations show that all resonances are the same except for n=0, where both $\omega_{SE}$ and $\omega_{SH}$ resonate in the structure in FIG. 3, and only $\omega_{SH}$ resonates in the structure in FIG. 2. The positive phase offsets (n>0) correspond to RH region resonances and the negative values (n<0) are associated with LH region resonances.

The dispersion relation of N identical CRLH cells with the Z and Y parameters is given below:

$$\begin{cases} N\beta p = \cos^{-1}(A_N), \Rightarrow |A_N| \le 1 \Rightarrow 0 \le \chi = -ZY \le 4 \forall N \\ \text{where } A_N = 1 \text{ at even resonances } |n| = 2m \in \left\{0, 2, 3, \ldots 2 \times Int\left(\frac{N-1}{2}\right)\right\} \\ \text{and } A_N = -1 \text{ at odd resonances } |n| = 2m+1 \in \left\{1, 3, \ldots \left(2 \times Int\left(\frac{N}{2}\right) - 1\right)\right\} \end{cases} \qquad \text{Eq. (4)}$$

where Z and Y are given in Eq. (1), AN is derived from the linear cascade of N identical CRLH unit cells as in FIG. 3, and p is the cell size. Odd n=(2 m+1) and even n=2 m resonances are associated with AN=−1 and AN=1, respectively. For AN' in FIG. 4A and FIG. 6A, the n=0 mode resonates at $\omega_0=\omega_{SH}$ only and not at both $\omega_{SE}$ and $\omega_{SH}$ due to the absence of CL at the end cells, regardless of the number of cells. Higher-order frequencies are given by the following equations for the different values of $\chi$ specified in Table 1:

For $n > 0$, Eq. (5)

$$\omega_{\pm n}^2 = \frac{\omega_{SH}^2 + \omega_{SE}^2 + \chi\omega_R^2}{2} \pm \sqrt{\left(\frac{\omega_{SH}^2 + \omega_{SE}^2 + \chi\omega_R^2}{2}\right)^2 - \omega_{SH}^2\omega_{SE}^2}$$

Table 1 provides $\chi$ values for N=1, 2, 3, and 4. It should be noted that the higher-order resonances |n|>0 are the same regardless if the full CL is present at the edge cells (FIG. 3) or absent (FIG. 2). Furthermore, resonances close to n=0 have small $\chi$ values (near $\chi$ lower bound 0), whereas higher-order resonances tend to reach $\chi$ upper bound 4 as stated in Eq. (4).

TABLE 1

Resonances for N = 1, 2, 3 and 4 cells

| N\Modes | |n| = 0 | |n| = 1 | |n| = 2 | |n| = 3 |
|---|---|---|---|---|
| N = 1 | $\chi_{(1, 0)} = 0$; $\omega_0 = \omega_{SH}$ | | | |
| N = 2 | $\chi_{(2, 0)} = 0$; $\omega_0 = \omega_{SH}$ | $\chi_{(2, 1)} = 2$ | | |
| N = 3 | $\chi_{(3, 0)} = 0$; $\omega_0 = \omega_{SH}$ | $\chi_{(3, 1)} = 1$ | $\chi_{(3, 2)} = 3$ | |
| N = 4 | $\chi_{(4, 0)} = 0$; $\omega_0 = \omega_{SH}$ | $\chi_{(4, 1)} = 2 - \sqrt{2}$ | $\chi_{(4, 2)} = 2$ | |

Figure 7A:
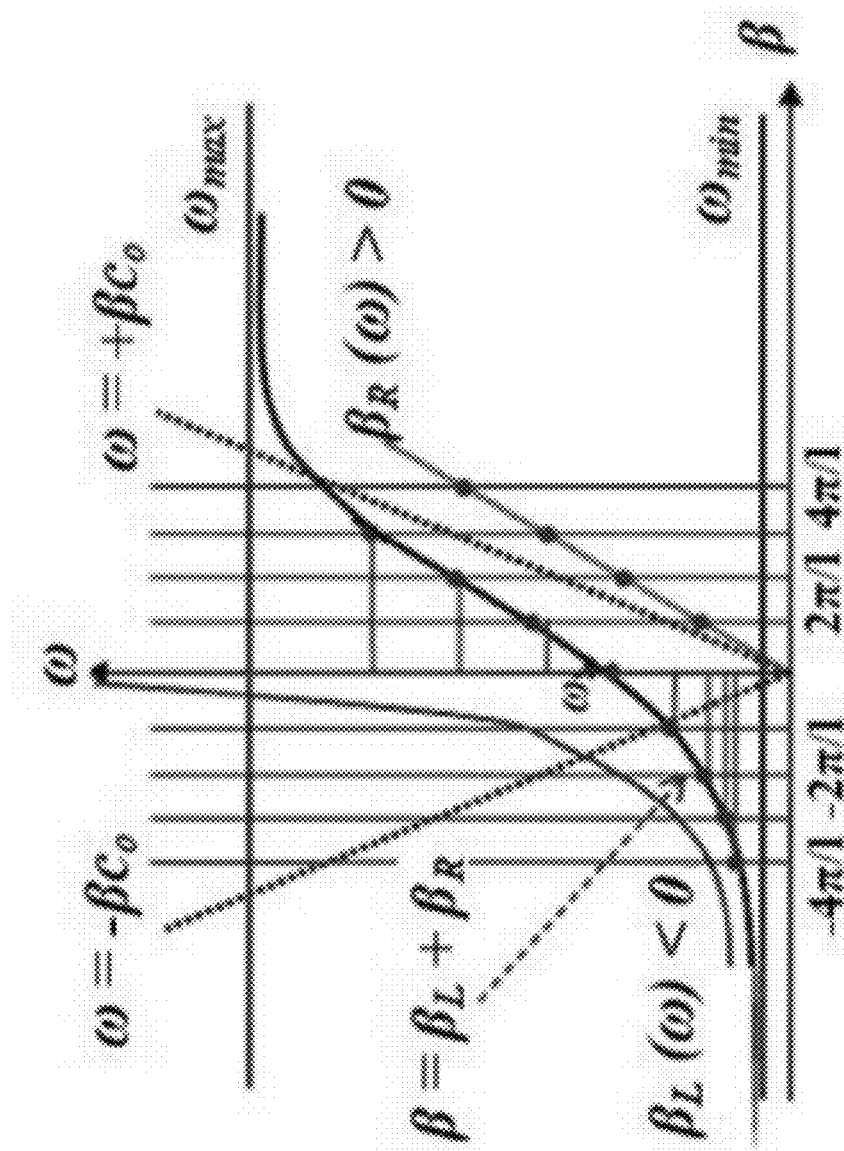
FIG. 7A illustrates an example of a dispersion curve for the balanced case.
Figure 7B:
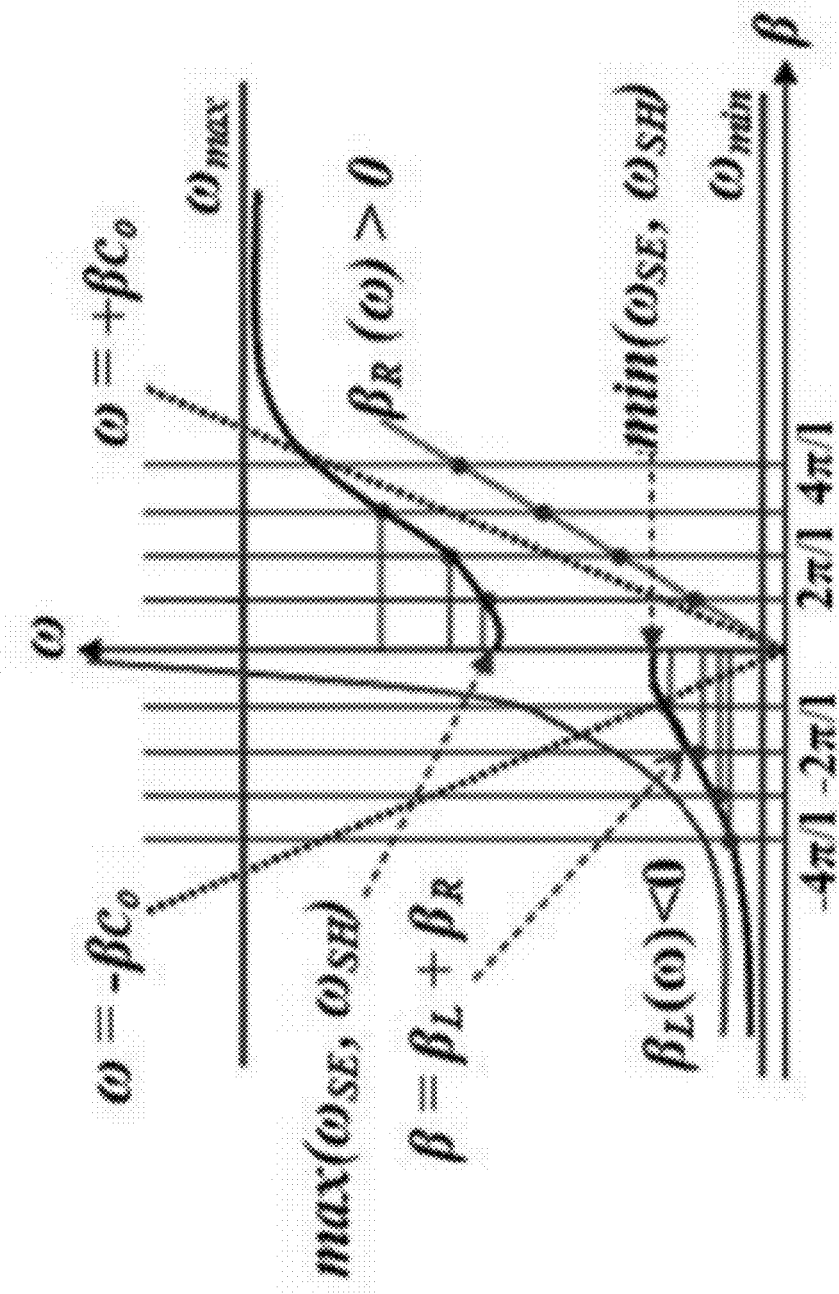
FIG. 7B illustrates an example of a dispersion curve for the unbalanced case.

The dispersion curve $\beta$ as a function of frequency $\omega$ is illustrated in FIGS. 7A and 7B for the $\omega_{SE}=\omega_{SH}$ (balanced, i.e., LR CL=LL CR) and $\omega_{SE}\ne\omega_{SH}$ (unbalanced) cases, respectively. In the latter case, there is a frequency gap between min ($\omega_{SE}$, $\omega_{SH}$) and max ($\omega_{SE}$, $\omega_{SE}$). The limiting frequencies $\omega_{min}$ and $\omega_{max}$ values are given by the same resonance equations in Eq. (5) with $\chi$ reaching its upper bound $\omega=4$ as stated in the following equations:

$$\omega_{min}^2 = \frac{\omega_{SH}^2 + \omega_{SE}^2 + 4\omega_R^2}{2} - \sqrt{\left(\frac{\omega_{SH}^2 + \omega_{SE}^2 + 4\omega_R^2}{2}\right)^2 - \omega_{SH}^2 \omega_{SE}^2} \quad (6)$$

$$\omega_{max}^2 = \frac{\omega_{SH}^2 + \omega_{SE}^2 + 4\omega_R^2}{2} + \sqrt{\left(\frac{\omega_{SH}^2 + \omega_{SE}^2 + 4\omega_R^2}{2}\right)^2 - \omega_{SH}^2 \omega_{SE}^2}.$$

In addition, FIGS. 7A and 7B provide examples of the resonance position along the dispersion curves. In the RH region (n>0) the structure size l=Np, where p is the cell size, increases with decreasing frequency. In contrast, in the LH region, lower frequencies are reached with smaller values of Np, hence size reduction. The dispersion curves provide some indication of the bandwidth around these resonances. For instance, LH resonances have the narrow bandwidth because the dispersion curves are almost flat. In the RH region, the bandwidth is wider because the dispersion curves are steeper. Thus, the first condition to obtain broadbands, $1^{st}$ BB condition, can be expressed as follows:

$$COND1: 1^{st} \; BB \; \text{condition} \; \left|\frac{d\beta}{d\omega}\right|_{res} = \left|-\frac{\frac{d(AN)}{d\omega}}{\sqrt{(1-AN^2)}}\right|_{res} \quad \text{Eq. (7)}$$

$$\ll 1 \text{ near } \omega = \omega_{res} = \omega_0, \omega_{\pm 1},$$

$$\omega_{\pm 2} \ldots \Rightarrow \left|\frac{d\beta}{d\omega}\right| = \left|\frac{\frac{d\chi}{d\omega}}{2p\sqrt{\chi\left(1-\frac{\chi}{4}\right)}}\right|_{res}$$

$$\ll 1 \text{ with } p =$$

$$\text{cell size and } \frac{d\chi}{d\omega}\bigg|_{res} = \frac{2\omega_{\pm n}}{\omega_R^2}\left(1 - \frac{\omega_{SE}^2 \omega_{SH}^2}{\omega_{\pm n}^4}\right),$$

where $\chi$ is given in Eq. (4) and $\omega_R$ is defined in Eq. (1). The dispersion relation in Eq. (4) indicates that resonances occur when |AN|=1, which leads to a zero denominator in the $1^{st}$ BB condition (COND1) of Eq. (7). As a reminder, AN is the first transmission matrix entry of the N identical unit cells (FIG. 4B and FIG. 6B). The calculation shows that COND1 is indeed independent of N and given by the second equation in Eq. (7). It is the values of the numerator and $\chi$ at resonances, which are shown in Table 1, that define the slopes of the dispersion curves, and hence possible bandwidths. Targeted structures are at most Np=$\lambda$/40 in size with the bandwidth exceeding 4%. For structures with small cell sizes p, Eq. (7) indicates that high $\omega_R$ values satisfy COND1, i.e., low CR and LR values, since for n<0 resonances occur at $\chi$ values near 4 in Table 1, in other terms $(1-\chi/4\rightarrow 0)$.

As previously indicated, once the dispersion curve slopes have steep values, then the next step is to identify suitable matching. Ideal matching impedances have fixed values and may not require large matching network footprints. Here, the word "matching impedance" refers to a feed line and termination in the case of a single side feed such as in antennas. To analyze an input/output matching network, Zin and Zout can be computed for the TL circuit in FIG. 4B. Since the network in FIG. 3 is symmetric, it is straightforward to demonstrate that Zin=Zout. It can be demonstrated that Zin is independent of N as indicated in the equation below:

$$Zin^2 = \frac{BN}{CN} = \frac{B1}{C1} = \frac{Z}{Y}\left(1 - \frac{\chi}{4}\right), \quad \text{Eq. (8)}$$

which has only positive real values. One reason that B1/C1 is greater than zero is due to the condition of |AN|≦1 in Eq. (4), which leads to the following impedance condition:

$$0 \leq ZY = \chi \leq 4.$$

The $2^{nd}$ broadband (BB) condition is for Zin to slightly vary with frequency near resonances in order to maintain constant matching. Remember that the real input impedance Zin' includes a contribution from the CL series capacitance as stated in Eq. (3). The $2^{nd}$ BB condition is given below:

COND2: $2^{ed}$ BB condition near resonances, Eq. (9)

$$\left.\frac{dZin}{d\omega}\right|_{near\;res} \ll 1.$$

Different from the transmission line example in FIG. 2 and FIG. 3, antenna designs have an open-ended side with an infinite impedance which poorly matches the structure edge impedance. The capacitance termination is given by the equation below:

$$Z_T = \frac{AN}{CN}, \quad \text{Eq. (10)}$$

which depends on N and is purely imaginary. Since LH resonances are typically narrower than RH resonances, selected matching values are closer to the ones derived in the n<0 region than the n>0 region.

To increase the bandwidth of LH resonances, the shunt capacitor CR should be reduced. This reduction can lead to higher $\omega_R$ values of steeper dispersion curves as explained in Eq. (7). There are various methods of decreasing CR, including but not limited to: 1) increasing substrate thickness, 2) reducing the cell patch area, 3) reducing the ground area under the top cell patch, resulting in a "truncated ground," or combinations of the above techniques.

In this application, filter designs and methods are provided for optimizing and verifying filter designs with or without MTM structures. Several filters based on metamaterial structures are described in U.S. patent application Ser. No. 12/272,781 filed on Nov. 17, 2008 and entitled "Filter Design Methods and Filters Based on Metamaterial Structures." The entire disclosure of the application Ser. No. 12/272,781 is incorporated by reference as part of the disclosure of this document.

The application Ser. No. 12/272,781 discloses filter techniques and apparatus based on extended CRLH (E-CRLH) metamaterial structures, including side band filters, high-Q filters, broadband filters, and narrowband filters. For example, Steps 1-6 outlines the general methods for extracting circuit parameters of various E-CRLH filter designs shown in Table 2.

TABLE 2

List and description of filter designs
E-CRLH

I. Design 1 BE (Balanced Extended)
BE 1: Side band filter rejection can be steep TABLE 2-continued List and description of filter designs
E-CRLH II. Design 2 UE (Unbalanced Extended)
UE 2.1: High Q filter targeting 700 MHz filter market
Design approach is scalable to any band.
UE 2.2: Broadband filter with sharp side band rejection.
Diplexer design with impedance switching
UE 2.3: Narrowband filter with sharp side band rejection.

Step 1: Identify a filter circuit. Next, solve for impedance and a frequency band to extract circuit parameters in order to realize the filter. In other words, provide a full analysis on how to derive cell parameters given specific target bands, bandwidth, and matching conditions.

Step 2: Create a Matlab code or equivalent technical computing software to verify beta curves, return loss, transmission band, and impedance of the filter.

Step 3: Create an Excel spreadsheet (or equivalent spreadsheet) for parameter extraction that supports a fast, iterative optimization and verification with the Matlab code (or equivalent technical computing software).

Step 4: For discrete circuit designs, verify circuit performance using Ansoft Circuit Designer (or equivalent circuit design software tool).

Step 5: For fully printed circuit designs, use the Extended Excel spreadsheet (or equivalent spreadsheet) to map fully printed design parameters to the circuit design parameters for filter realization. Alternative realizations can include a combination of fully printed and discrete inductors and capacitors.

Step 6: Build and verify the design on FR4 (or equivalent substrate) for a quick verification. In other words, fabricate multiple designs using discrete components and printed lumped elements, which can be easily combined to create hybrid discrete and printed designs. Printed, discrete, or hybrid printed/discrete filter designs can be easily modified to target alternative substrates such as silicon or ceramic, or fabrication techniques such as LTCC. In addition, this design methodology can be applied to in designing a filter to tune the target filter quality factor Q and the filter operating frequency.

Figure 8A:
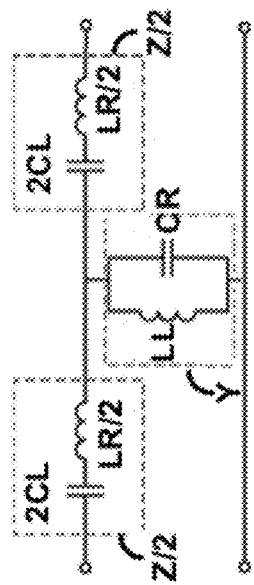
FIGS. 8A-8C illustrate an equivalent circuit of a symmetric CRLH unit cell: (a) Conventional, (b) Dual, (c) Extended.
Figure 8B:
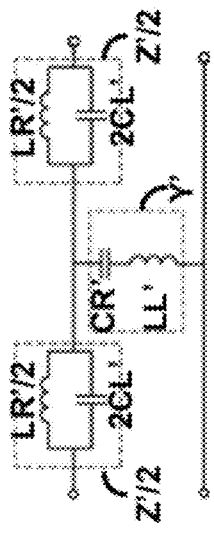
Figure 8C:
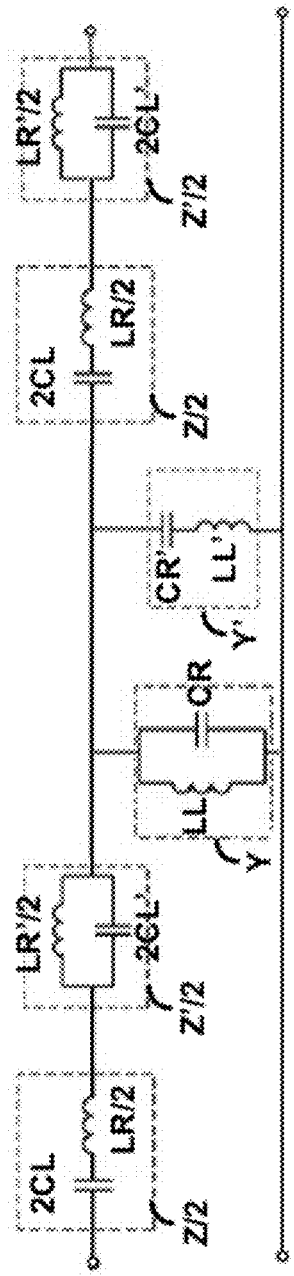

E-CRLH (Designs 1 and 2):

An Extended Composite Right Left Handed (E-CRLH) single cell is illustrated in FIG. 8C. The E-CRLH cell includes a series inductor LR and a series capacitance CL that in combination produce a series resonance $\omega_{SE}$, a shunt inductor LL and a shunt capacitance CR that in combination produce a shunt resonance $\omega_{SH}$, a series inductor LR' and a series capacitance CL' that in combination produce a series resonance $\omega_{SE'}$, and a shunt inductor LL' and a shunt capacitance CR' that in combination produce a shunt resonance $\omega_{SH'}$. The circuit elements in this E-CRLH cell are arranged to form a symmetric cell structure for the E-CRLH unit cell where the input and output of the E-CRLH unit cell have a common circuit structure.

To an extent, the E-CRLH cell in FIG. 8C can be viewed as a non-linear combination of a Conventional CRLH (C-CRLH) cell (FIG. 8A) and its Dual CRLH (D-CRLH) cell (FIG. 8B). A C-CRLH structure resonates in the LH region at low frequency bands and resonates in the RH region at high frequency bands. In this case, the C-CRLH structure effectively behaves like a band-pass filter that gets sharper as the number of cells is increased. Increasing the number of cells can lead to undesirable conditions such as an increase in transmission loss and larger structure sizes.

A D-CRLH structure, unlike the C-CRLH structure, resonates in the RH region at low frequencies, resonates in the LH region at high frequencies, and acts like stop-band filter. C-CRLH and D-CRLH structures can be combined linearly because each is easier to analyze and implement than the E-CRLH structure. However, this linear combination generally yields to structures that are dominated by the stop-band feature associated with the D-CRLH structure rather than the band-pass properties of C-CRLH.

As previously presented and in U.S. patent application Ser. No. 11/741,674 entitled "Antennas, Devices, and Systems Based on Metamaterial Structures," filed on Apr. 27, 2007, and U.S. patent application Ser. No. 11/844,982 entitled "Antennas Based on Metamaterial Structures," filed on Aug. 24, 2007, full analysis and methods to design a fully printed and a fully discrete C-CRLH structure for given resonance bands and bandwidth (Q) are provided for cells with full bottom ground GND and truncated bottom ground GND. The same methodology and principles used in designing C-CRLH type filters are followed in the E-CRLH filter design except for the use a more complex unit cell structure E-CRLH as illustrated in FIG. 8C. In comparison to CRLH structures, the resulting differences for E-CRLH structures can be attributed to the presence of the additional LR', CR', LL', CL' parameters.

Four zero order $\omega_{01}$, $\omega_{02}$, $\omega_{03}$, and $\omega_{04}$ resonances that an E-CRLH cell exhibits are listed below in Eq. (12) and Eq. (13). Examples of a fully printed E-CRLH design (FIGS. 19A-E and FIG. 9) and a fully discrete E-CRLH design with pads for components (FIG. 10) are illustrated. Alternatively, a hybrid printed/discrete structure can also be used to realize E-CRLH filter designs.

$$\omega_{SH} = \frac{1}{\sqrt{LL\ CR}};\ \omega_{SE} = \frac{1}{\sqrt{LR\ CL}};$$

$$\omega'_{SH} = \frac{1}{\sqrt{LL'\ CR'}};\ \omega'_{SE} = \frac{1}{\sqrt{LR'\ CL'}}$$

$$Q_1 = \omega_{SE}^2 + \omega'^2_{SE} + \frac{1}{LR\ CL'}\ \ Q_2 = \omega_{SH}^2 + \omega'^2_{SH} + \frac{1}{CR\ LL'}$$

Eq. (12)

$$\omega_{0,1}^2 = \frac{1}{2}\left|Q_1 - \sqrt{Q_1 - 4\omega_{SE}^2 \omega'^2_{SE}}\right|$$

$$\omega_{0,2}^2 = \frac{1}{2}\left|Q_1 + \sqrt{Q_1 - 4\omega_{SE}^2 \omega'^2_{SE}}\right|$$

$$\omega_{0,3}^2 = \frac{1}{2}\left|Q_2 - \sqrt{Q_2 - 4\omega_{SH}^2 \omega'^2_{SH}}\right|$$

$$\omega_{0,4}^2 = \frac{1}{2}\left|Q_2 + \sqrt{Q_2 - 4\omega_{SH}^2 \omega'^2_{SH}}\right|$$

Eq. (13)

The impedance is given by Eqs. (14A):

$$Zc = \sqrt{\frac{Z}{Y}\left(1 + \frac{ZY}{4}\right)};\ \text{where}$$

$$Z = j\omega LR\left(1 - \frac{\omega_{SE}^2}{\omega^2}\right) + \frac{1}{j\omega CL'\left(1 - \frac{\omega'^2_{SE}}{\omega^2}\right)}\ \text{and}$$

$$Y = j\omega CR\left(1 - \frac{\omega_{SH}^2}{\omega^2}\right) + \frac{1}{j\omega LL'\left(1 - \frac{\omega'^2_{SH}}{\omega^2}\right)}$$

Eqs. (14A)

In an alternative implementation of the E-CRLH design, the series inductor LR, the series capacitance CL, the shunt inductor LL, the shunt capacitance CR, the series inductor LR', the series capacitance CL', the shunt inductor LL' and the shunt capacitance CR' are selected to have values that render $\omega_{SE}$ and $\omega_{SH'}$ to be substantially equal, and $\omega_{SE}$ and $\omega_{SE'}$ to be substantially equal.

Figure 12A:
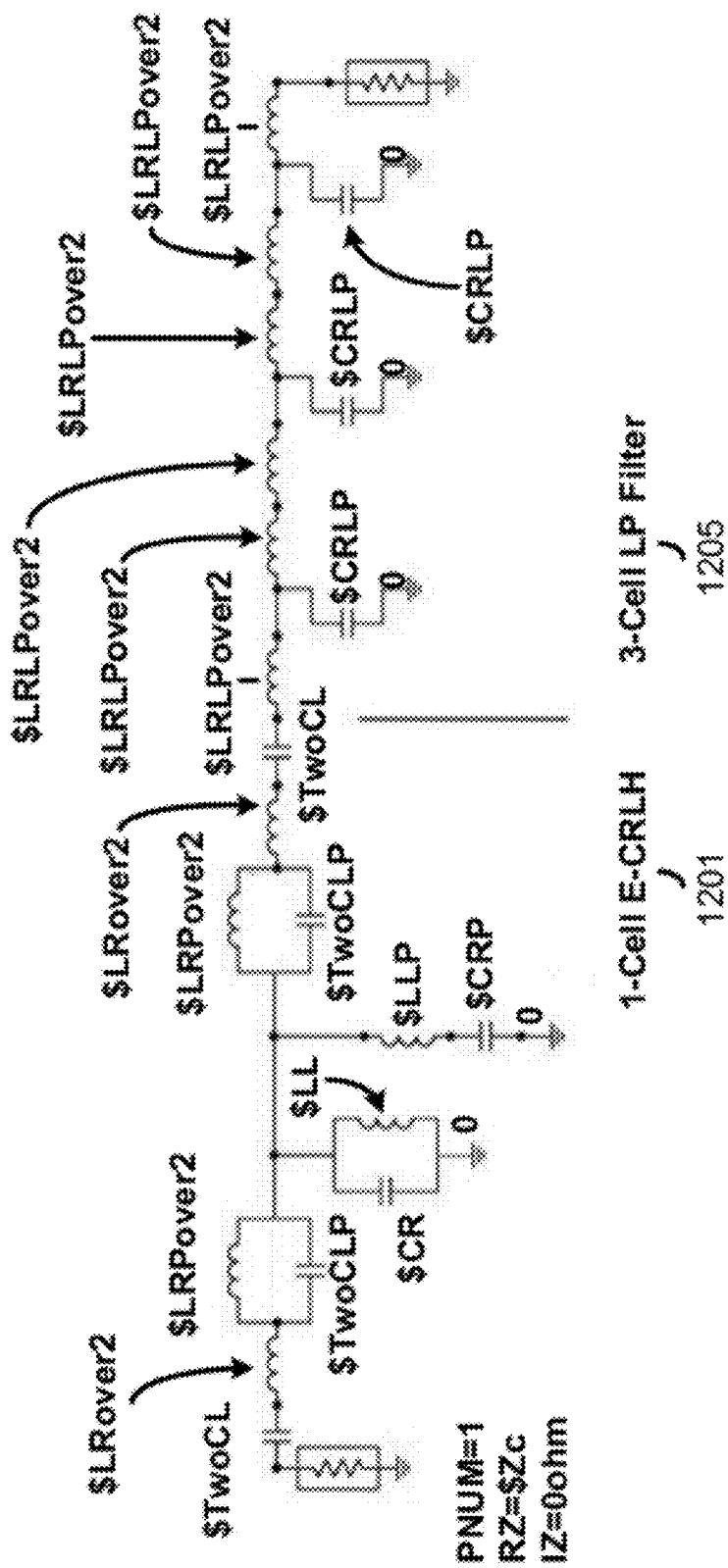
FIG. 12A illustrates a filter design using a 1-cell E-CRLH with parameters listed in Table 3 and an LP filter described in FIGS. 10A-10B.
Figure 12B:
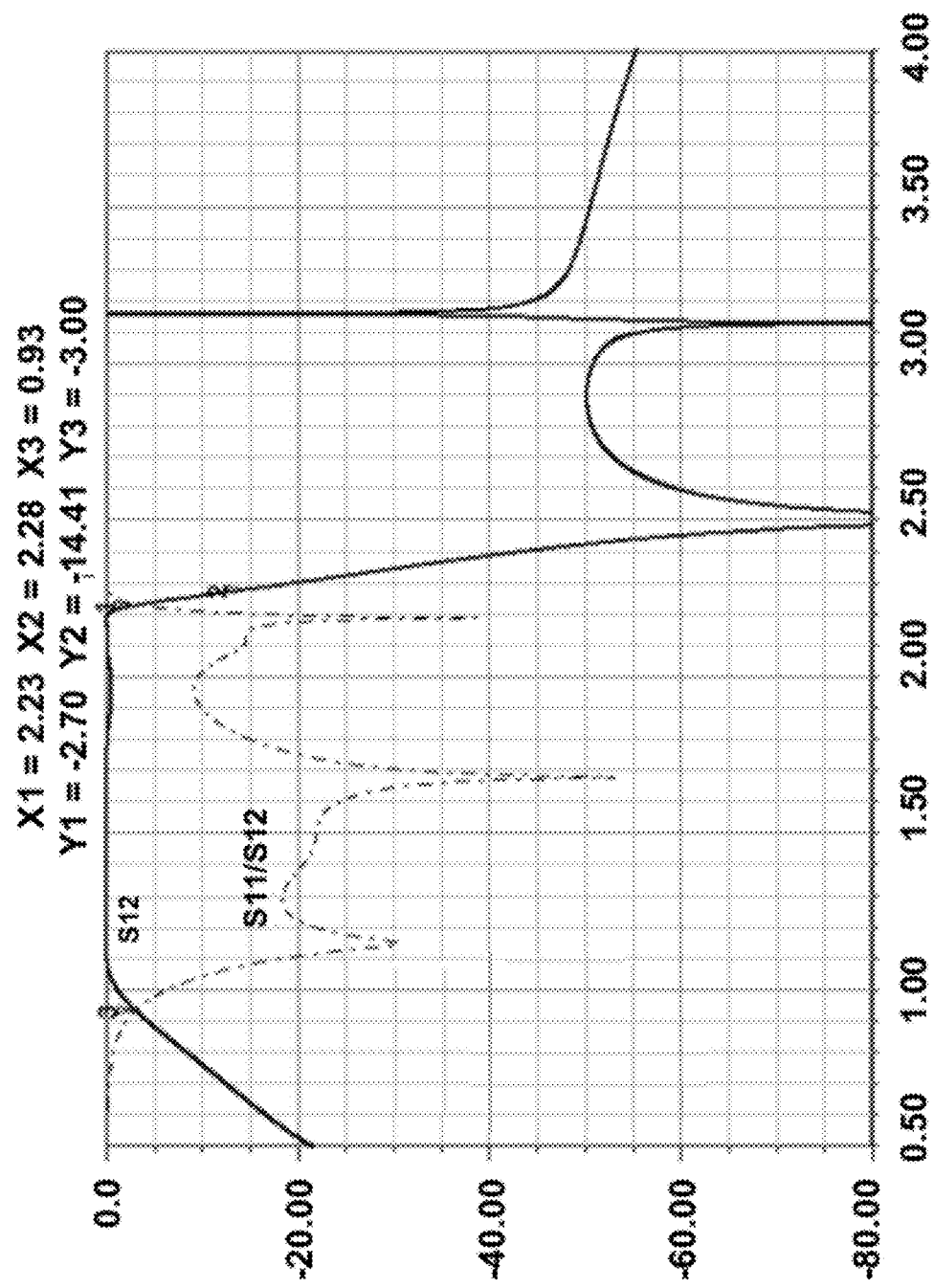
FIG. 12B illustrates a bandpass filter response of the circuit in FIG. 12A.
Figure 13A:
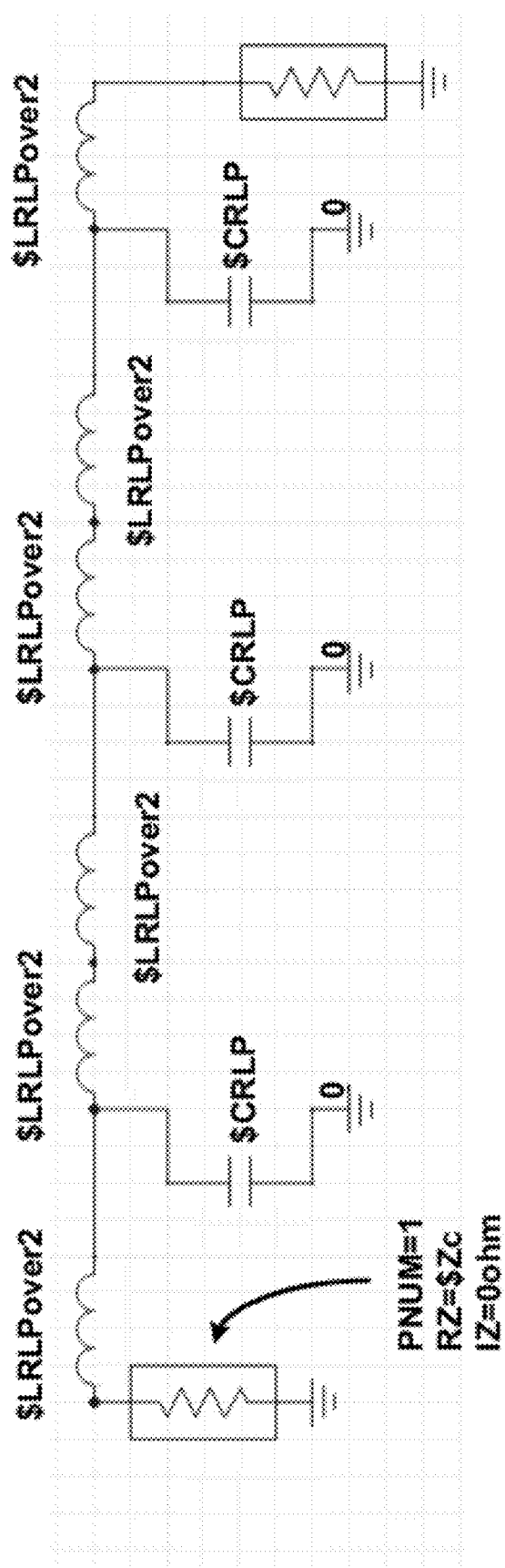
FIG. 13A illustrates a 3-cell LP Filter circuit where LRLPover2=9.33 nH/2 and CRLP=1.9 pF.
Figure 13B:
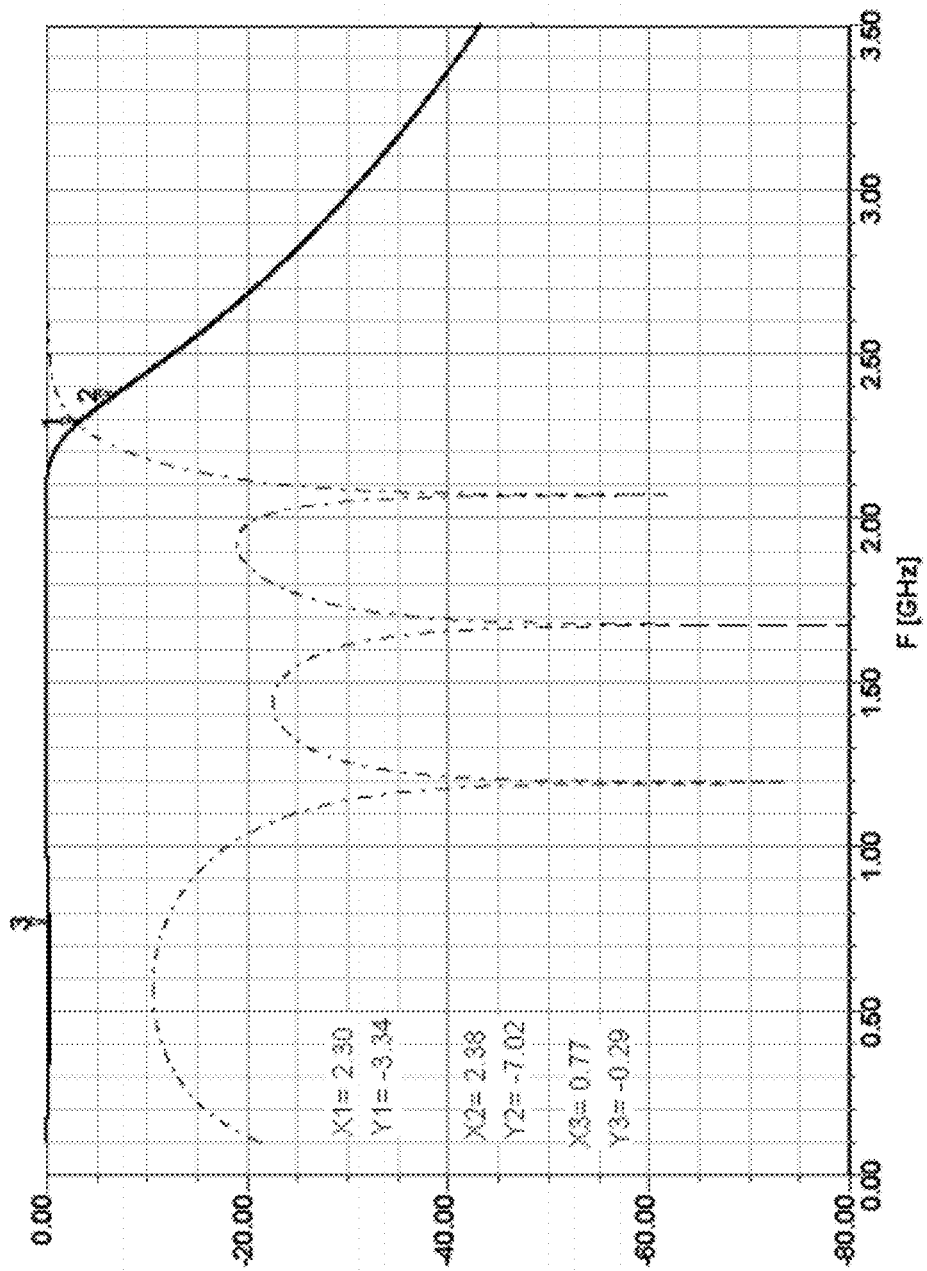
FIG. 13B illustrates an LP Filter response of the circuit in FIG. 13A.

I. Filter Design BE 1 (Balance Extended):

The present techniques may be used in a balanced extended design. An example of a broadband filter using an E-CRLH structure is illustrated in FIG. 8C. Values of the corresponding circuit parameters are listed in the table below, while the filter responses of the E-CRLH unit cell and E-CRLH unit cell with an LP filter are shown in FIG. 11 and FIG. 12B, respectively. Referring to FIG. 11, a 1-cell E-CRLH filter spans the range of about 0.89 GHz to 2.23 GHz at −3 dB and has a sharp side band rejection edge on the upper edge of the band. To eliminate higher bands, an LP filter can be added after the main E-CRLH filter. The LP filter may be comprised of three symmetric cells with series inductor, as shown in FIG. 13A. Exemplary values for the inductor LRLP and shunt capacitor CRLP are 0.33 nH and 1.9 pF, respectively. The response of the LP filter is shown in FIG. 13B which depicts an upper edge of the LP filter that measures about 2.3 GHz at −3 dB. Thus, this LP filter design is a good candidate for eliminating bands above 2.3 GHz in the main filter response shown in FIG. 11. The combined 1-cell E-CRLH 1201 and 3-cell LP filter circuit 1205 is illustrated in FIG. 12A and its response plot is illustrated in FIG. 12B. In some designs, only the lower band, with its sharp upper filter band edge, may be achieved while maintaining near zero insertion loss (i.e., no ripples).

TABLE 3

E-CRLH parameters

| Parameter | Value | Units |
|---|---|---|
| $Zc | 50 | Ohm |
| $LRover2 | 2.5/2 | nH |
| $CR | 1 | pF |
| $LRPover2 | 3.67/2 | nH |
| $CRP | 0.94 | pF |
| $LL | 4 | nH |
| $TwoCL | 2*1 | pF |
| $LLP | 2.75 | nH |
| $TwoCLP | 2*1.1 | pF |

A low-pass, post-filter may be used to eliminate all bands higher than 3 GHz. An example of a 3-cell Low-Pass (LP) filter is provided in FIG. 13A.

II.A. Filter Design UE 2.1 (Unbalanced Extended):

Spectrum D (758-763 MHz and 788-793 MHz), which can enable more robust wireless communication, is an example where wireless providers operate in narrow bands constraints (e.g., approximately 5 MHz range). In this case, the basic challenge is to operate in two separate 5 MHz bands without interfering with adjacent Public Safety Bands BB (763-768 MHz and 793-799 MHz) that have stringent side band rejection requirements. Thus, a very sharp, high-Q filter may offer a practical solution to address the basic challenge of operating in Spectrum D.

The present techniques and filters may be used in an unbalanced extended design where an E-CRLH is used in the design and construction of a high-Q filter.

Figure 14:
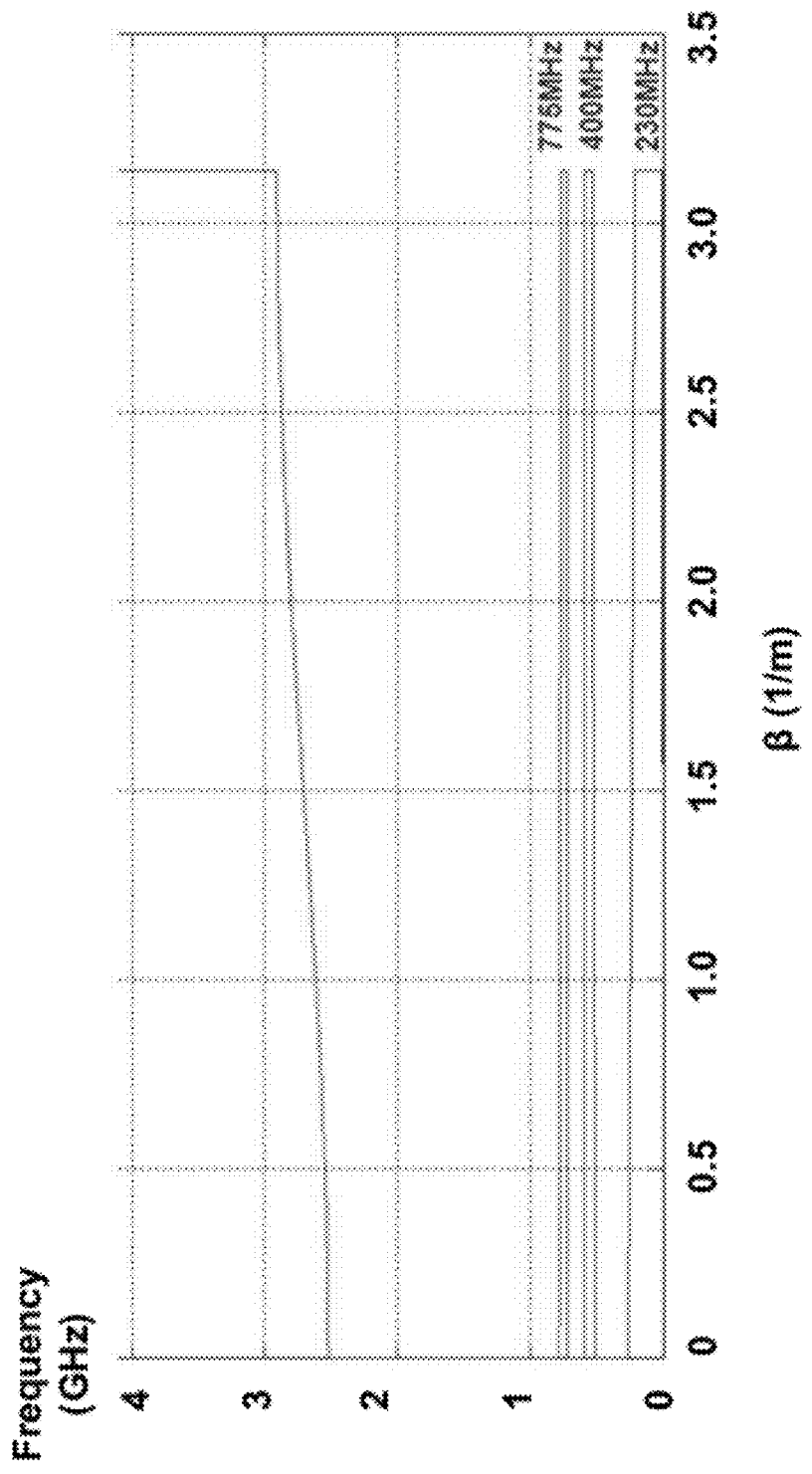
FIG. 14 illustrates an example of an E-CRLH unit cell propagation constant β versus frequency.

FIG. 14 depicts an example of an E-CRLH beta curve. In this example, the E-CRLH design may start with low-frequency resonances in the 260 MHz band, and then move to the RH region to excite the 390 MHz band. Subsequently, the dispersion curve can move back to the LH region to excite the 780 MHz band before continuing in the RH region.

Figure 15:
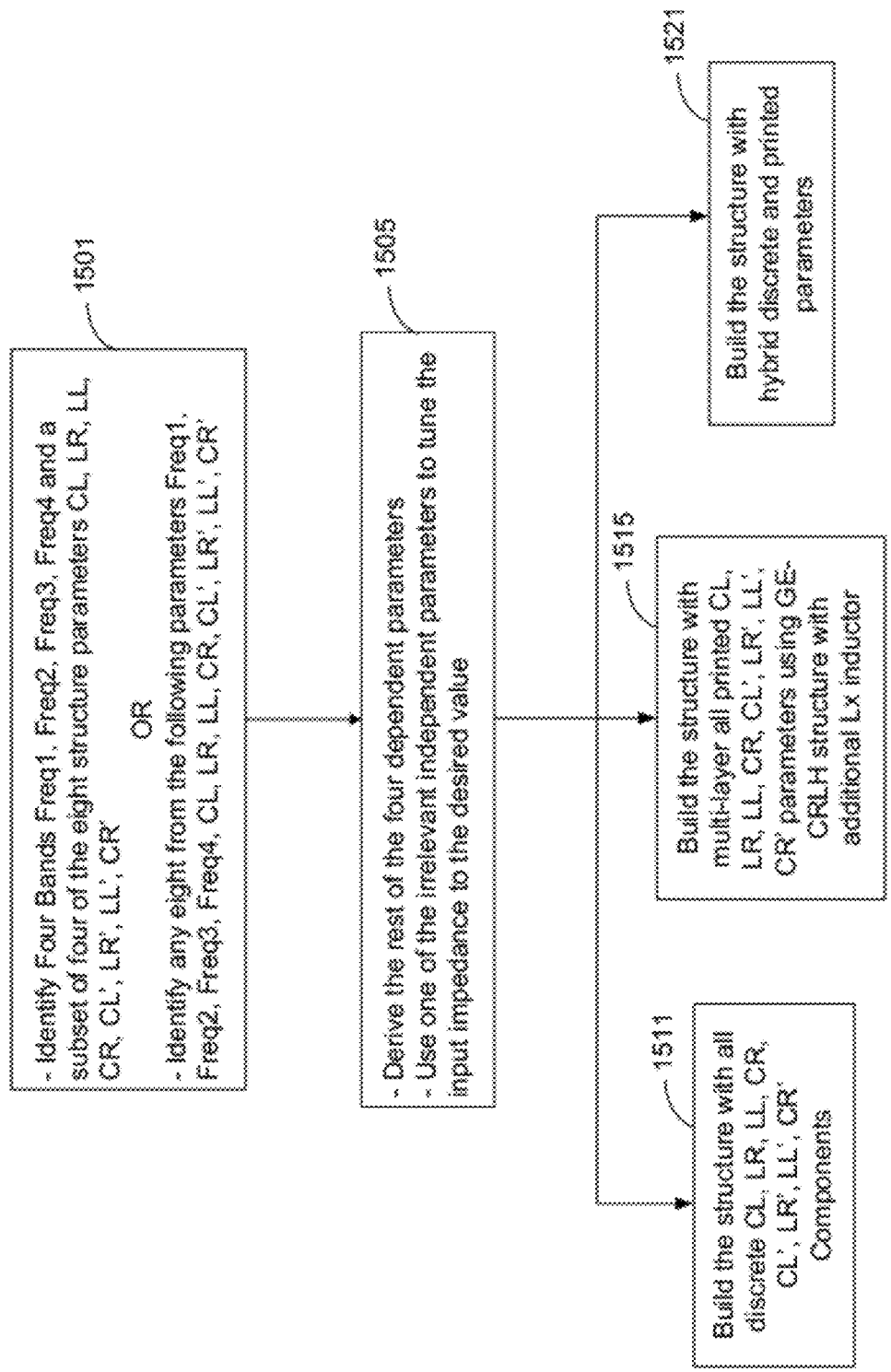
FIG. 15 illustrates a flowchart for deriving dependent parameters and building CRLH structures.

FIG. 15 illustrates a flow chart that represents the steps for designing and constructing all printed, discrete, or hybrid printed/discrete E-CRLH structure. Referring to FIG. 15, Step 1 1501 involves identifying four bands Freq1, Freq2, Freq3, Freq4 and a subset of four of the eight structure parameters CL, LR, LL, CR, CL', LR', LL', CR'. By doing so, the target filter bands are specified by the four frequency inputs and the rest of the four independent parameters selected from CL, LR, LL, CR, CL', LR', LL', CR' are used to match the structure at these target frequency bands. Alternatively, any eight parameters (from Freq1, Freq2, Freq3, Freq4, CL, LR, LL, CR, CL', LR', LL', CR') can be selected as independent parameters. Step 2 1505 involves deriving the rest of the four dependent parameters followed by using one of the irrelevant independent parameters to tune the input impedance to the desired value. Step 3 1511, step 4 1515, and step 5 1521 involves constructing various E-CRLH structures such as a discrete component, a multilayer printed GE-CRLH structure, and a hybrid discrete printed structure, respectively.

The E-CRLH rich dispersion characteristics can provide a unique means to manipulate its dispersion curves to excite a higher number of frequency bands with target values of Q (bandwidth). In particular, a high-Q filter can be used to enable wireless communication devices to operate over very narrow bands without interfering with adjacent bands.

Fully Discrete E-CRLH

An example of fully discrete E-CRLH structure is illustrated in FIG. 8C and is based on the following parameters as illustrated in Table 4:

Freq1=0.3876 GHz
Freq2=2.3461 GHz
Freq3=0.2584 GHz
Freq4=0.78 GHz
LR=5.4 nH
CR=18 pP
LL'=18 nH
CL'=6 pF A proprietary parameter extraction software can be used to derive the rest of the parameters:

LR'=23.9978169 nH
CR'=2.71641771 pF
LL=17.9823 nH
CL=0.99996 pF

TABLE 4

Parameter extraction of FIGS. 10, 14, 16, 17, and 18 fully-discrete E-CRLH

| N Inputs | 1 | | Outputs | |
|---|---|---|---|---|
| Freq0_1 | 0.3876 | GHz | Freq0_3 | 0.2584 GHz |
| Freq0_2 | 2.3461 | GHz | Freq0_4 | 0.78 GHz |
| LR | 5.4 | nH | LL | 17.9823 nH |
| CR | 18 | pF | CL | 0.99996 pF |
| LR' | 23.9978169 | nH | LL' | 18 nH |
| CR' | 2.71641771 | pF | CL' | 6 pF |
| LRover2 | 2.7 | nH | LR' over2 | 11.9989 nH |
| 2CL | 1.9999268 | pF | 2CL' | 12 pF |

Figure 10:
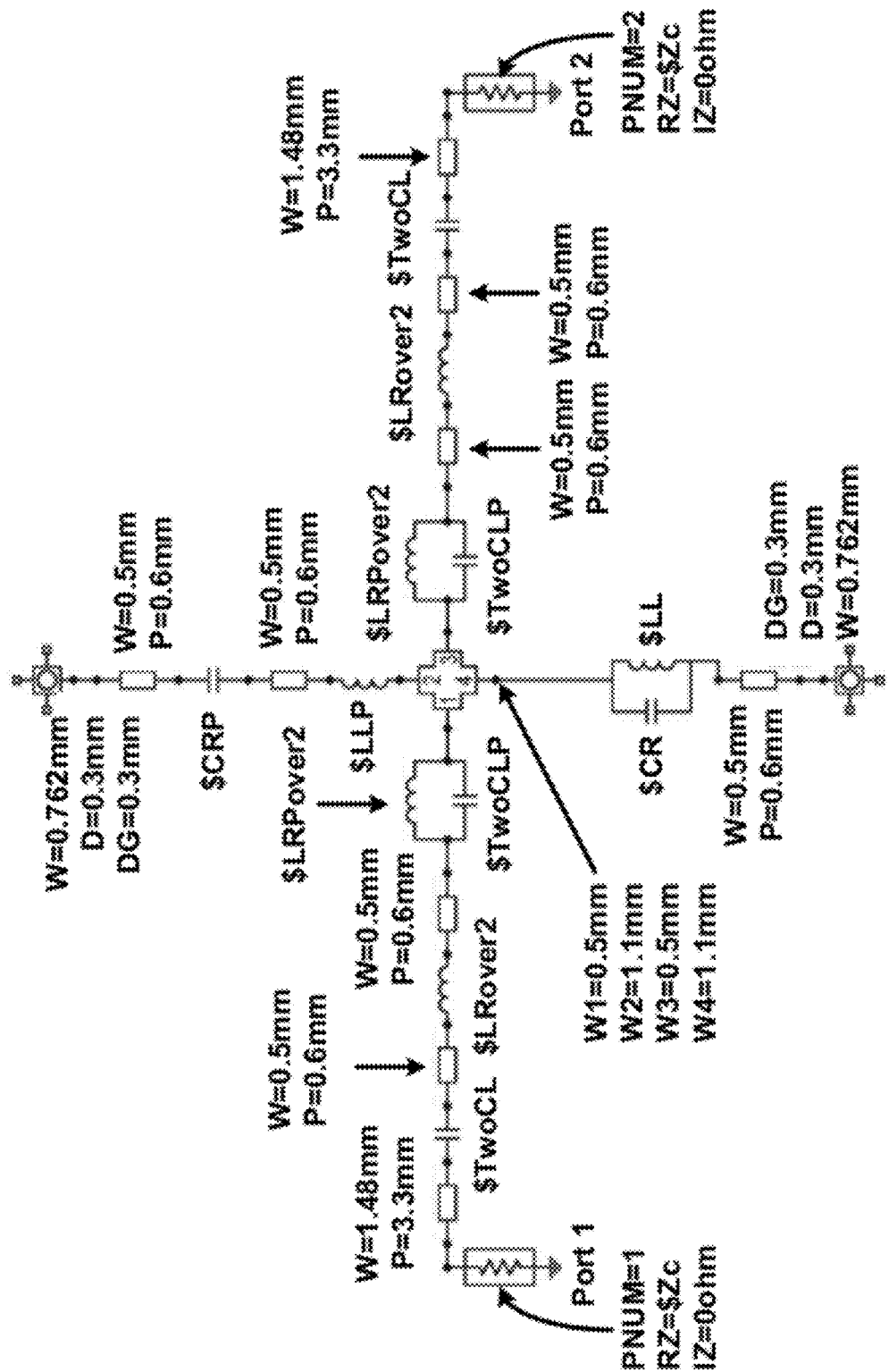
FIG. 10 illustrates an equivalent circuit of the E-CRLH high-Q filter.

FIG. 14 illustrates a dispersion curve of the circuit shown in FIG. 10. Results from FIG. 14 indicate an excitation of high-Q bands, which can be easily seen by the near-flat beta curves at the three desired 260 MHz, 390 MHz, and 780 MHz bands. A benefit of this design includes matching the three bands with a 50 Ohm input impedance feed-line.

A simulation approach can be conducted using a designer software tool such as Ansoft. The results of which are presented in FIG. 16. The three extremely sharp bands are summarized in Table 5 at a −3 dB return loss.

TABLE 5

Figure 16:
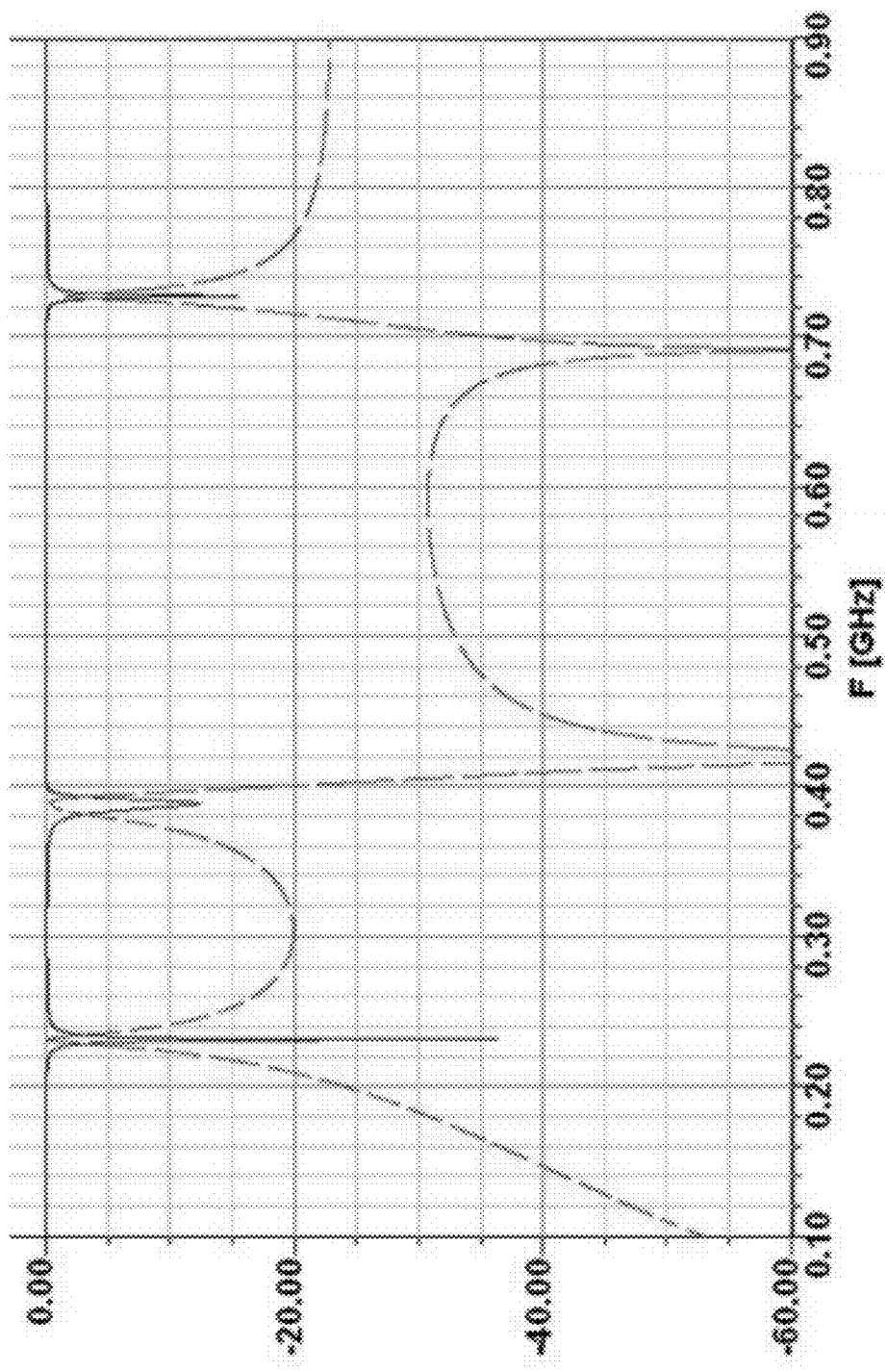
FIG. 16 illustrates simulated S11 and S12 of the E-CRLH circuit in FIG. 17.

The three frequency band of structure simulated in FIGS. 10, 14, and 16 at a −3 dB return loss.

| MinFreq | MaxFreq | CtrFreq | Q |
|---------|---------|---------|---|
| 228 | 234 | 231 | 38.5 |
| 382 | 393 | 387.5 | 35.22727 |
| 725 | 730 | 727.5 | 145.5 |

Figure 17:
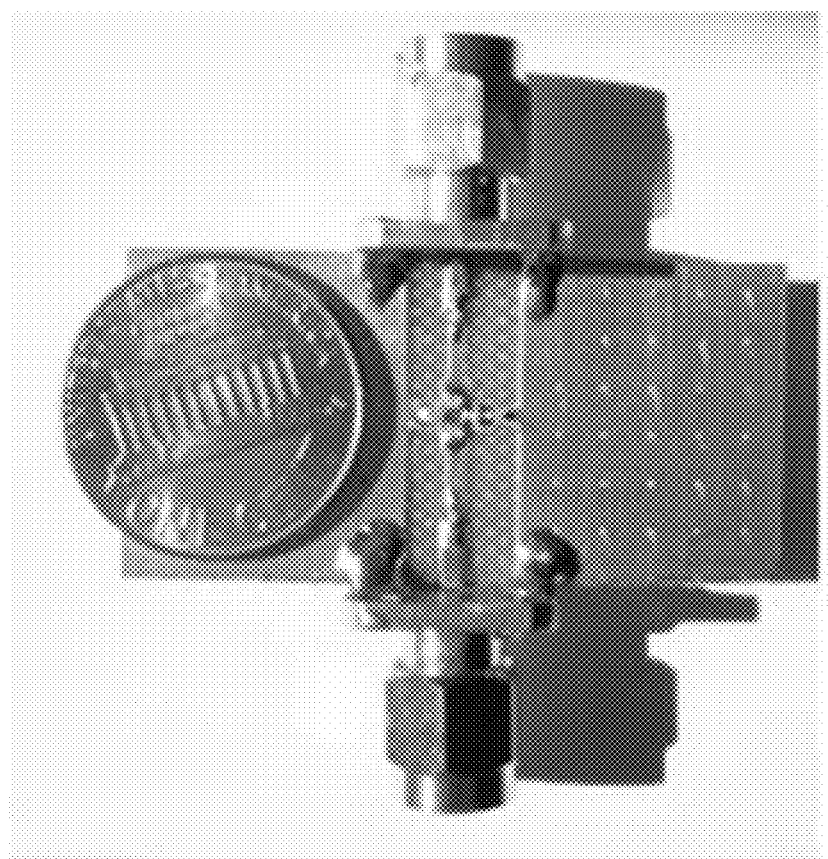
FIG. 17 illustrates a picture of a high-Q filter built with discrete components.
Figure 18:
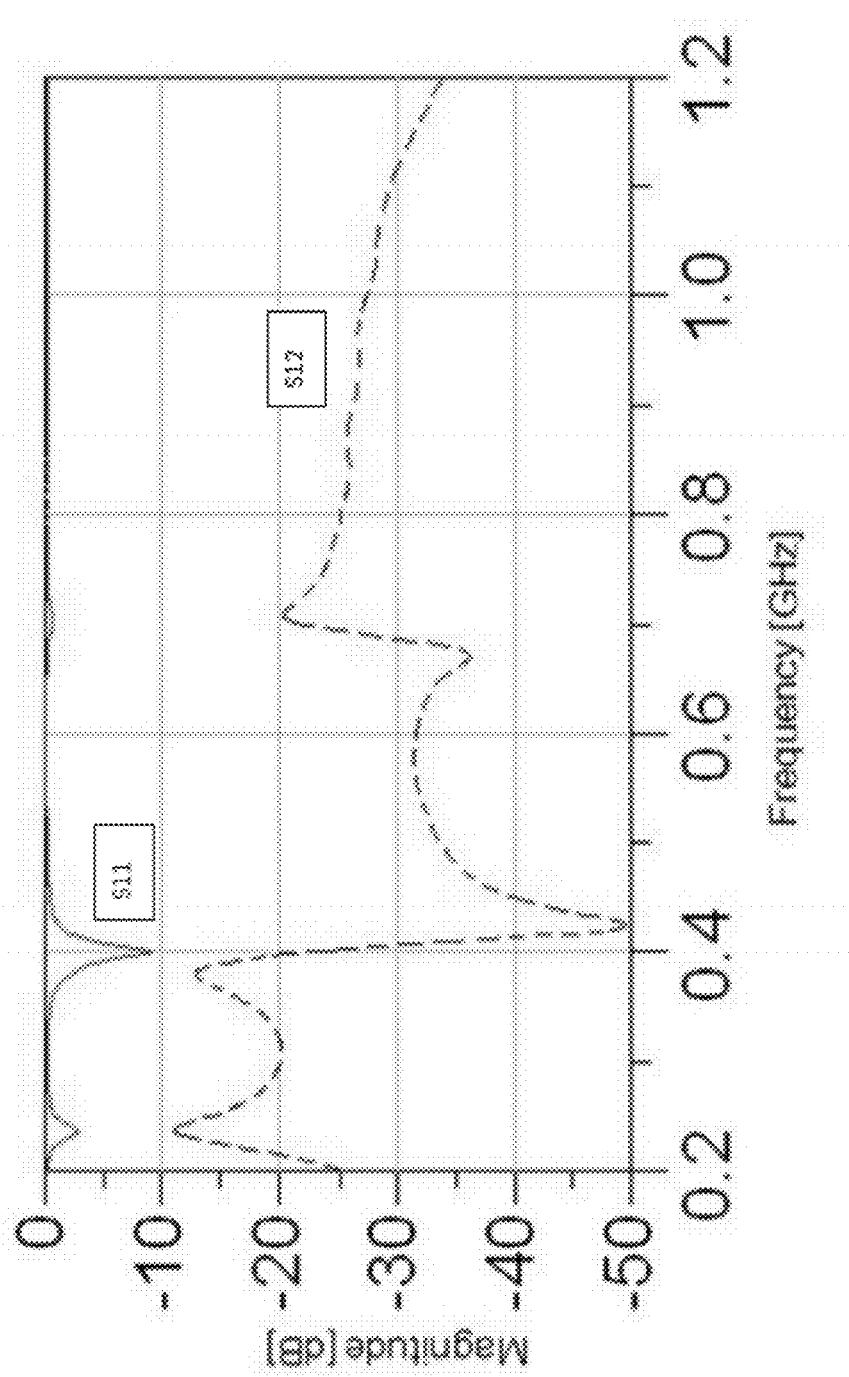
FIG. 18 illustrates preliminary results of S11 and S12 of the filter in FIG. 17.
Figure 19E:
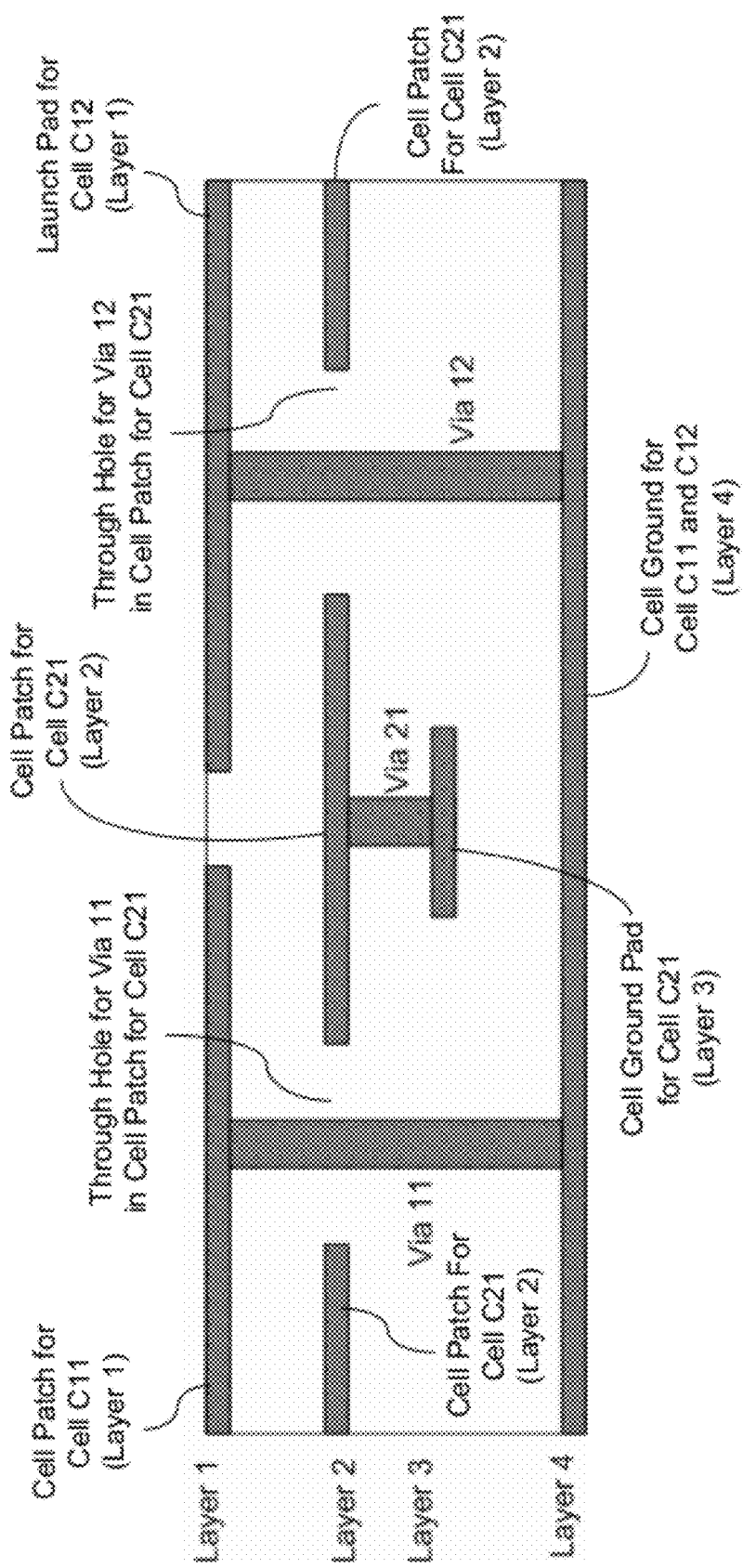

A photo of a preliminary 1-cell E-CRLH fabrication is shown in FIG. 17. Fabricating this structure can demonstrate the presence of the three resonances rather than optimize losses. FIG. 18 shows measured results for S11 and S12. By comparing the simulated results in Table 5 to the measured results in FIG. 18, the three resonances 236 MHz, 400 MHz, and 704 MHz closely match the theoretical model.

For the fully discrete E-CRLH design, a high-pass post-filter can be used to eliminate the lower two bands, 236 MHz and 400 MHz, and preserve the 700 MHz bandpass.

Fully Printed E-CRLH

Figure 9:
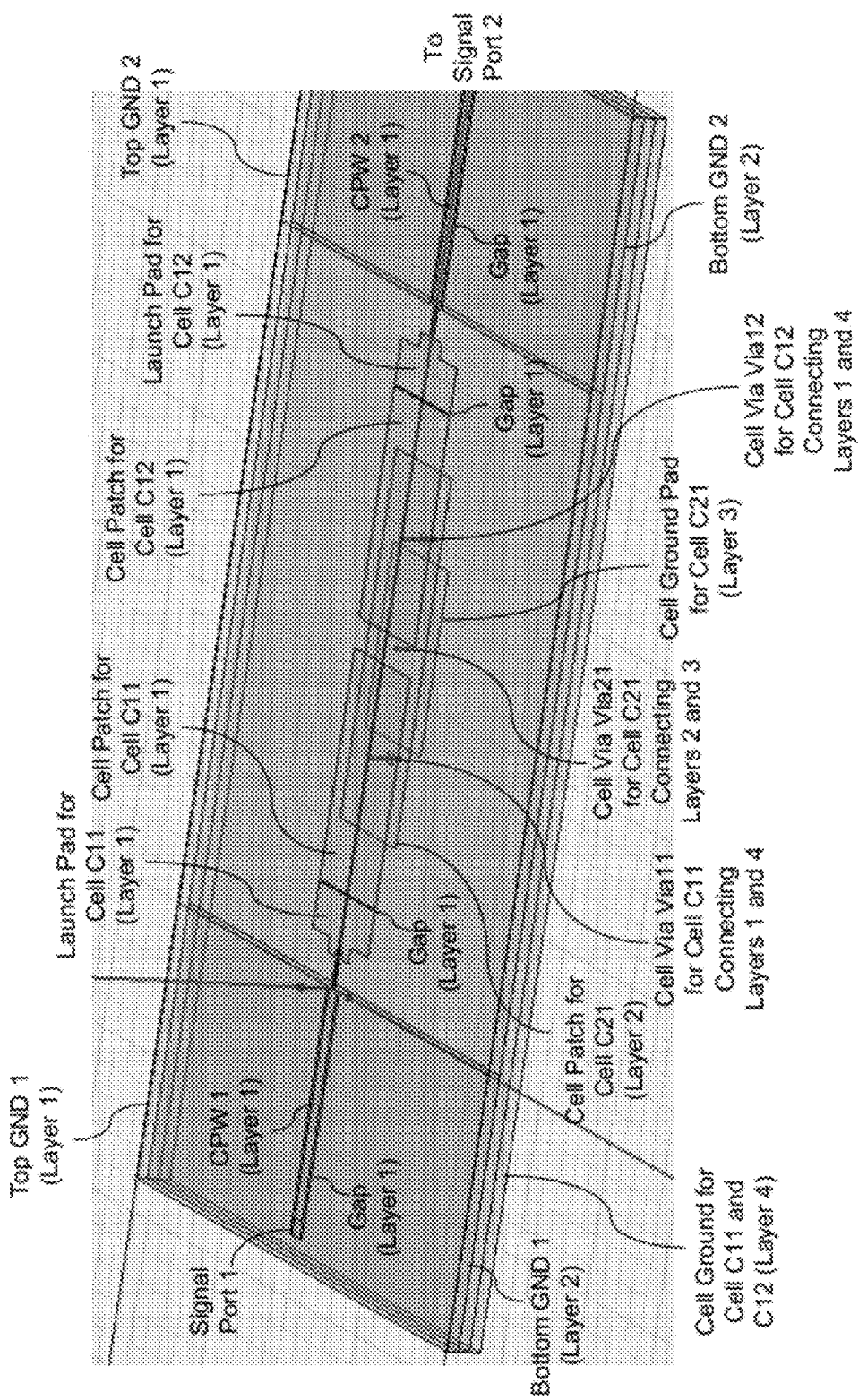
FIG. 9 illustrates a 3D view of four-layer, all printed design of a unit Generalized E-CRLH (GE-CRLH)

An E-CRLH structure of FIG. 9 can be realized on a 4-layer fully printed design as shown in FIGS. 19A-19E and detailed in Table 7. This particular E-CRLH unit cell has a printed circuit structure formed in four separated metallization layers which are parallel to one another. The first metallization layer is patterned to comprise a first signal port, a first feed line coupled to the first signal port, a first launch pad coupled to the first feed line, and a first cell patch that is separated from and capacitively coupled to the first launch pad, a second cell patch spaced from the first cell patch and coupled to receive a signal from the first cell patch, a second launch pad separated from and capacitively coupled to the second cell patch, a second feed line coupled to the second launch pad, and a second signal port coupled to the second feed line. The second metallization layer is patterned to comprise a first conductive cell patch positioned underneath the first metallization layer between the first and second cell patches and to enhance electromagnetic coupling across the gap. The third metallization layer is patterned to comprise a second conductive cell underneath the first conductive cell patch in the second metallization layer. The first conductive via is provided to connect the first conductive cell patch in the second metallization layer and the second conductive cell patch in the third metallization layer. This design also includes a fourth metallization layer to provide a ground electrode for the apparatus, a first cell via and a second cell via between the first metallization layer and the ground electrode. The first cell via connects the first cell patch on the first metallization layer and the ground electrode in the fourth metallization layer and is separate from and without direct contact with the first and second conductive cell patches. The second cell via connects the second cell patch on the first metallization layer and the ground electrode in the fourth metallization layer, is separate from and without direct contact with the first and second conductive cell patches. Vias connecting inter-layer metallization are commonly referred to by "buried vias," such as the via 21 between the second and the third layers. In some fabrication techniques, it is challenging to align buried vias when assembling the substrates on top of each other, hence the need to use "through vias" from top to bottom layers. This is accomplished by clearing metallization around a "pass through via" on a layer where the via is not connected to the metallization.

As shown in FIGS. 9 and 19A-E, the first metallization layer is patterned to comprise a first top ground electrode adjacent to the first launch pad and a second top ground electrode adjacent to the second launch pad and the second metallization layer is patterned to comprise a first bottom ground electrode underneath the first top ground electrode and a second bottom ground electrode underneath the second top ground electrode. The first top ground electrode is patterned to support, in combination with the first bottom ground electrode, a first co-planar waveguide (CPW) that is coupled between the first signal port and the first feed line, and the second top ground electrode is patterned to support, in combination with the second bottom ground electrode, a second CPW that is coupled between the second signal port and the second feed line.

Figure 20A:
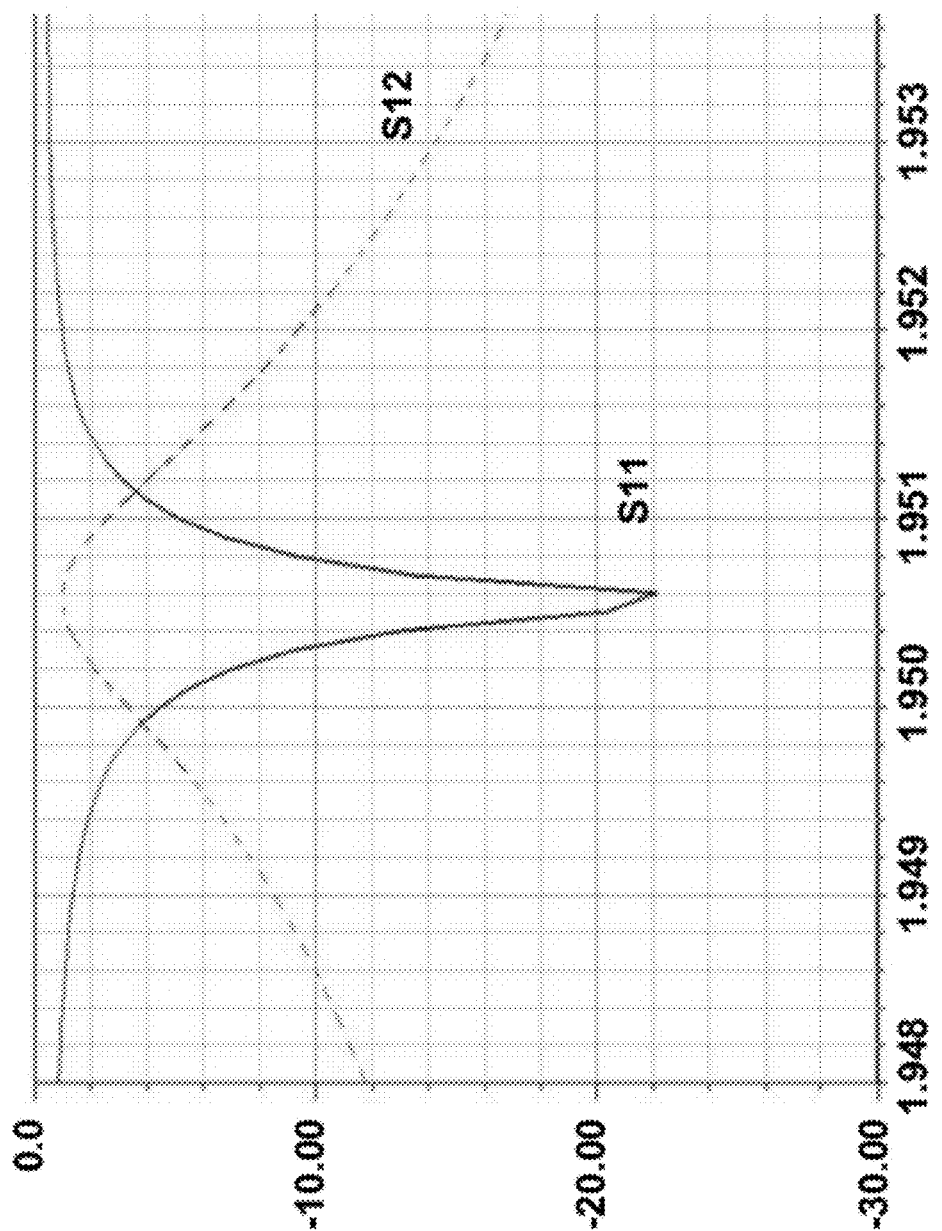
FIGS. 20A-20B illustrate S11 and S12 of the High-Q filter based on E-CRLH in FIGS. 17 and 27; (a) all printed HFSS design, (b) its corresponding E-CRLH circuit using Ansoft Designer.
Figure 20B:
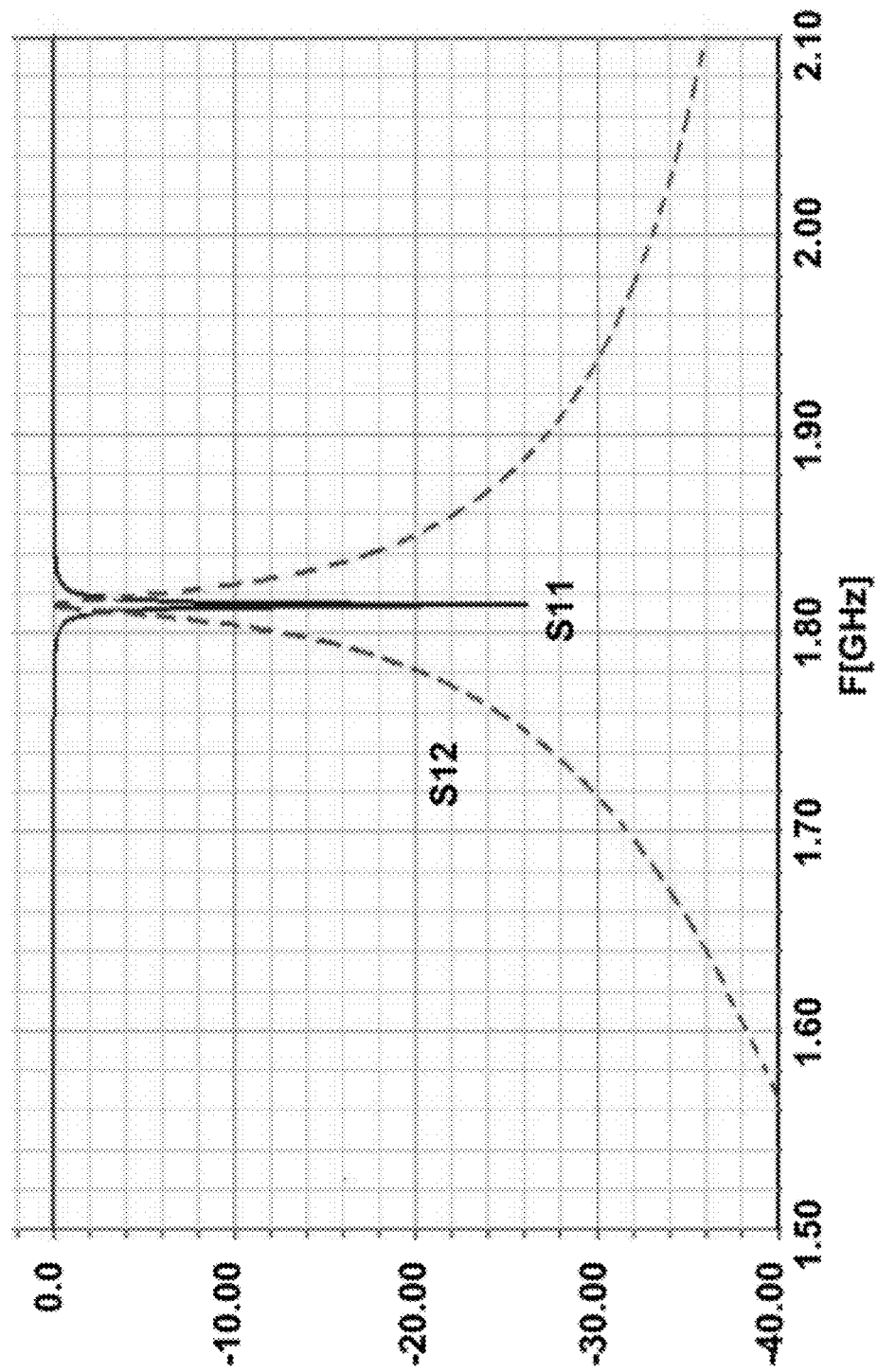

The same parameter extraction is followed as in U.S. patent application Ser. No. 11/741,674 entitled "Antennas, Devices, and Systems Based on Metamaterial Structures," filed on Apr. 27, 2007, and U.S. patent application Ser. No. 11/844,982 entitled "Antennas Based on Metamaterial Structures," filed on Aug. 24, 2007. However, for this parameter extraction, a more complex E-CRLH structure and analysis is utilized. The parameter extraction results for the fully printed E-CRLH structure are provided in Table 6. HFSS simulation results (FIGS. 20A-20B) show very sharp resonance frequencies at 1.95 GHz, which is a +120 MHz shift between analysis and 3D HFSS modeling of the structure. Next, the fabrication of a 4-layer structure using the LPKF protomat S60 to compare results with analysis and HFSS results is presented. In FIG. 20A, the sharp resonance is between approximately 1949.75 MHz and 1.951 MHz at a −3 dB return loss. High-Q filters with low insertion loss can be difficult to design because of its narrow band and high side-band rejection.

TABLE 6

Corresponding circuit parameter of the structure in FIG. 8C

| N Inputs | 1 | | Outputs | |
|----------|---|---|---------|---|
| Freq0_1 | 2.85 | GHz | Freq0_3 | 1.8387 GHz |
| Freq0_2 | 12.3675 | GHz | Freq0_4 | 5 GHz |
| LR | 1.5 | nH | LL | 0.62361 nH |
| CR | 5.2 | pF | CL | 0.11271 pF |
| LR' | 0.51015111 | nH | LL' | 0.5 nH |
| CR' | 4.69155134 | pF | CL' | 6 pF |
| LRover2 | 0.75 | nH | LR' over2 | 0.25508 nH |
| 2CL | 0.22542211 | pF | 2CL' | 12 pF |

TABLE 7

Detailed printed structure in FIGS. 9 and 19A-19E

| Layer 1: Top Layer | CPW feed line | 15 mm long 50 Ohm line grounded CPW line with CPW-GND located on layer 2 layer 2 |
| | Launch Pad (LP) | Section1: 0.5 × 2 mm; Section2: 3 × 1 mm; Section3: 8 × 3 mm, gap between LP and Cell 11 is 0.1 mm |
| | Cell 11 & Cell 12 | 8 mm wide and 15 mm long |
| Substrate 1 | 80 mm long 45 mm wide 0.787 mm thick | Via 11 with 12 mil diameter and located at 15 mm from left GND edge Via 12 with 12 mil diameter and located at 15 mm from right GND edge |
| Layer 2 | CPW GND | 45 mm wide and 17.9 mm long |
| | Cell 21 | 8 mm wide and 24 mm long located at 10.1 mm from left GND in layer 2 |
| | GND Line | Connects Bottom Cell Patch with the main GND |

TABLE 7-continued

Detailed printed structure in FIGS. 9 and 19A-19E

| | | |
|---|---|---|
| Substrate 2 | 80 mm long 45 mm wide 0.787 mm thick | Via 11 with 12 mil diameter and located at 15 mm from left GND edge Via 12 with 12 mil diameter and located at 15 mm from right GND edge Via 21 with 12 mil diameter and located between Via 11 and Via 12 |
| Layer 3 | Cell 31 | 8 mm wide and 12 mil located at 16.1 mm from left GND in layer 2 |
| Substrate 3 | 80 mm long 45 mm wide 0.787 mm thick | Via 11 with 12 mil diameter and located at 15 mm from left GND edge Via 12 with 12 mil diameter and located at 15 mm from right GND edge |

II.B. Design UE 2.2 (Unbalanced Extended):

In another design technique, a detailed E-CRLH design for unbalanced extended structure is presented where:

$$\omega_{SE}=\omega_{SH'} \text{ and } \omega_{SE'}=\omega_{SH} \text{ and LR CL'=CR LL'} \quad \text{Eq. (14B)}$$

In this case, $\omega_{0,1}=\omega_{0,3}<\omega_{0,2}=\omega_{0,4}$, Z and Y equations can be simplified leading to a simpler Zc function for improved matching. A excel sheet can be tailored to satisfy the above constraints. In this design, the following filter characteristics are observed and noted.

A. The filter is comprised of two bandpass regions separated by a stop-band region. Either band-pass regions can be eliminated by using a low-pass or high-pass filter at the output of the E-CRLH unit cell.

B. The outer filter edges are generally sharper and the bandwidth is generally narrower for higher LR.

C. The inner filter edges are characteristically steeper when $\omega_{0,1}$ and $\omega_{0,2}$ are brought closer.

D. For fixed values of $\omega_{0,1}$ and $\omega_{0,2}$, tend to select lowest values of LL' and CR and play with LR to fine tune bandwidth and outer band edges.

E. Item D, noted above, can be repeated by keeping LR and LL' and modifying CR. For higher values of CR, the filter upper outer edge may become steeper.

F. Item E, noted above, can be repeated by keeping LR and CR and modifying LL'. For higher values of LL', the filter upper outer edge may become steeper.

G. $\omega_{0,1}$ and $\omega_{0,2}$ define the stop-band region between the two band-pass regions.

H. LR, CR, and LL' can be modified to match the structure to other input impedances. Examples of this matching, as described in the following two cases, are derived for different input impedance values.

UE 2.2 Case 1: Broadband Filter with a Sharp Lower or Upper Edge:

In another implementation of the present technique, the special case of the E-CRLH complying with equation (14B) mentioned above is applied to design the two filters that constitute the high-band and low-band filters of diplexers and duplexers used in wireless communications. The E-CRLH filter parameters are listed in Table 8 and Table 9.

TABLE 8

E-CRLH filter parameters of FIG. 8C

| Parameter | Value | Units | Value |
|---|---|---|---|
| $Zc | 15 | ohm | 15 ohm |
| $LRover2 | 1.5/2 | nH | 0.75 nH |
| $CR | 2.6 | pF | 2.6 pF |
| $LL | 2.4 | nH | 2.4 nH |
| $TwoCL | 2*3.85 | pF | 7.7 pF |

TABLE 8-continued

E-CRLH filter parameters of FIG. 8C

| Parameter | Value | Units | Value |
|---|---|---|---|
| $LRPover2 | 0.63/2 | nH | 0.315 nH |
| $TwoCLP | 2*10 | pF | 20 pF |
| $LLP | 5.8 | nH | 5.8 nH |
| $CRP | 1 | pF | 1 pF |

TABLE 9

Corresponding circuit parameter of the structure in FIG. 8C depicting target four frequencies

| | | | | |
|---|---|---|---|---|
| Freq0_1 | 1.5 | GHz | Freq0_3 | 1.5 |
| Freq0_2 | 2.8 | GHz | Freq0_4 | 2.8 |
| LR | 1.5 | nH | LL | 2.429247 |
| CR | 2.6 | pF | CL | 3.847039 |
| LR' | 0.62825347 | nH | LL' | 5.8 |
| CR' | 0.99492392 | pF | CL' | 10.05333 |
| Need = 0 | 0 | | 0 | |
| Zc | 24.01922307 | Ohm | | |

Figure 21A:
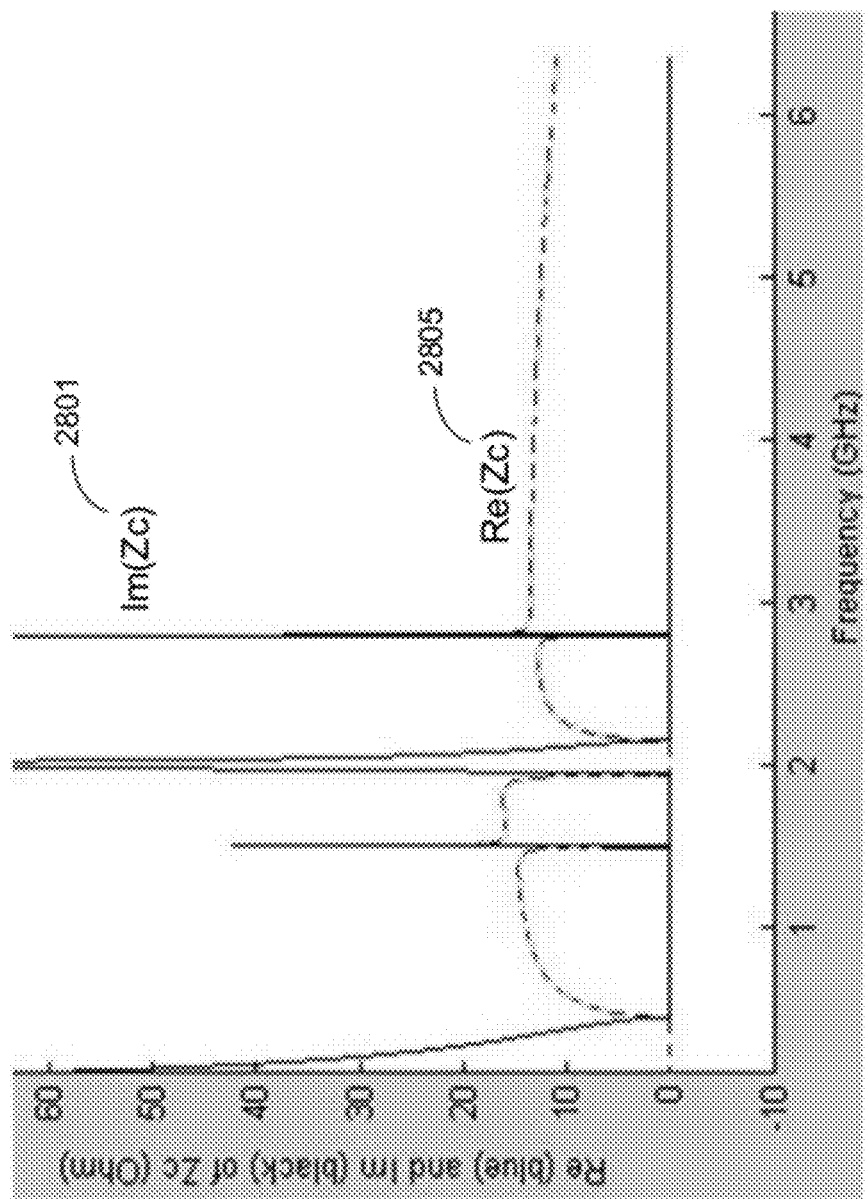
FIG. 21A illustrates a broadband impedance matched at 15 Ohm for a broadband filter having a sharp lower or upper edge.
Figure 21B:
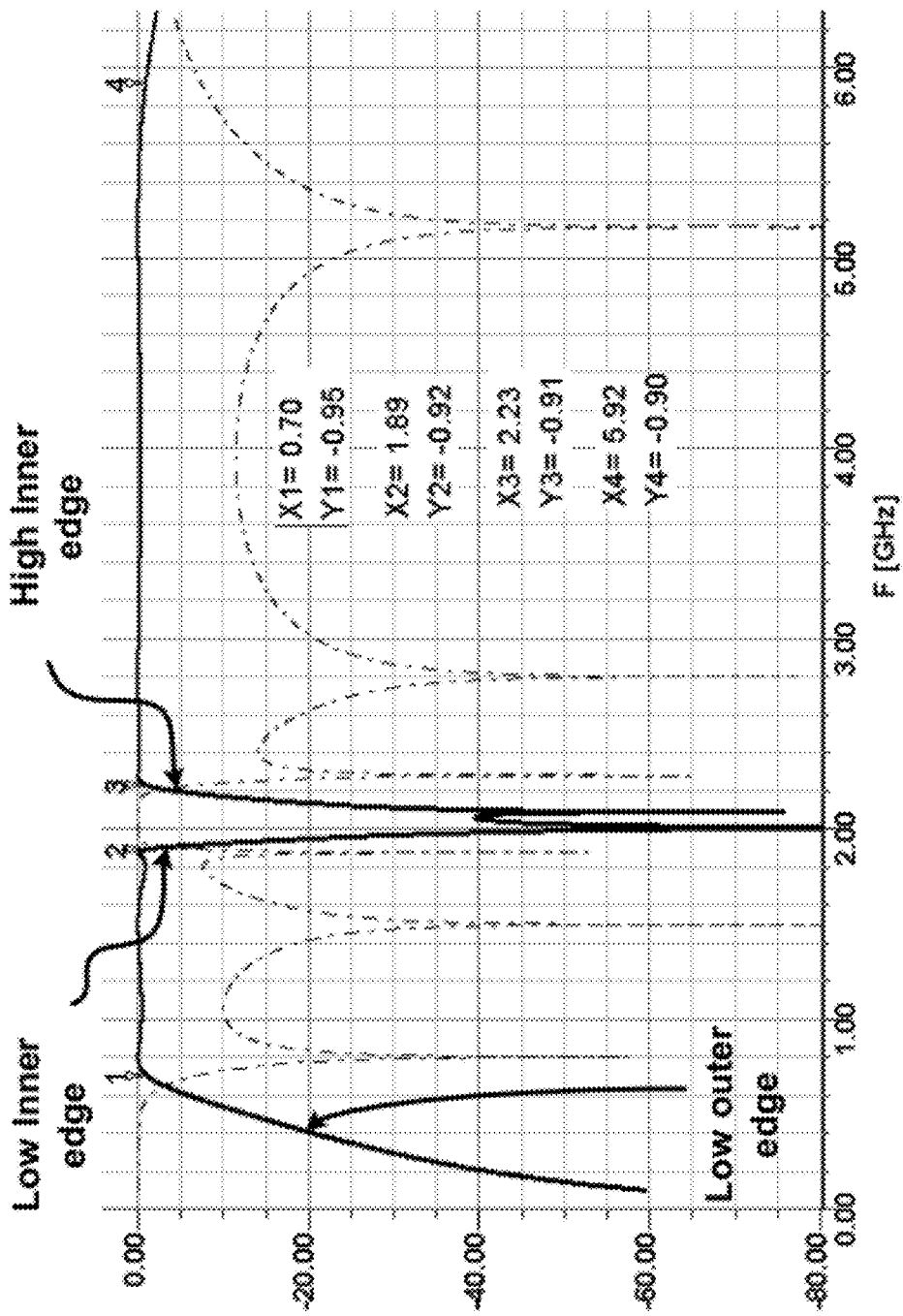
FIG. 21B illustrates a circuit simulation response for a broadband filter having a sharp lower or upper edge.

The two frequencies Freq0_1, Freq_02, LR, CR, and LL' are considered the free parameters, whereas the rest Freq0_3, Freq0_4, LR', CR', LL, CL, and CL' are derived from the constraints in Eq. (14B). These parameters can be used in a matlab code to verify the frequency bands and the impedance matching. In this case, two broadband regions matched at 15 Ohm can be seen in FIG. 21A. In order to couple energy to the filter, the structure is matched to the input/output impedance Zc. Note that the Real part of the impedance Re(Zc) is near constant while keeping its imaginary (reactive) part Im(Zc) near zero. FIG. 21B illustrates a response of the circuit design in FIG. 8C as simulated in Ansoft, a design simulation tools.

A simple low-pass filter with less than −15 dB at 2.1 GHz can be used to select the lower band-pass filter range of about 700 MHz to 1.89 GHz with a side-band rejection of about −40 dB at 2 GHz. Or, a simple high-pass filter with less than −15 dB at 2.1 GHz can be used to select the upper band-pass filter range of about 2.23 MHz to 5.92 GHz with side-band rejection of about −40 dB at 2.1 GHz.

UE 2.3 Case 2: Narrowband Filter with Sharp Lower or Upper Edge:

In another implementation of the present technique, narrower band filters, can be derived using the special E-CRLH case complying with the constraints in Eq. (14A). The E-CRLH filter parameters and corresponding circuit parameters are listed in Table 10 and Table 11, respectively.

TABLE 10

E-CRLH filter parameters

| Parameter | Value | Units | Value |
|---|---|---|---|
| $Zc | 25 | ohm | 25 ohm |
| $LRover2 | 120/2 | nH | 60 nH |
| $CR | 29 | pF | 29 pF |
| $LRPover2 | 1.2/2 | nH | 0.6 nH |
| $LL | 0.22 | nH | 0.22 nH |
| $TwoCL | 2*0.05 | pF | 0.1 pF |
| $LLP | 22 | nH | 22 nH |

TABLE 11

Corresponding circuit parameter of the structure

| | | | | |
|---|---|---|---|---|
| Freq0_1 | 1.9 GHz | Freq0_3 | 1.9 GHz | |
| Freq0_2 | 2.1 GHz | Freq0_4 | 2.1 | |
| LR | 120 nH | LL | 0.2209 | |
| CR | 25 pF | CL | 0.052534 | |
| LR' | 1.204909004 nH | LL' | 22 | |
| CR' | 0.286549246 pF | CL' | 5.316667 | |
| Need = 0 | 0 | 0 | 0 | |
| Zc | 64.32675209 Ohm | | | |

Figure 22:
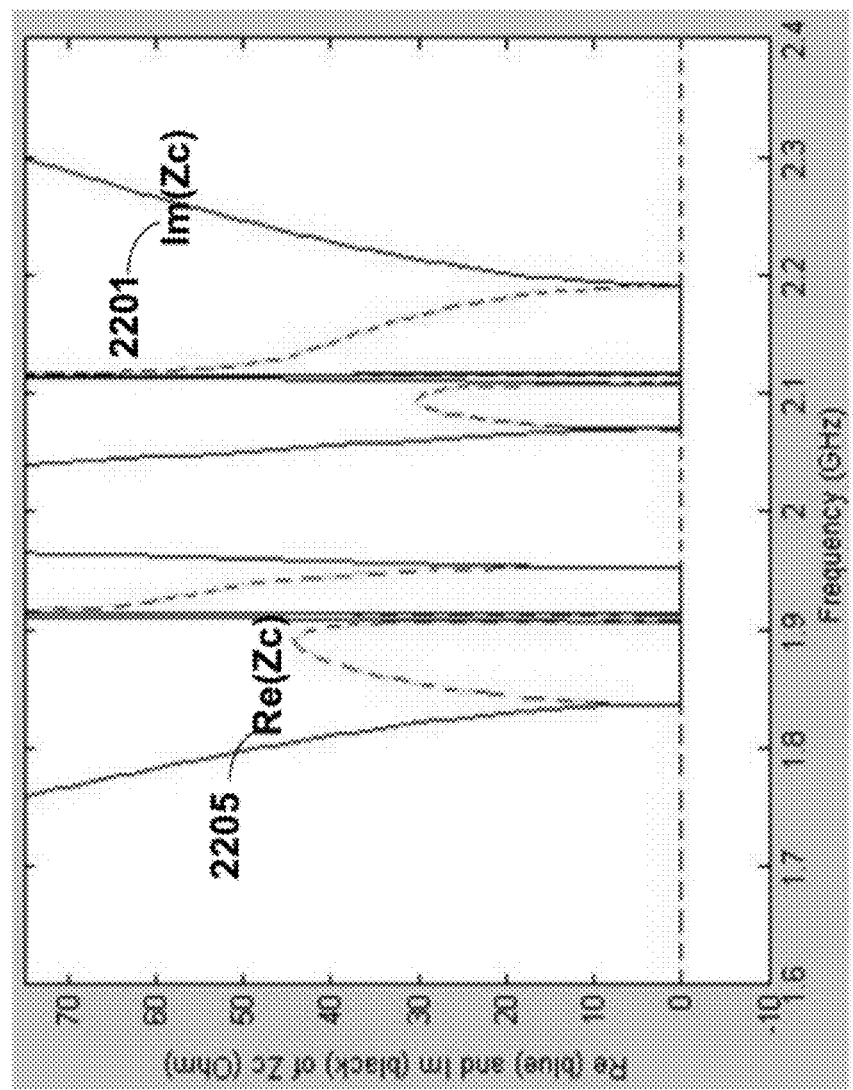
FIG. 22 illustrates two narrow-band band-pass regions where the upper region is matched at 25 ohms for a narrow-band filter having a sharp lower or upper edge.

The matlab code provides two narrow-band band-pass regions. The upper region can be matched at about 25 Ohms as illustrated in FIG. 22, while the lower-band shows a better matching at 45 Ohms. In order to couple energy to the filter, the structure is matched to the input/output impedance Zc. Note that the Real part of the impedance Re(Zc) is near constant while keeping its imaginary (reactive)part Im(Zc) near zero. In the examples below, the upper band is derived by matching the structure to Zc=25 OHMs or Zc=45 Ohms.

A simple high-pass filter with less than −15 dB at about 2.1 GHz can be used to select the upper band-pass filter range of about 2.11 MHz to 2.17 GHz with a side-band rejection below −40 dB at about 2.05 GHz. Similar steps can be followed to match the lower band-pass region to select it. In this case, a 40 Ohm matching is more desirable as illustrated in the Matlab impedance results of FIG. 23.

Bandpass Filter Designs Based on the E-CRLH Cell:

Referring again to Eq. (12), Eq. (13), and Eqs. (14A)-(14B), a bandpass filter can be designed using cutoff frequencies $\omega_{cutoff,i}$, where i=1, 2, 3, 4. These cutoff frequencies are typically associated with an asymptotic case and can be a substitution or be an addition to the zero order resonances, $\omega_{0,i}$, defined in Eq. (13). For the zero order resonance case, each frequency $\omega_{0,i}$ satisfies the equation Z*Y=0, where Z and Y are defined in Eq. (14A). For the asymptotic case, each cutoff frequency $\omega_{cutoff,i}$ satisfies the equation Z*Y+4=0. Cutoff frequency $\omega_{cutoff,i}$ can be determined for each E-CRLH filter design presented hereinabove (see Table 2). A summary of cutoff frequencies for various E-CRLH filters designs are shown in Table 12.

TABLE 12

Cutoff frequencies for previous E-CRLH filter designs.

| Design Reference | $\omega_{cutoff,i}$ (GHz) | $\omega_{0,i}$ (GHz) | $\omega_{SH} \omega_{SH'} \omega_{SE} \omega_{SE'}$ |
|---|---|---|---|
| Table 4 High Q FIG. 24 | $\omega_{cutoff,2}$ = 0.4 | $\omega_{0,i}$ = 0.38 | $\omega_{SH}$ = 0.28 |
| | | $\omega_{0,2}$ = 2.346 | $\omega_{SH'}$ = 0.72 |
| | | $\omega_{0,3}$ = 0.258 | $\omega_{SE}$ = 2.17 |
| | | $\omega_{0,4}$ = 0.78 | $\omega_{SE'}$ = 0.42 |
| Table 6 | $\omega_{cutoff,2}$ = 2.9 | $\omega_{0,1}$ = 2.85 | $\omega_{SH}$ = 2.79 |

TABLE 12-continued

Cutoff frequencies for previous E-CRLH filter designs.

Figure 29:
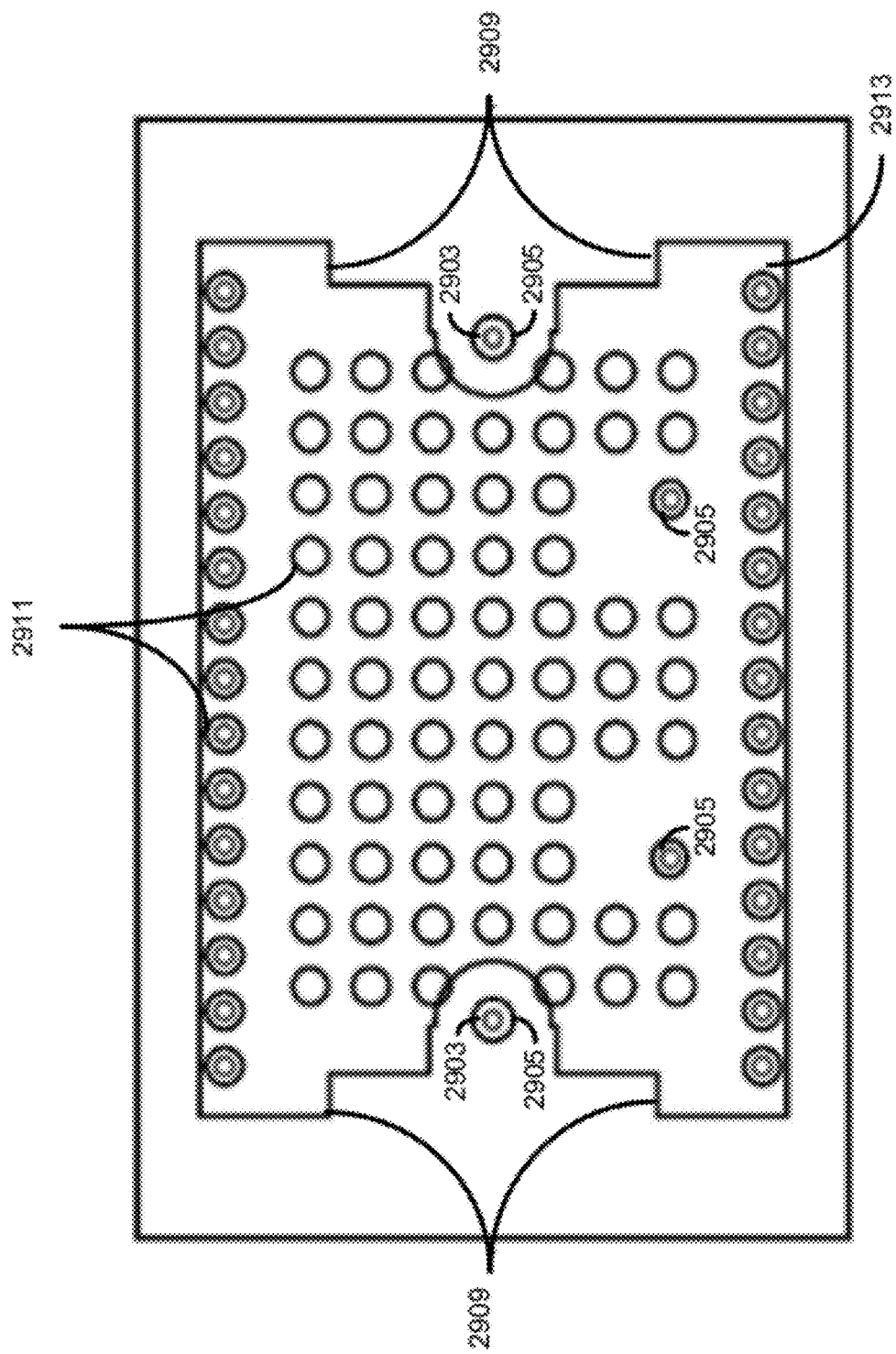
FIG. 29 illustrates a second layer, or Layer 2 of the LTCC stack shown in FIGS. 27A-27B.
Figure 31:
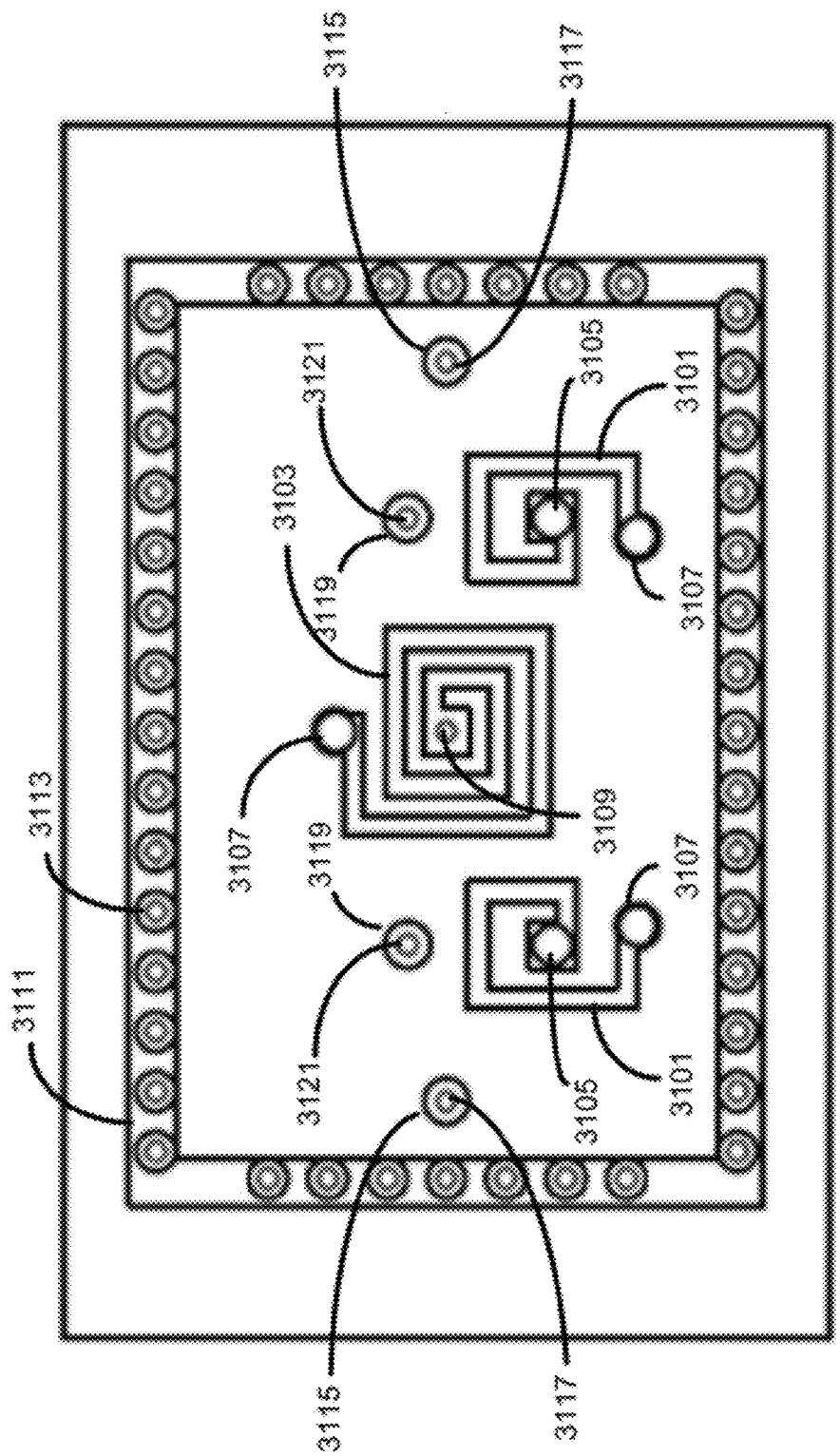
FIG. 31 illustrates a fourth layer, or Layer 4 of the LTCC stack shown in FIGS. 27A-27B.

| Design Reference | $\omega_{cutoff,i}$ (GHz) | $\omega_{0,i}$ (GHz) | $\omega_{SH} \omega_{SH'} \omega_{SE} \omega_{SE'}$ |
|---|---|---|---|
| Printed structure FIG. 29 | | $\omega_{0,2}$ = 12.37 | $\omega_{SH}$ = 3.29 |
| | | $\omega_{0,3}$ = 1.84 | $\omega_{SE}$ = 12.25 |
| | | $\omega_{0,4}$ = 5 | $\omega_{SE'}$ = 2.88 |
| Table 9 Bandstop FIG. 29 | $\omega_{cutoff,2}$ = 1.9 | $\omega_{0,1}$ = 1.5 | $\omega_{SH}$ = 2 |
| | | $\omega_{0,2}$ = 2.8 | $\omega_{SH'}$ = 2 |
| | | $\omega_{0,3}$ = 1.5 | $\omega_{SE}$ = 2 |
| | | $\omega_{0,4}$ = 2.8 | $\omega_{SE'}$ = 2 |
| Table 11, Dual-band BPF FIG. 31 | $\omega_{cutoff,2}$ = 1.9 | $\omega_{0,1}$ = 1.9 | $\omega_{SH}$ = 1.99 |
| | | $\omega_{0,2}$ = 2.1 | $\omega_{SH'}$ = 2 |
| | | $\omega_{0,3}$ = 1.9 | $\omega_{SE}$ = 2 |
| | | $\omega_{0,4}$ = 2.1 | $\omega_{SE'}$ = 1.99 |

Broad-Band Filter Designs Based on the E-CRLH Cell:

In a broad-band filter design (BW~4%, High-Q, Q~110, low insertion loss, i.e., IL<−1 dB), parameters of the E-CRLH cell (as shown in FIG. 8C) are selected so that the cutoff frequencies, $\omega_{cutoff,i}$, are near the zero order resonances, $\omega_{0,i}$, and have a difference defined by $(\omega_{cutoff,i}-\omega_{cutoff,j})$ that is large enough to give an adequate bandwidth in the filter pass-band region. Tables 13-14 summarize the selected cutoff frequencies and E-CRLH parameters, respectively, for a 2.4 GHz broad-band E-CRLH filter design.

TABLE 13

Cutoff frequencies for a 2.4 GHz broad-band filter (BW = 3.8% or 90 MHz, and high-Q, Q = 106) using one E-CRLH unit cell

| E-CRLH Value | $\omega_{cutoff,I}$ (GHZ) | $\omega_{0,i}$ (GHz) | $\omega_{SH} \omega_{SH'} \omega_{SE} \omega_{SE'}$ |
|---|---|---|---|
| LR = 24 nH  CR = 0.7 pF | $\omega_{cutoff,1}$ = 0.561 | $\omega_{0,1}$ = 0.622 | $\omega_{SH}$ = 8.51 |
| LL' = 2 nH  CL' = 2.5 pF | $\omega_{cutoff,2}$ = 2.23 | $\omega_{0,2}$ = 2.343 | $\omega_{SH'}$ = 2.654 |
| CL = 2.5 pF  ll = 0.5 nH | $\omega_{cutoff,3}$ = 2.36 | $\omega_{0,3}$ = 2.354 | $\omega_{SE}$ = 0.65 |
| CR' = 1.8 pF  LR' = 2 nH | $\omega_{cutoff,4}$ = 9.88 | $\omega_{0,4}$ = 9.59 | $\omega_{SE'}$ = 2.244 |
| | $\omega_{cutoff,3} - \omega_{cutoff,2}$ = 30 MHz | | |

TABLE 14

E-CRLH unit cell parameters for a 2.4 GHz broad-band filter design

| | | | |
|---|---|---|---|
| Freq_Cutoff | 2.35 GHz | | |
| Freq0_1 | 0.62258003 GHz | Freq0_3 | 2.35432008 GHz |
| Freq0_2 | 2.34313193 GHz | Freq0_4 | 9.5946676 GHz |
| LR | 24 nH | LL | 0.5 nH |
| CR | 0.7 pF | CL | 2.5 pF |
| LR' | 2 nH | LL' | 2 nH |
| CR' | 1.8 pF | CL' | 2.51765559 pF |
| LRover2 | 12 | LR' over2 | 1 |
| 2CL | 5 | 2CL' | 5.03531119 |

LR CL = 60
LL CR = 0.35
LR' CL' = 5.03531119
Omega_SE = 0.6500769
omg_SH = 8.51145045
omg_SE' = 2.24402246

Figure 24A:
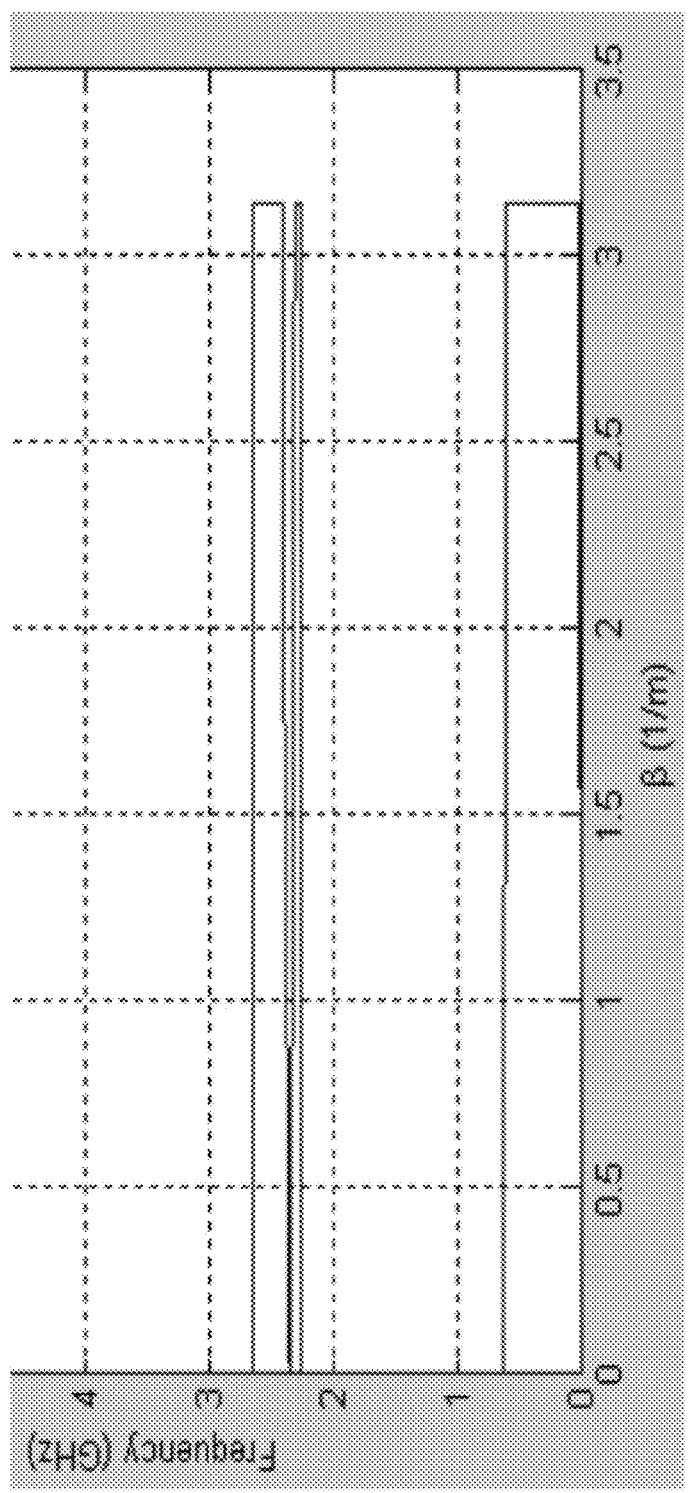
FIG. 24A illustrates Beta curves of an exemplary 2.4 GHz broad-band filter.

FIG. 24A shows Beta curves of the 2.4 GHz broad-band filter design described in Tables 13 and 14.

Figure 24B:
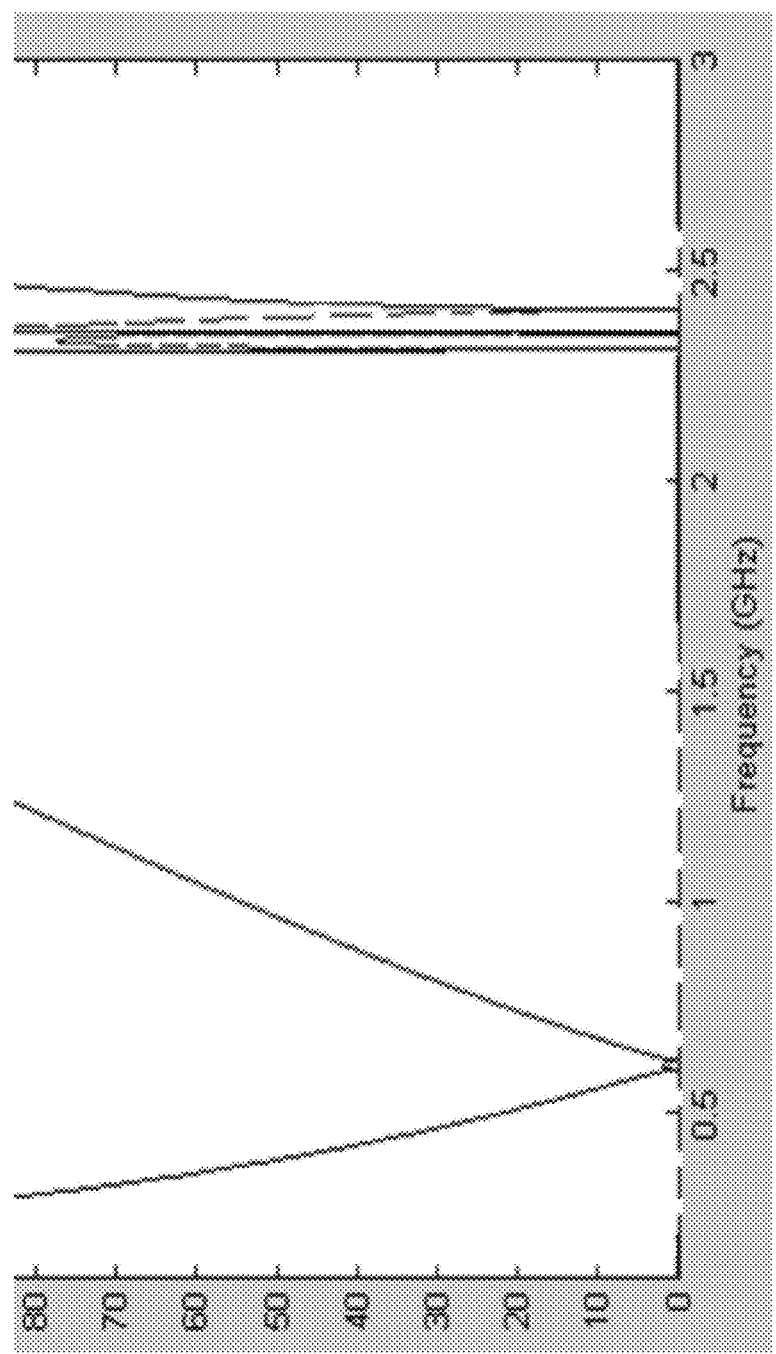
FIG. 24B illustrates an input impedance versus frequency.

FIG. 24B illustrates the input impedance versus frequency of the 2.4 GHz broad-band filter design described in Tables 13 and 14. Notably, the selected parameters in this filter design results in a 50 ohm matching that can be achieved at the 2.4 GHz band.

Figure 24C:
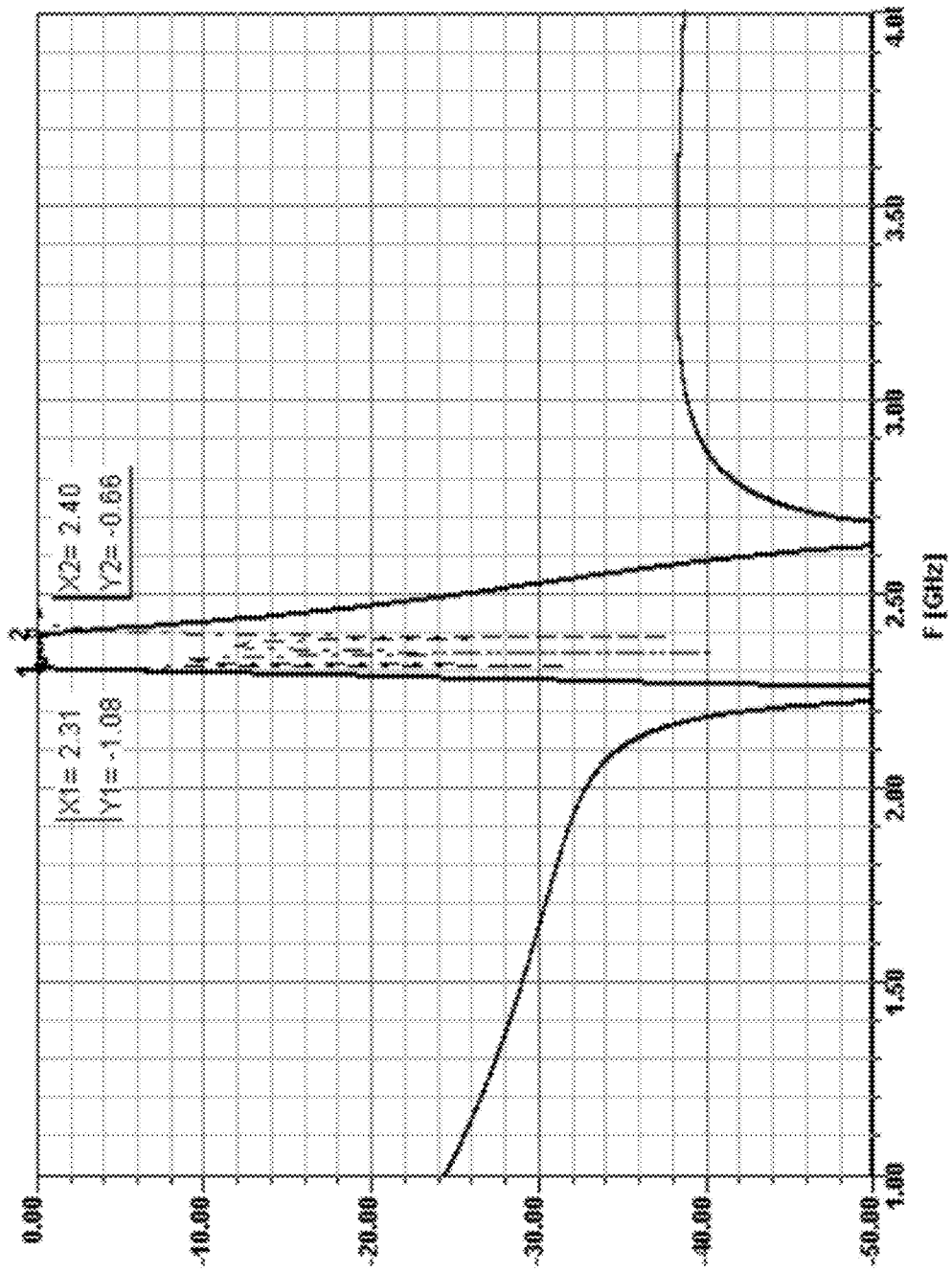
FIG. 24C illustrates a filter response of the E-CRLH unit cell in FIG. 8C.

FIG. 24C illustrates a filter response plot of the E-CRLH unit cell design described in Tables 13 and 14. Transmission (S12) and return loss (S11) are depicted in FIG. 24C as a dashed line and a solid line, respectively. In FIG. 24C, the filter bandwidth is approximately BW=3.8% (or 90 MHz) with a Q=106.

Broadband Filter Parameter Extraction Technique:

A method for extracting circuit parameters for the broadband filter designs is presented in Steps 1-6 below.

Step 1: Identify a filter circuit. Next, solve for impedance and a frequency band to extract circuit parameters in order to realize the filter. In other words, provide a full analysis on how to derive cell parameters given specific target bands, bandwidth, and matching conditions. Use cutoff frequencies to construct bandpass filters (BPF), including High-Q filters.

Step 2: Create a Matlab code or equivalent technical computing software to verify beta curves, return loss, transmission band, and impedance of the filter.

Step 3: Create an Excel spreadsheet or equivalent spreadsheet software program for parameter extraction that allows fast iterative optimization and verification with the Matlab code or equivalent technical computing software.

Step 4: For discrete circuit designs, verify circuit performance using Ansoft Circuit Designer or equivalent circuit design software tool.

Step 5: For fully printed circuit designs, use the extended Excel spreadsheet or equivalent spreadsheet software program to map fully printed design parameters to the circuit design parameters for filter realization. Alternative realizations can include a combination of fully printed and discrete inductors and capacitors.

Step 6: Build and verify the design on a printed circuit board (PCB) such as but not limited to FR4 dielectric substrates, printed multilayer low temperature co-fired ceramic (LTCC) assemblies, or equivalent substrates for a quick verification. In other words, fabricate multiple designs using discrete components and printed lumped elements, which can be easily combined to create hybrid discrete and printed designs. Printed, discrete, or hybrid printed/discrete filter designs can be modified to target alternative substrates, such as silicon or ceramic, or fabrication techniques, such as hybrid, wire bond, discrete components, LTCC or HTCC. In addition, this design methodology can be applied when designing a filter to tune the target filter quality factor Q and the filter operating frequency.

Printed Multilayer Shell Design for PCB Mounting:

A printed multilayer process involves the fabrication of multiple printed dielectric sheets comprising RF components to form a highly integrated, miniaturized assembly. Examples of printed multilayer processes include LTCC and HTCC. In LTCC technology, for example, multilayer circuits are formed from ceramic substrate sheets. A typical LTCC structure can have multiple extremely thin (in the order of tens of microns) dielectric layers that are comprised of conductive patches, spiral inductors (as thin as tens of microns and gaps as small as tens of microns), resistors, capacitors, and vias (with a radius as small as tens of microns) for interconnecting the multiple layers. Highly-integrated surface-mount RF modules can be fabricated with LTCC technology. These modules can be used as a platform to mount active components, such as transistors, diode quads, and monolithic amplifiers, to form a miniature multifunction assembly. The resulting LTCC module is a multilayer assembly that can be considerably smaller than traditional planar microwave modules.

Figure 25A:
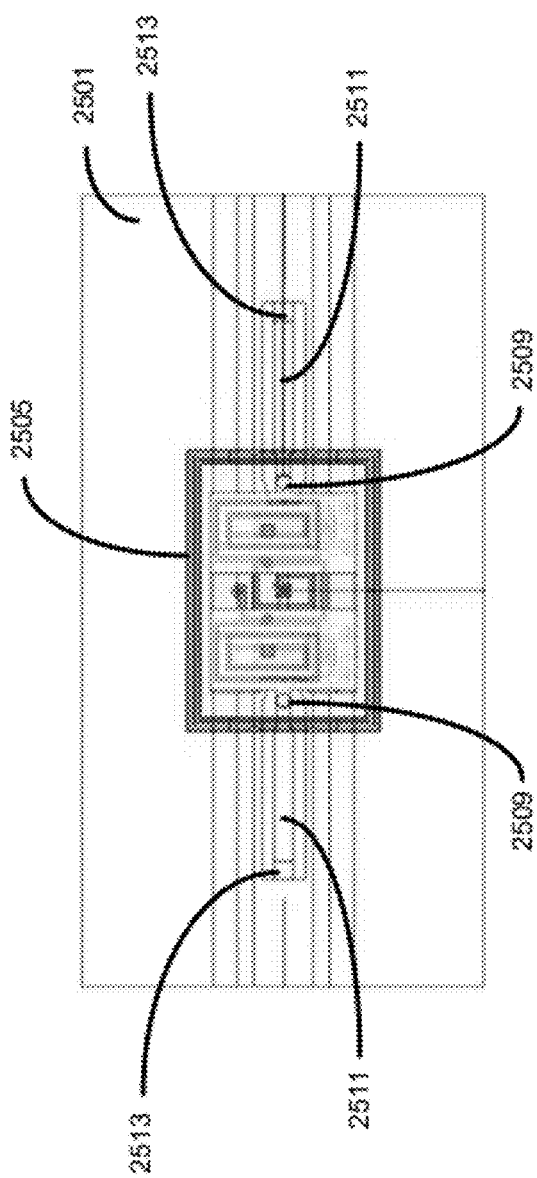
FIG. 25A illustrates a top view of a passive LTCC shell which is designed and mounted on an FR4 substrate.
Figure 25B:
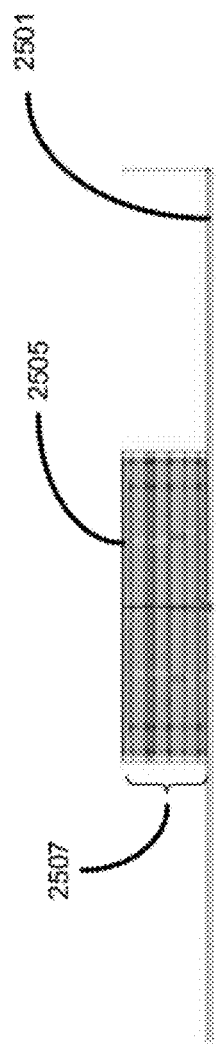
FIG. 25B illustrates a side view of the LTCC shell shown in FIG. 25A.

In one implementation, the passive LTCC module or shell can be designed and mounted on a PCB substrate for final integration with the rest of the circuitry such as, for example, PCB boards of mobile phones, laptops, or other compact mobile devices. The dimensions of the FR4 substrate can vary in size in order to meet the necessary space requirements of the device housing the FR4 assembly. FIG. 25A shows one example of an FR4 mounted implementation having a dimension of about 5 mm wide, 9.7 mm long, and 5 mil thick to support the 50 Ohm test ports and CPW feed lines that connect to the LTCC device. The FR4 substrate can be of any thickness, can be replaced by another type of dielectric, or can be mounted on a thicker FR4 substrate for rigidity. To provide connection to the LTCC shell, the FR4 mount can also include a grounded CPW trace 2511 with two 50 Ohm lumped ports 2513. Values of grounded-CPW width, gap, height above ground, and dielectric constant can be selected to match port impedances. Exemplary a grounded-CPW width and gap are 9 mil and 6 mil, respectively, on a 5 mil think FR4 substrate. FIG. 25B illustrates a cross-sectional view of the same multilayer assembly of FIG. 25A.

When designing the LTCC shell, LTCC materials which have a small tangent loss constant and can support a high Q such as up to a few thousands, for example, are selected due to the ability to design filters with high out of band rejection, or High-Q, without accruing high insertion loss in the filter pass band.

In FIGS. 25A-25D, the dimension of the LTCC shell 2505 is about 2 mm in width and 3 mm in length, for example. The LTCC shell shown in FIGS. 25A-25D can house a multilayer assembly having several substrates or layers. Each layer can measure about 0.96 mm in total thickness. Each inner substrate or layer can measure between 30 and 200 microns in thickness. The outer substrates, which include the top and bottom layers, can have an exposed outer surface for providing an external connection to the LTCC assembly. On each layer, structural elements such as interconnects and MTM components contained within the LTCC shell are formed by printing conductive material, such as copper, on multilayer LTCC substrates. A 50 Ohm trace can be calculated with the LTCC on top to check for filter response, or transmission S12 between the two input/output contact points 2509.

Figure 25C:
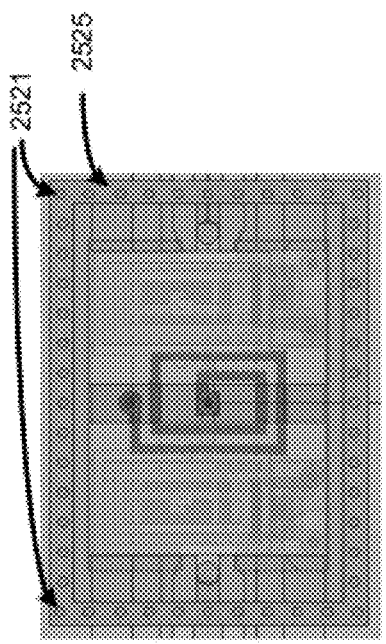
FIG. 25C illustrates an expanded top layer view of the LTCC shell shown in FIG. 25A.
Figure 25D:
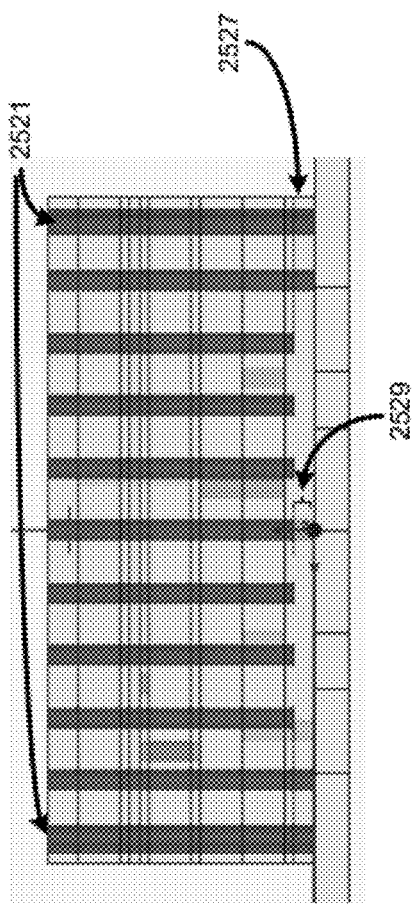
FIG. 25D illustrates an expanded bottom layer view of the LTCC shell shown in FIG. 25B.

FIG. 25C illustrates an expanded top layer view of the LTCC shell shown in FIG. 25A. In one implementation, a wall of vias 2521 can be formed along the outer edge of the LTCC shell and be contained within a grounding layer 2525. This via configuration serves as a shield against outer-shell nearby components or devices. In FIG. 25D, a cross-sectional view of the LTCC shell illustrates the wall of vias 2521 extending across multiple layers and surrounding the inner body of the LTCC assembly. In order to prevent shorting of the grounding layer 2525 to the CPW feed, vias projected above the CPW feed are designed as to not extend through the bottom layer 2527 leaving a gap 2529 between the bottom of the vias and CPW feed. A signal transition can be created to bring the signal to top layer through transition vias 2701 in FIG. 27. Vias can be as small as the vias within the filter structure or about one and a half or more times larger than the individual elements within the LTCC assembly. For example, the diameter of the via can measure between 50 and 100 microns.

MTM filters can be implemented in the LTCC shell design to produce a compact, broadband or narrowband, and high-Q filter design exhibiting low insertion loss. Some examples of filter designs that can be constructed using the LTCC shell include a bandpass filter based on one E-CRLH, a bandpass filter based on one C-CRLH, a bandpass filter based on two isotropic C-CRLH, and a bandpass filter based on two anisotropic C-CRLH.

Figure 26A:
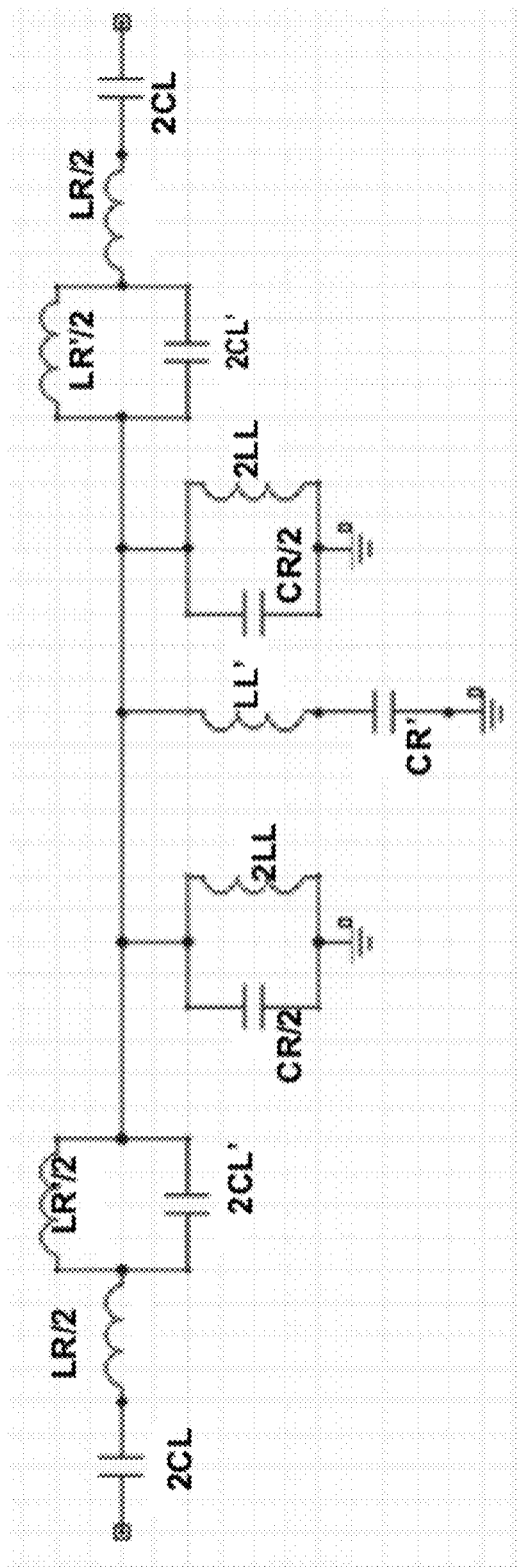
FIG. 26A illustrates a symmetric E-CRLH circuit.
Figure 26B:
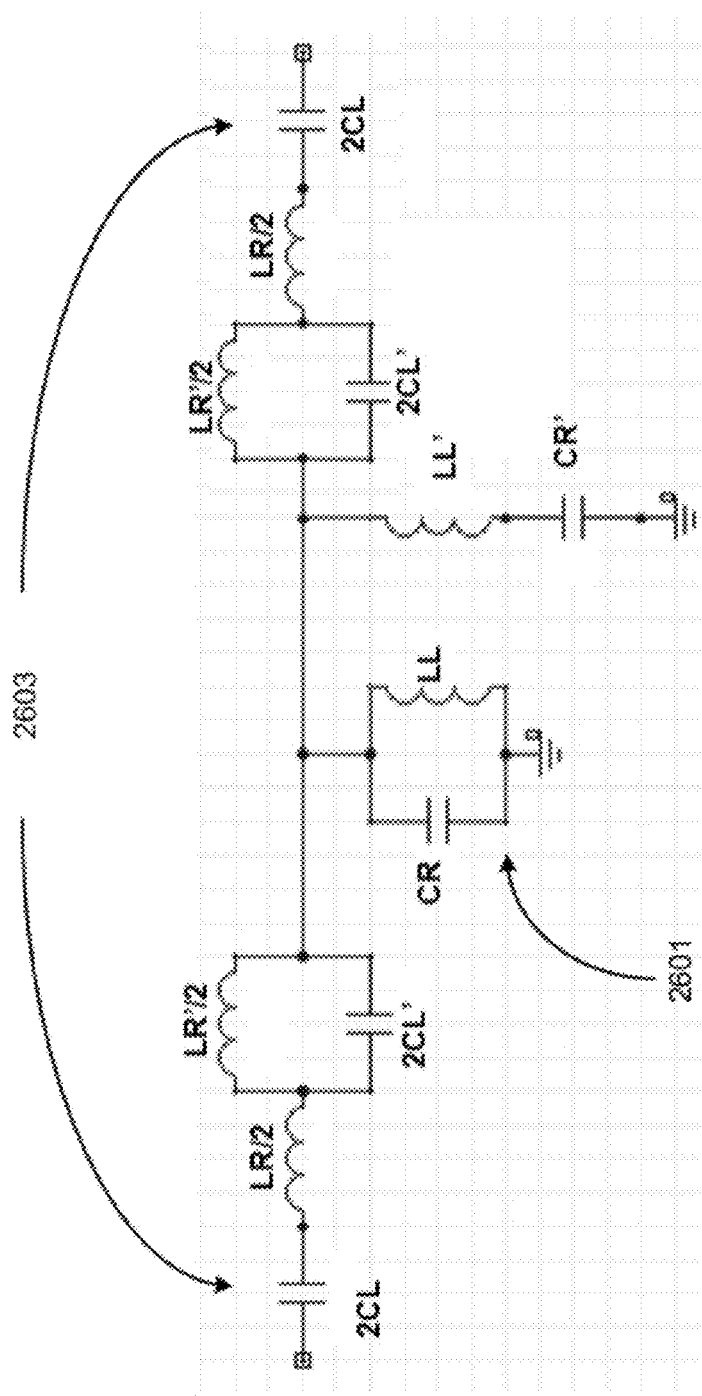
FIG. 26B illustrates a simplified circuit of the symmetric E-CRLH circuit shown in FIG. 26A.

Bandpass Filter Design Based on a Single, Symmetric E-CRLH:

As previously presented and as shown in FIG. 26A, a symmetric E-CRLH structure may be utilized for better matching and to construct a highly efficient, broadband or narrowband, and high-Q bandpass filter exhibiting low insertion loss. In FIG. 26A, the symmetric E-CRLH has 7 inductors and 7 capacitors and is equivalent to the E-CRLH circuit in FIG. 26B, which is formed by combining two CR/2 and 2LL in shunt into a single shunt unit 2601 comprising CR and LL. Functionally, the circuit shown in FIG. 26A is equivalent to the simplified circuit of FIG. 26B. Although E-CRLH circuit in FIG. 26B has a fewer total number of components, the layout of the simplified circuit can complicate matching conditions due to its asymmetric features when implemented on a printed multilayered process such as LTCC or HTCC. Thus, the symmetric E-CRLH design shown in FIG. 26A can offer a better implementation on printed multilayered processes than the simplified circuit design. An LTCC implementation of the E-CRLH circuit design of FIG. 26A is illustrated in FIGS. 28-39. In FIGS. 27A-27B, 12 vertically stacked layers are used to fabricate the LTCC E-CRLH design.

In FIGS. 27A-27B, a mounting layer is comprised of an FR4 substrate 2703 having a plurality of CPW feed lines and a ground layer 2705. The mounting layer is used as a bridge to externally connect the LTCC assembly to the FR4 mounting substrate via the CPW feed lines that are connected to the 50 Ohm ports and used for simulation and testing.

Figure 28:
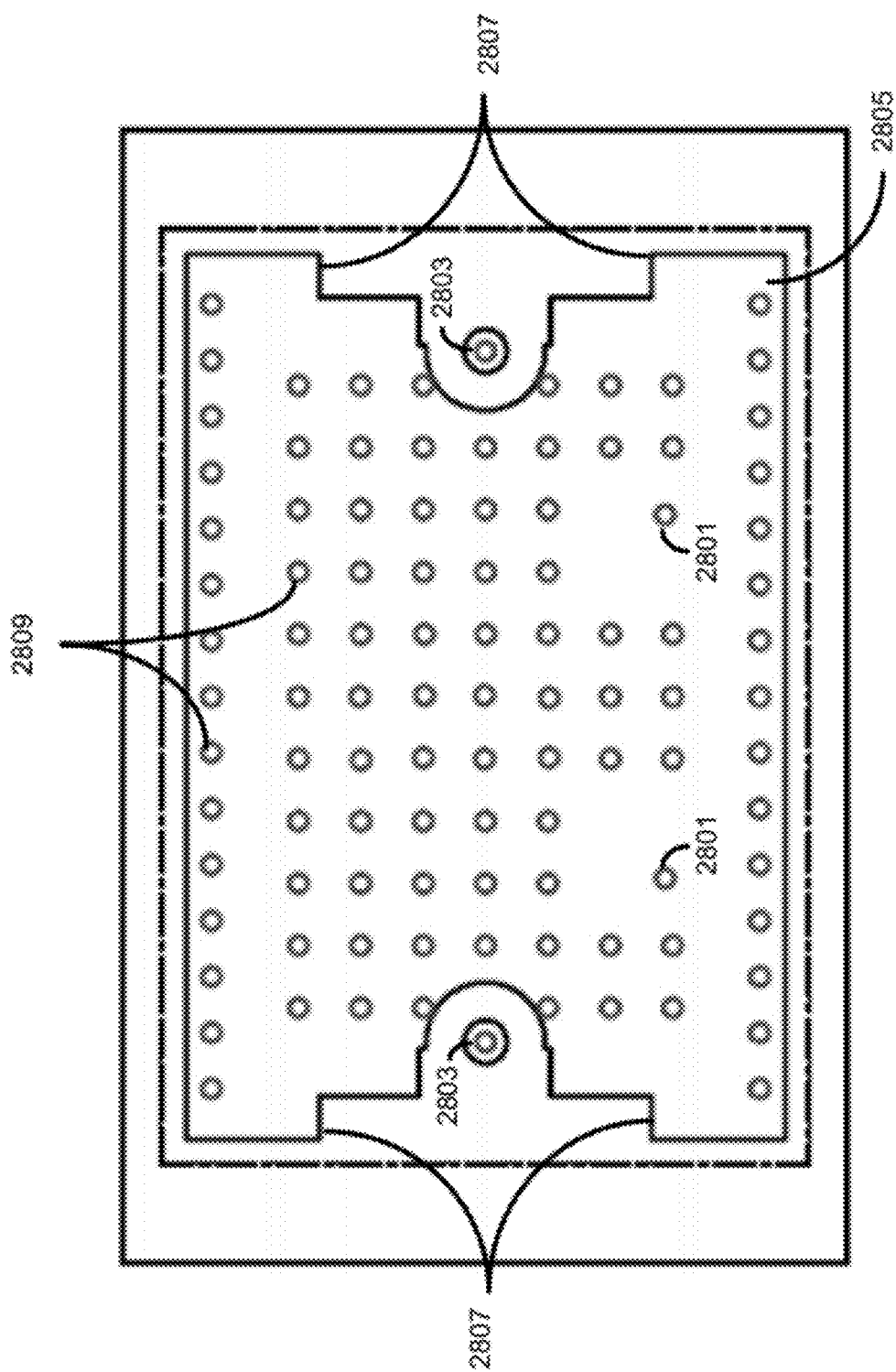
FIG. 28 illustrates a first layer, or Layer 1 of the LTCC stack shown in FIGS. 27A-27B.

In FIG. 28, a first layer, or Layer 1 of FIGS. 27A-B, is formed above and attached to the mounting layer. FIG. 28 illustrates a first set of vias 2801 for connecting two 2LL structures on Layer 4 to the CPW. Another pair of vias 2803 provides a conductive pathway between two 2CL structures 3901 located on Layer 12, or top layer, and a pair of signal ports 2509 (e.g., input/output or output/input) located on the FR4 substrate. By placing the 2CL structures on the top layer rather on the bottom layer, the bottom of the LTCC structure can be a full ground 2805 except at the feed point 2807. Alternatively, if the 2CL structures are placed on the bottom layer, the top and bottom of the FR4 substrate that is under the LTCC shell should be clear of any conductive material such as, for example, copper. On Layer 1, a main ground 2805 is separated by gaps 2807 and contains an array of vias 2809 that are connected to the ground layer 2805 of the FR4 substrate, a floating full ground 2913 in Layer 2, and a series of grounding plates in Layers 3-12. These grounding plates are located along the border of the LTCC shell and form a surrounding cage containing an array of vias that are connected to the floating full ground 2913 in Layer 2 and the main ground 2805 in Layer 1. The gaps 2807 are designed in such a manner to prevent shorting of the ground layer to the CPW feed lines.

In FIG. 29, a second layer, or Layer 2, is comprised of two metal pads 2901 that are each connected to two vias 2903. Vias 2903 form a connection between the signal ports 2509 and the two metal strips 3901, i.e., 2CL capacitors, on Layer 12. Another pair of vias 2905, which is connected to the pair of vias 2801 in Layer 1, provides a connection between the two 2LL inductors 3101 of Layer 4 and the main ground 2805. The floating full GND 2913 in Layer 2 features an array of inner vias 2915 and an array of vias 2911 that are connected to the ground layer of the FR4 substrate and grounding plates in Layers 1 and 3-12. Another feature of the floating full GND 2913 includes gaps 2909 in which each gap provides a clearance to prevent shorting of the ground layer to the CPW feed lines. Gaps 2909 can be omitted from the design in Layer 2 as shown in Layers 3 and higher. Foundry requirements may play a role in designing certain layers affecting parameters such as thickness and width of structural elements. For example, to meet minimum thickness requirements, Layer 2 can be designed to serve as a floating ground for the capacitors CR 3001 and CR' 3003 on Layer 3 since the substrate thickness between Layer 2 and 3 is much smaller than the thickness of the outer substrate between Layer 1 and 2.

Figure 30:
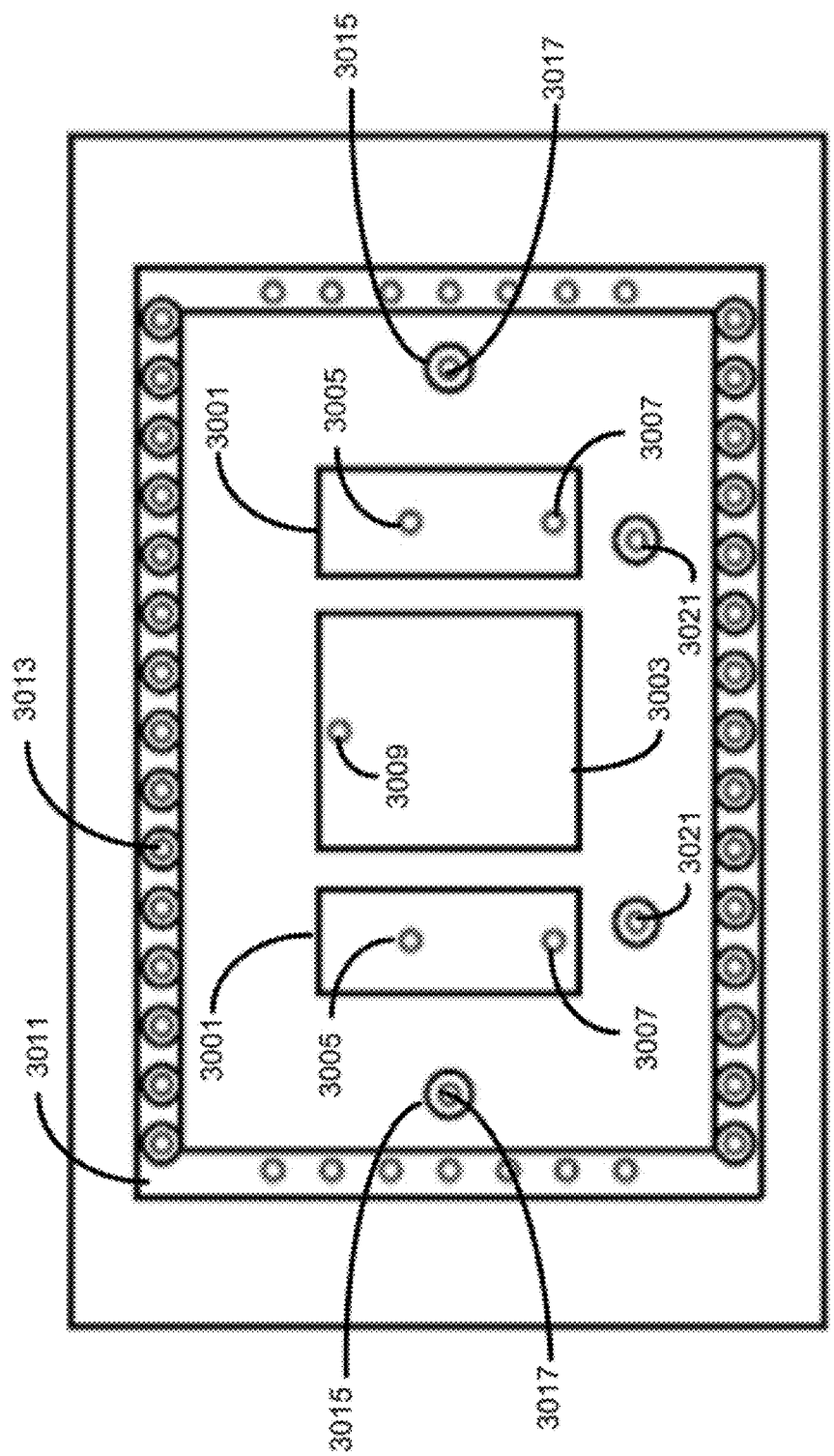
FIG. 30 illustrates a third layer, or Layer 3 of the LTCC stack shown in FIGS. 27A-27B.

In FIG. 30, a third layer, or Layer 3, is comprised of two rectangular metal strips 3001 approximately 0.8 mm×0.4 mm in dimension. Each metal strip 3001 is symmetric about the horizontal and vertical center of the LTCC stack and forms a conductive plate element corresponding to a single CR/2 capacitor shown in FIG. 26A. Layer 3 also includes a large metal strip 3003 which is also symmetric about the horizontal and vertical center of the LTCC stack. The large strip 3003 measures about 1.4 mm×0.66 mm and forms a conductive plate element corresponding to the CR' capacitor shown in FIG. 26A. A first set of vias 3005 located inside each strip 3001 connect each CR/2 structure to a corresponding 2CL' structure located on Layer 5. A second set of vias 3007 located inside each strip 3001 connect each CR/2 structure to a corresponding 2LL structure located on Layer 4. A rectangular grounding plate 3011, which is also part of the via cage, is formed along the perimeter of Layer 3 and contains an array of vias 3013 that are connected to the ground layer of the FR4 substrate and grounding plates in Layers 1-2 and 4-12. Two metal pads 3015 are each connected to two vias 3017 in which each via 3017 form a conductive path between the signal ports 2509 and the two 2CL structures on Layer 12. Another pair of vias 3021 are each connected to the via contacts 2801 in Layer 1 and forms a conduction path between the CPW ground and the two 2LL structures on Layer 4 of the E-CRLH circuit.

FIG. 31 illustrates a fourth layer, or Layer 4, which is comprised of elements 3101 and 3103 that respectively form the shunt inductors 2LL and LL' of the E-CRLH circuit design shown in FIG. 26. The two 2LL 3101 structures are each comprised of two vias 3105 and 3107 which are respectively connected to the CR/2 3001 structure of Layer 3 and CPW ground. The single LL' 3103 structure is also comprised of two vias 3107 and 3109 which are respectively connected to the CR' 3003 structure of Layer 3 and a metal bridge connecting two 2CL' structures located on Layer 5. A rectangular grounding plate 3111, which is also part of the via cage, is formed along the perimeter of Layer 4 and contains an array of vias 3113 that are connected to the ground layer of the FR4 substrate and grounding plates in Layers 1-3 and 5-12. Two metal pads 3115 are each connected to two vias 3117 in which each via 3117 form a conductive path between the signal ports 2509 and the two 2CL structures on Layer 12. Another pair of metal pads 3119 are each connected to vias 3121 which forms a conduction path between the CR/2 3001 structure on Layer 3 and the 2CL' structure on Layer 5 of the E-CRLH circuit.

Figure 32:
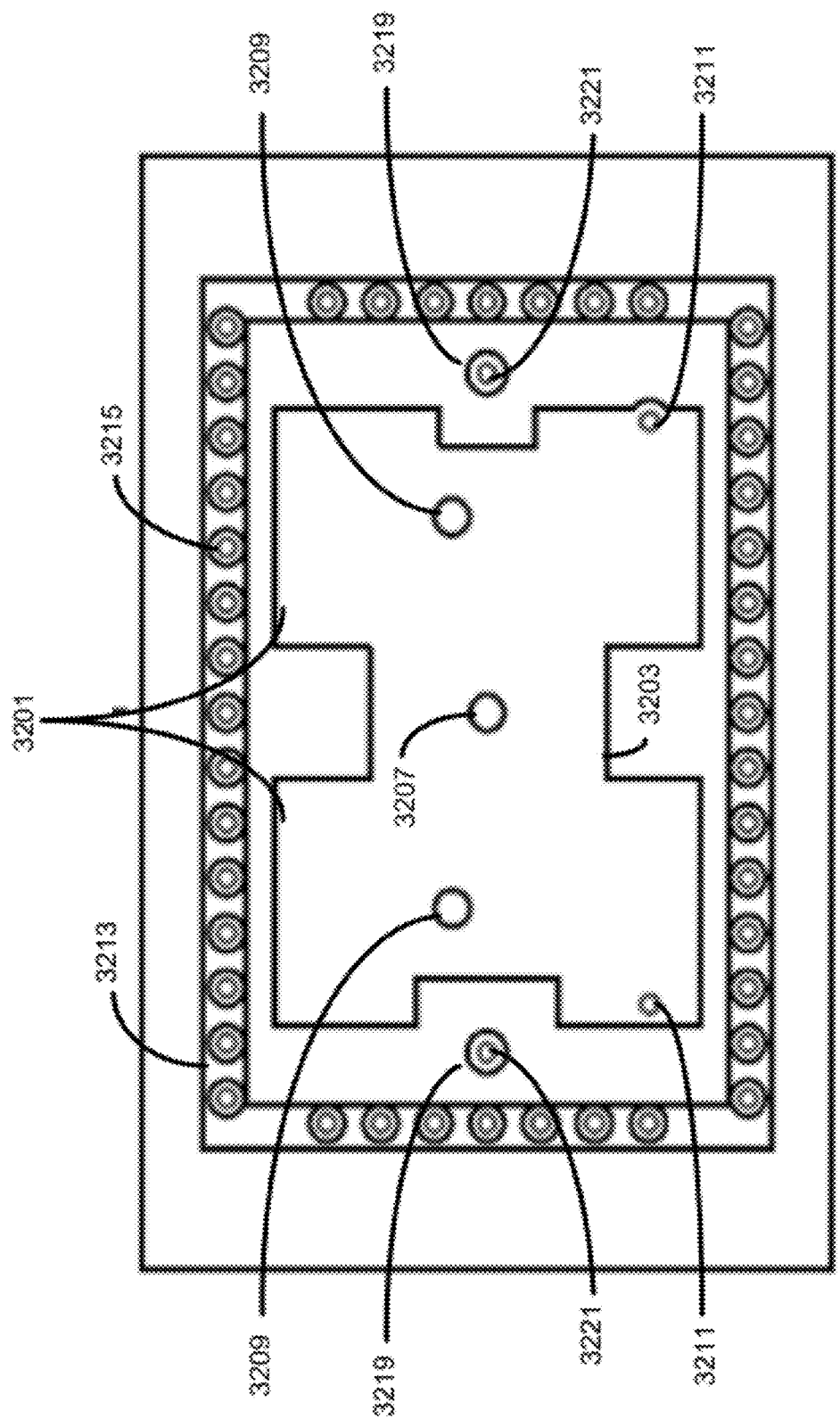
FIG. 32 illustrates a fifth layer, or Layer 5 of the LTCC stack shown in FIGS. 27A-27B.

FIG. 32 illustrates a fifth layer, or Layer 5, which is comprised of two large metal strips 3201. Each strip 3201 forms a first conductive plate element corresponding to the single series capacitor (2CL') shown in FIG. 26. A metal bridge 3203 extending from each of the two metal strips 3201 are connected to a via 3207. Via 3207 is used to connect the two metal strips 3201, i.e., series capacitor (2CL'), to the LL' 3109 inductor on Layer 4. Each 2CL' 3201 capacitor contains a pair of vias 3209 and 3211 in which each via is respectively connected to the CR/2 3001 capacitor structure on Layer 3 and a corresponding LR'/2 inductor element located on Layer 7. A rectangular grounding plate 3213, which is also part of the via cage, is formed along the perimeter of Layer 5 and contains an array of vias 3215. Two metal pads 3219 are each connected to two vias 3221 in which each via 3219 form a conductive path between the signal ports 2509 and the two 2CL structures on Layer 12.

Figure 33:
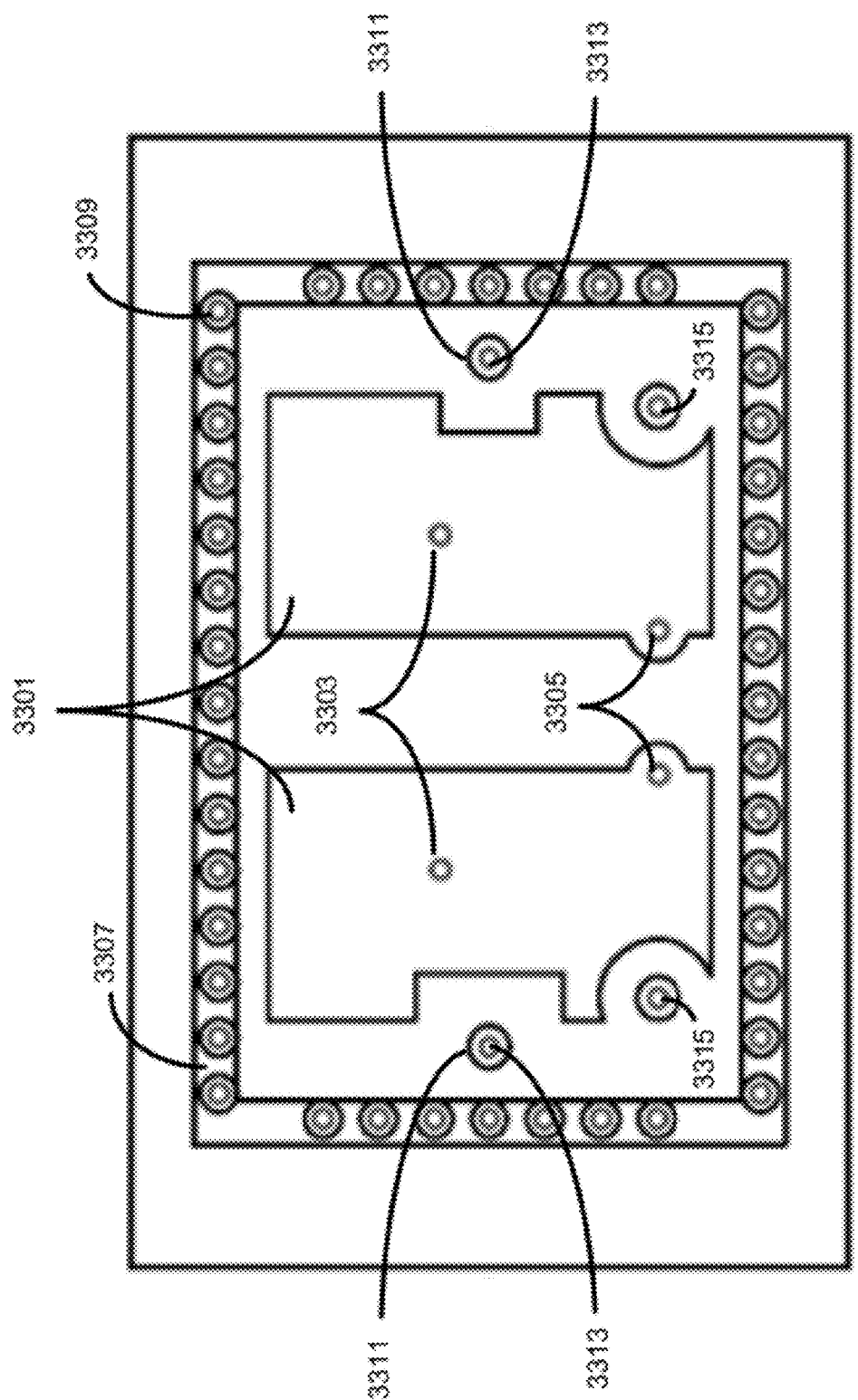
FIG. 33 illustrates a sixth layer, or Layer 6 of the LTCC stack shown in FIGS. 27A-27B.

In FIG. 33, a sixth layer, or Layer 6, is comprised of two large metal strips 3301. Each metal strip forms a second conductive plate element corresponding to the single series capacitor (2CL') shown in FIG. 26. Each metal strip 3301, i.e., 2CL' capacitor, contains a pair of vias 3303 and 3305 in which each via is respectively connected to an LR/2 inductor structure located on Layer 7 and an LR'/2 inductor structure located on Layer 8. A rectangular grounding plate 3307, which is also part of the via cage, is formed along the perimeter of Layer 6 and contains an array of vias 3309 which are connected to the ground layer of the FR4 substrate and grounding plates in Layers 1-5 and 7-12. Two metal pads 3311 are each connected to two vias 3313 in which each via 3313 form a conductive path between the signal ports 2509 and the two 2CL structures on Layer 12. Vias 3315 provide a conductive pathway between an LR'/2 inductor structure located on Layer 7 and the 2CL' 3201 capacitor structure on Layer 5.

Figure 34:
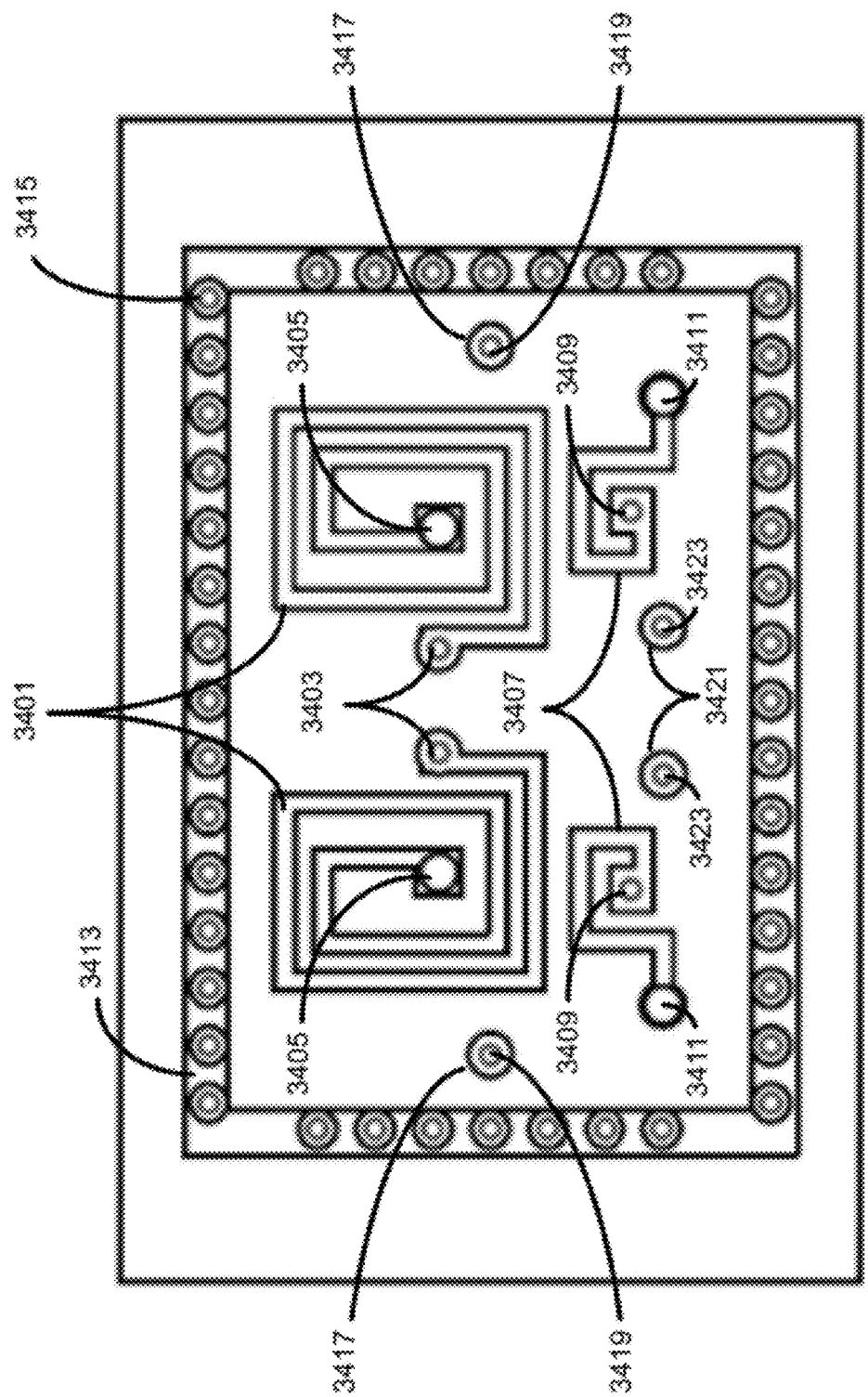
FIG. 34 illustrates a seventh layer, or Layer 7 of the LTCC stack shown in FIGS. 27A-27B.

FIG. 34 illustrates a seventh layer, or Layer 7, which is comprised a pair of large spiral elements 3401 and a pair of small spiral elements 3407. Each pair of large and small spiral elements 3401 and 3407 correspond to the series inductors LR/2 and LR'/2, respectively, as shown in FIG. 26A. Each LR/2 inductor 3401 is comprised of two vias 3403 and 3405 which are respectively connected to a large spiral element 3501 located on Layer 8 and the 2CL' 3301 capacitor structure on Layer 6. Each LR'/2 inductor 3407 is also comprised of two vias 3409 and 3411 which are respectively connected to a small spiral element 3507 located on Layer 8 and the 2CL' 3201 capacitor structure on Layer 5. A rectangular grounding plate 3413, which is also part of the via cage, is formed along the perimeter of Layer 7 and contains an array of vias 3415 which are connected to the ground layer of the FR4 substrate and grounding plates in Layers 1-6 and 8-12. Two metal pads 3417 are each connected to two vias 3419 in which each via 3419 form a conductive path between the signal ports 2509 and the two 2CL structures on Layer 12. An additional set of two metal pads 3421 are each connected to two vias 3423 in which each via 3423 form a conductive path between the 2CL' capacitor located on Layer 7 and the LR'/2 inductor located on Layer 8.

Figure 35:
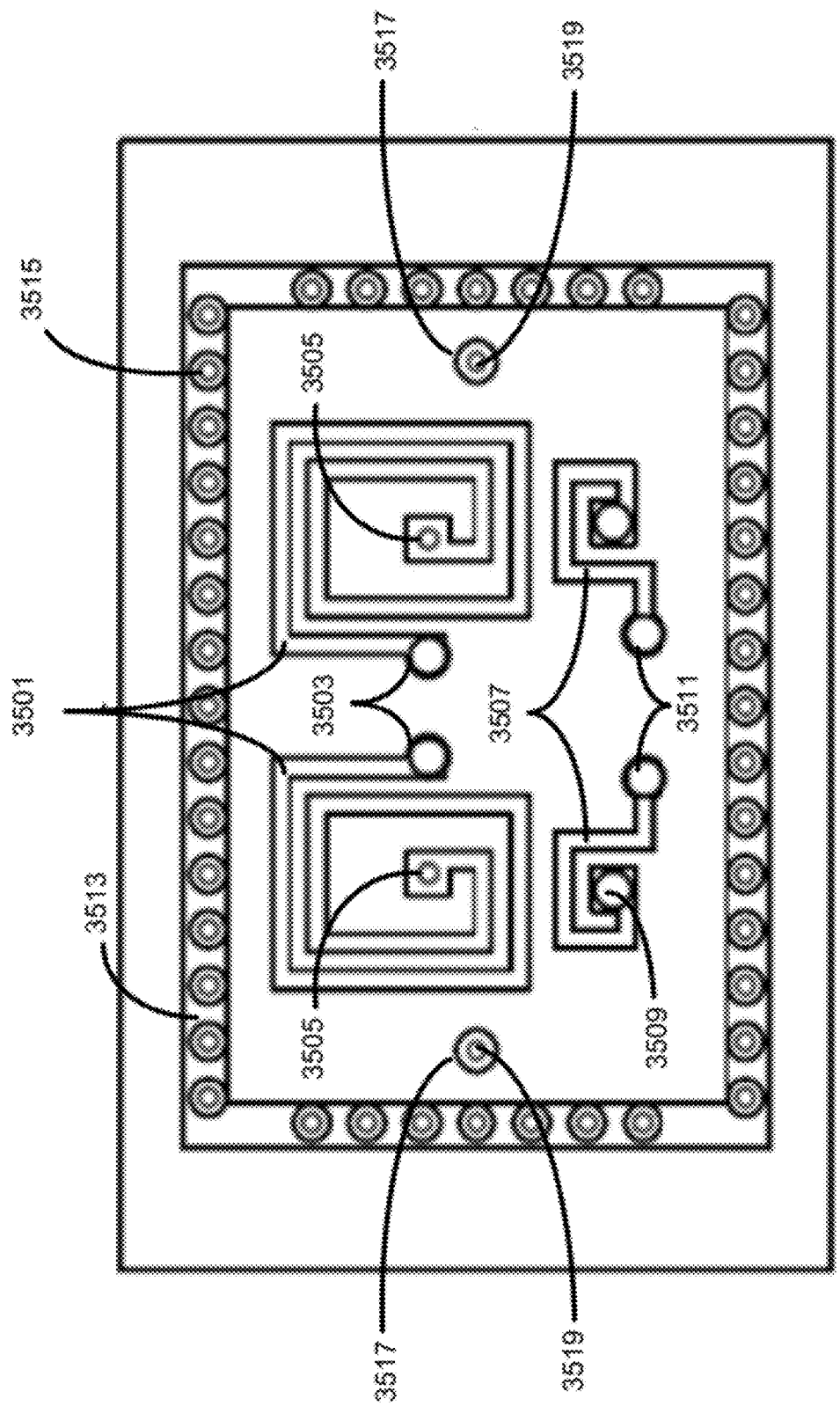
FIG. 35 illustrates an eighth layer, or Layer 8 of the LTCC stack shown in FIGS. 27A-27B.

FIG. 35 illustrates an eighth layer, or Layer 8, which is comprised of a pair of large spiral elements 3501 and a pair of small spiral elements 3507. Each pair of large and small spiral elements 3501 and 3507 correspond to the series inductor elements LR/2 and LR'/2, respectively, as shown in FIG. 26A. Each large spiral element 3501, i.e., LR/2 inductor, is comprised of two vias 3503 and 3505 which are respectively connected to the spiral element 3401 located on Layer 7 and another spiral element 3601 located on Layer 9. Each small spiral element 3507, i.e., LR'/2 inductor, is also comprised of two vias 3509 and 3511 which are respectively connected to the small spiral element 3407 located on Layer 7 and the 2CL' 3301 capacitor on Layer 6. A rectangular grounding plate 3513, which is also part of the via cage, is formed along the perimeter of Layer 8 and contains an array of vias 3515 which are connected to the ground layer of the FR4 substrate and grounding plates in Layers 1-7 and 9-12. Two metal pads 3517 are each connected to two vias 3519 in which each via 3519 form a conductive path between the signal ports 2509 and the two 2CL structures on Layer 12.

Figure 36:
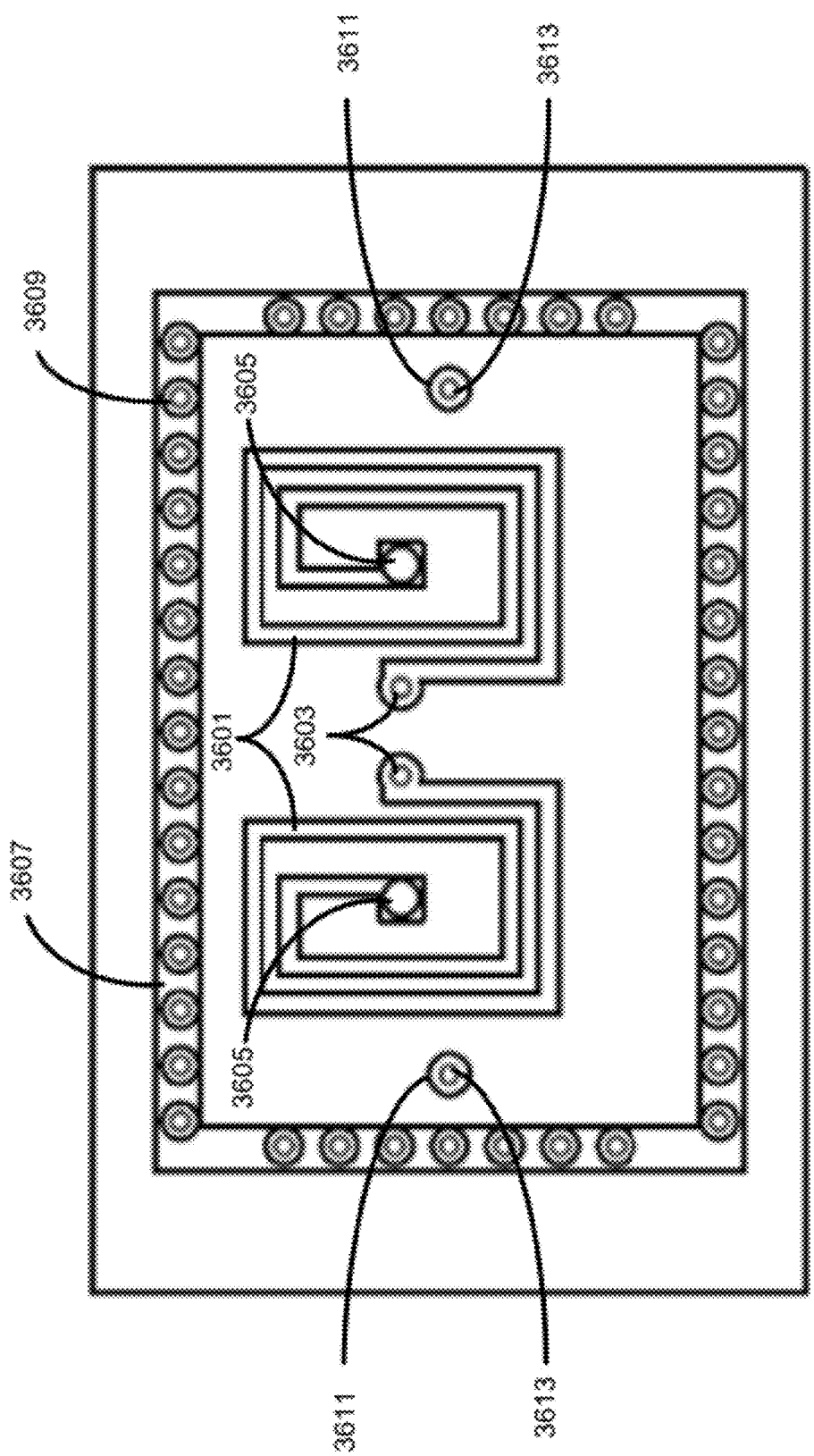
FIG. 36 illustrates a ninth layer, or Layer 9 of the LTCC stack shown in FIGS. 27A-27B.

In FIG. 36, an ninth layer, or Layer 9, is comprised of two large spiral elements 3601 which corresponds to the series inductor LR/2 of the E-CRLH circuit design shown in FIG. 26. Each large spiral element 3601, i.e., LR/2 inductor, is comprised of two vias 3603 and 3605 which are respectively connected to the spiral element 3501 located on Layer 8 and another spiral element 3701 located on Layer 10. A rectangular grounding plate 3607, which is also part of the via cage, is formed along the perimeter of Layer 9 and contains an array of vias 3609 which are connected to the ground layer of the FR4 substrate and grounding plates in Layers 1-8 and 10-12. Two metal pads 3611 are each connected to two vias 3613 in which each via 3613 form a conductive path between the signal ports 2509 and the two 2CL structures on Layer 12.

Figure 37:
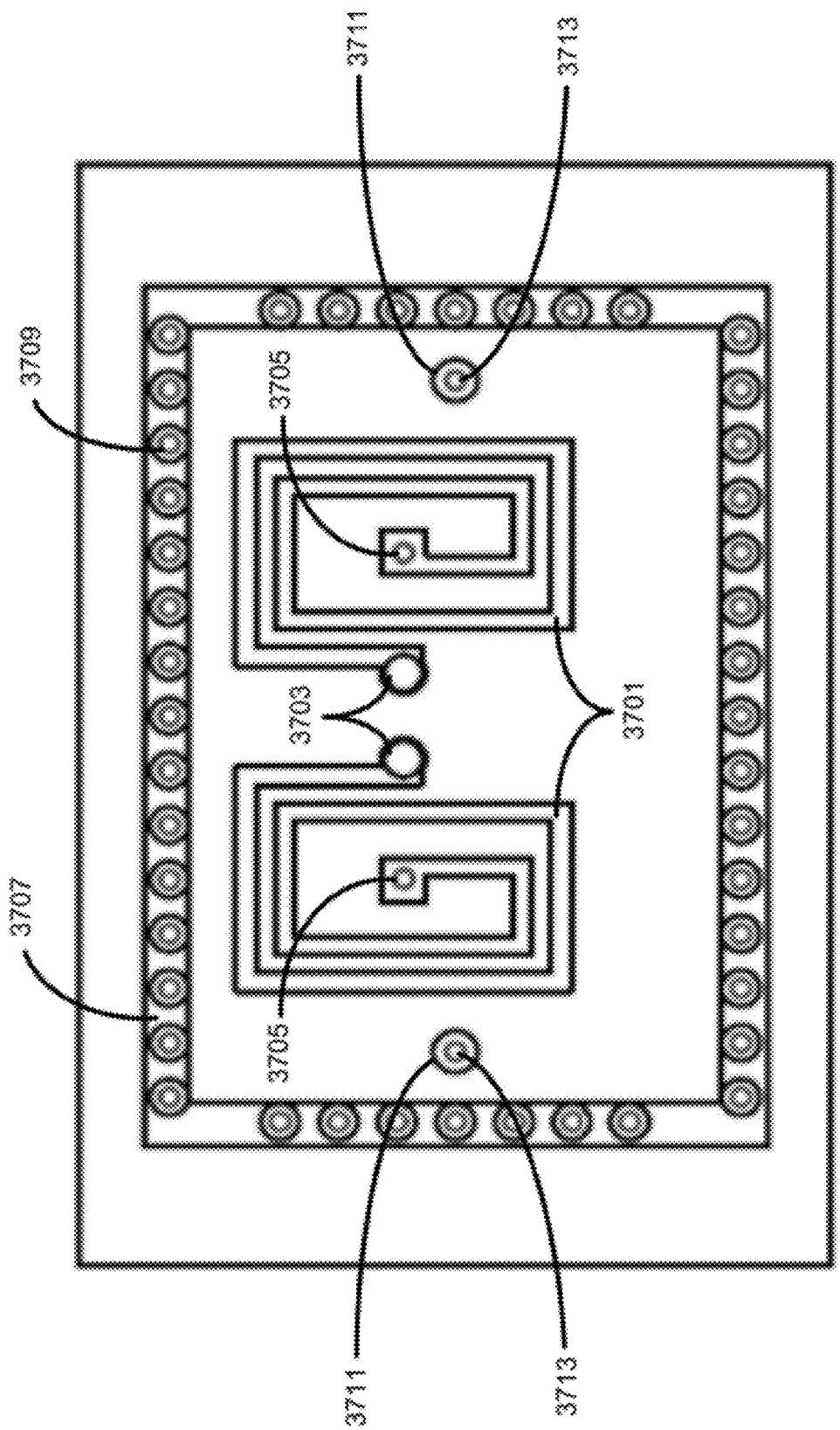
FIG. 37 illustrates a tenth layer, or Layer 10 of the LTCC stack shown in FIGS. 27A-27B.

FIG. 37 illustrates an tenth layer, or Layer 10, which is comprised of two large spiral elements 3701 corresponding to the series inductor LR/2 of the E-CRLH circuit design shown in FIG. 26. Each large spiral element 3701, i.e., LR/2 inductor, is comprised of two vias 3703 and 3705 which are respectively connected to the spiral element 3601 located on Layer 9 and a 2CL capacitor structure 3803 located on Layer 11. A rectangular grounding plate 3707, which is also part of the via cage, is formed along the perimeter of Layer 10 and contains an array of vias 3709 which are connected to the ground layer of the FR4 substrate and grounding plates in Layers 1-9 and 11-12. Two metal pads 3711 are each connected to two vias 3713 in which each via 3713 forms a conductive path between the signal ports 2509 and two capacitor structures 3901 on Layer 12.

Figure 38:
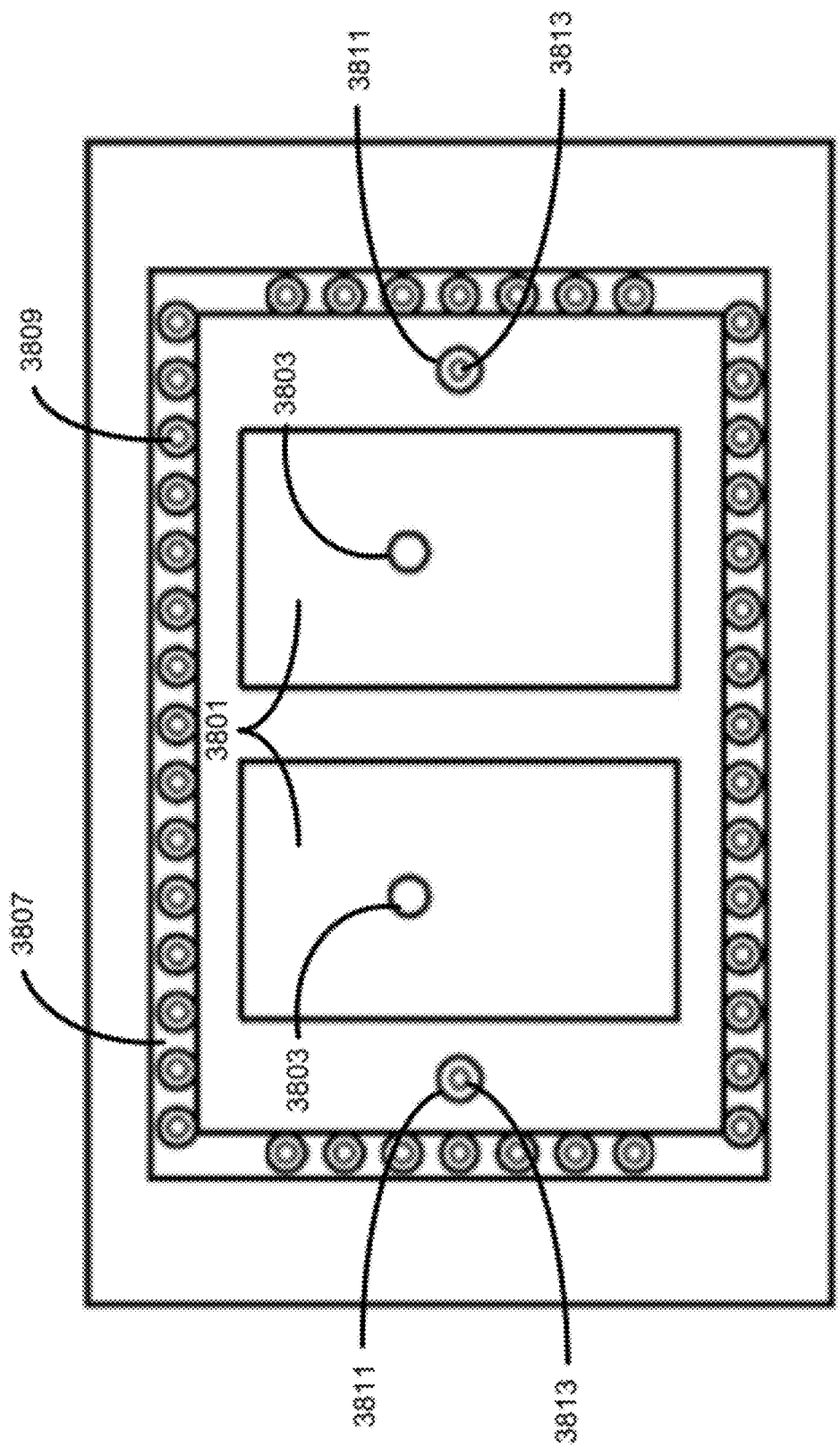
FIG. 38 illustrates an eleventh layer, or Layer 11 of the LTCC stack shown in FIGS. 27A-27B.

FIG. 38 illustrates an eleventh layer, or Layer 11, which is comprised of two metal strips 3801 that each form a first conductive plate element of the series capacitors (2CL) shown in FIG. 26. Each metal strip 3801, i.e., 2CL capacitor, is comprised of a single via 3803 which is connected to the LR/2 inductor 3701 located on Layer 10. A rectangular grounding plate 3807, which is also part of the via cage, is formed along the perimeter of Layer 11 and contains an array of vias 3809 which are connected to the ground layer of the FR4 substrate and grounding plates in Layers 1-10 and 12. Two metal pads 3811 are each connected to two vias 3813 in which each via 3813 form a connection between the signal ports 2509 and the two 2CL structures on Layer 12.

Figure 39:
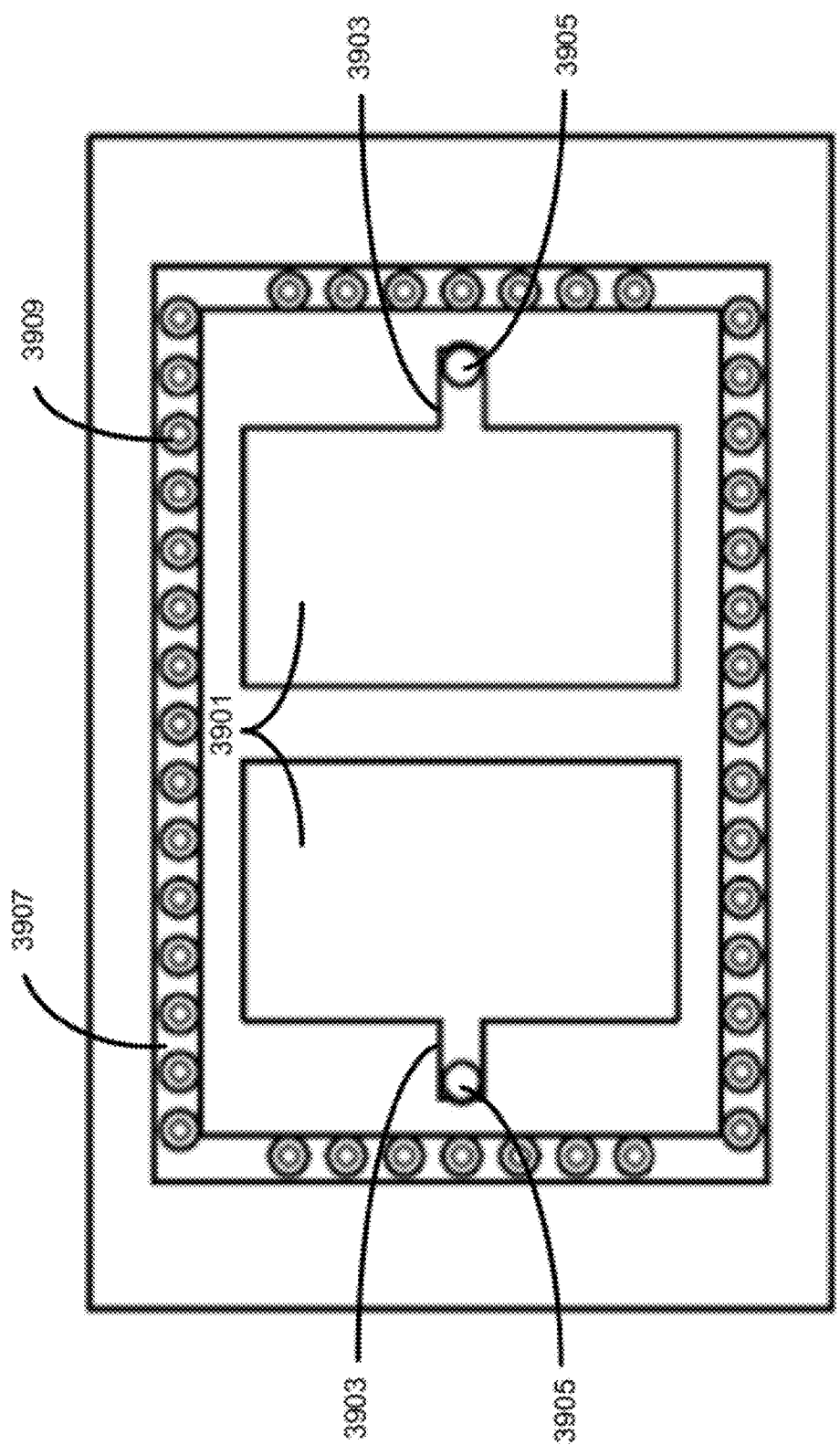
FIG. 39 illustrates a twelfth layer, or Layer 12 of the LTCC stack shown in FIGS. 27A-27B.

In FIG. 39, the top layer, or Layer 12, is comprised of two metal strips 3901 that each form a second conductive plate element of the series capacitors (2CL) shown in FIG. 26. Each metal strips 3901 measures approximately 1.6 mm×1.2 mm and includes a metal stub 3903 at the outer edge portion of each 2CL capacitor. Vias 3905 are formed within each metal stub 3903 and are used to connect each 2CL structure to the signal ports 2509 on the ground layer. A rectangular grounding plate 3907, which is also part of the via cage, is formed along the perimeter of Layer 12 and contains an array of vias 3909 which are connected to the ground layer of the FR4 substrate and grounding plates in Layers 1-11.

Filter response and impedance simulations may be performed using software design modeling tools such as HFSS to simulate a model of the printed multilayer assembly, verify the filter response of the LTCC bandpass filter shown in FIGS. 27-39, and analyze parasitic coupling effects. Parasitic effects are generally due to the printing, close proximity, and connection of capacitors and inductors as well as the effects of the surrounding cage and signal transition vias 2903. The general effects of parasitic coupling produced by the LTCC bandpass filter can be determined by comparing the differences between the filter response of the LTCC bandpass filter to the filter response of the E-CRLH circuit shown in FIG. 26A.

In FIGS. 40A-40D, the E-CRLH unit cell circuit of FIG. 26A is used as a basis for comparison. Circuit properties and parameter extraction of the E-CRLH unit cell used to fabricate the LTCC filter can be determined by using similar parameter extraction techniques mentioned previously to obtain the individual circuit parameters. These circuit properties for the E-CRLH unit cell are summarized in Table 15 without taking into consideration any parasitic couplings.

TABLE 15

E-CRLH unit cell circuit property of the LTCC filter

| Freq_Cutoff | 1.8 GHz | | |
|---|---|---|---|
| Freq0_1 | 0.63484127 GHz | Freq0_3 | 1.78174557 GHz |
| Freq0_2 | 1.7768221 GHz | Freq0_4 | 6.71813091 GHz |

TABLE 15-continued

E-CRLH unit cell circuit property of the LTCC filter

| LR | 24 nH | LL | 0.5 nH |
|---|---|---|---|
| CR | 1.26579991 pF | CL | 2.12564745 pF |
| LR' | 4.71651753 nH | LL' | 4 nH |
| CR' | 1.75595556 pF | CL' | 2.1 pF |
| LRover2 | 12 | LR' over2 | 2.35825876 |
| 2CL | 4.25129491 | 2CL' | 4.2 |

LR CL = 51.0155389
LL CR = 0.6329
LR' CL' = 9.9046868
Omega_SE = 0.705
omg_SH = 6.3
omg_SE' = 1.6

Figure 40A:
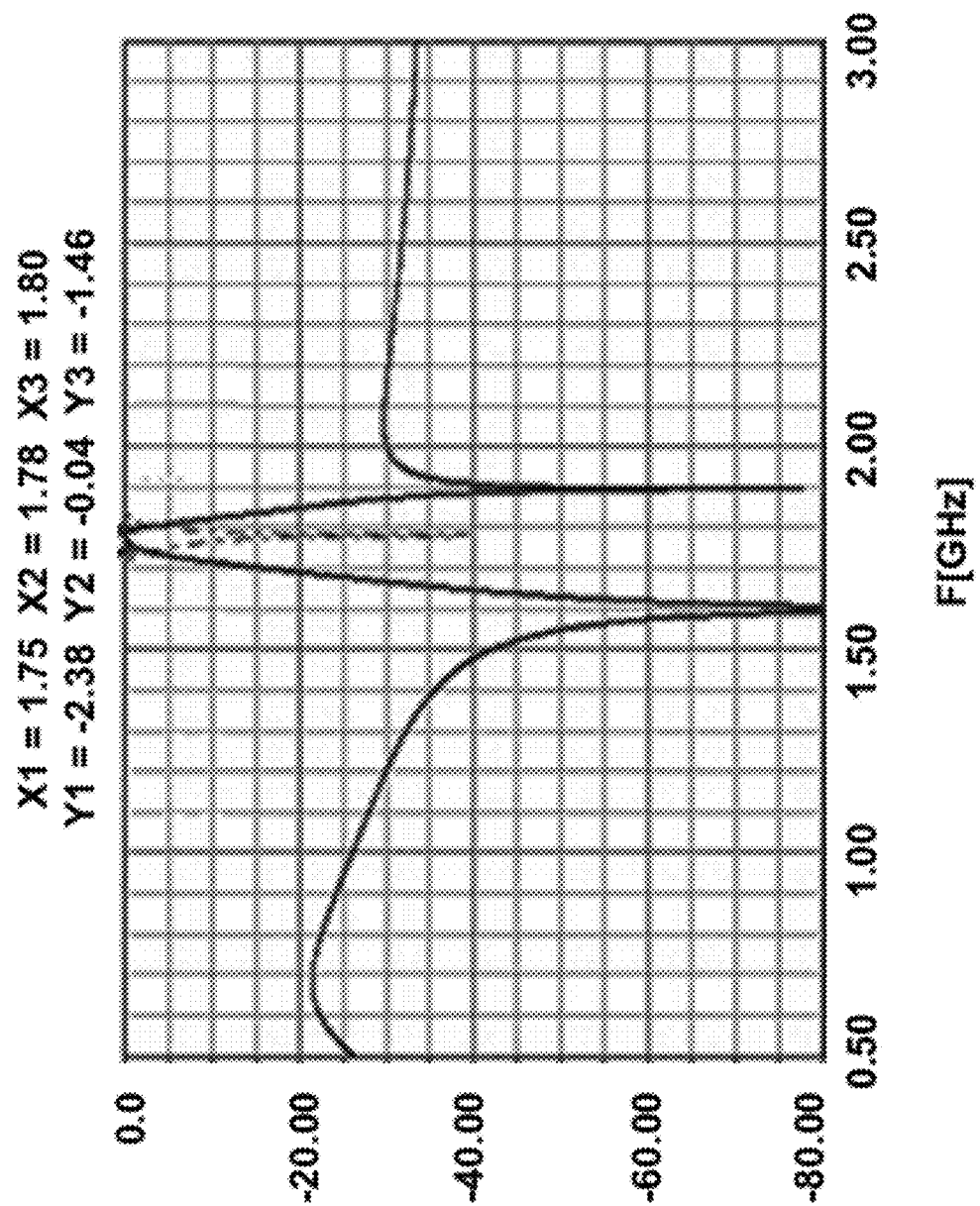
FIG. 40A illustrates a filter response of the printed multilayer E-CRLH circuit shown in FIGS. 27-39.

FIG. 40A illustrates the filter response of the LTCC filter shown in FIGS. 49-61 where BW=4.2%, Q=55, IL<−1.8 dB, and size 2.05 mm×3.75 mm.

Figure 40B:
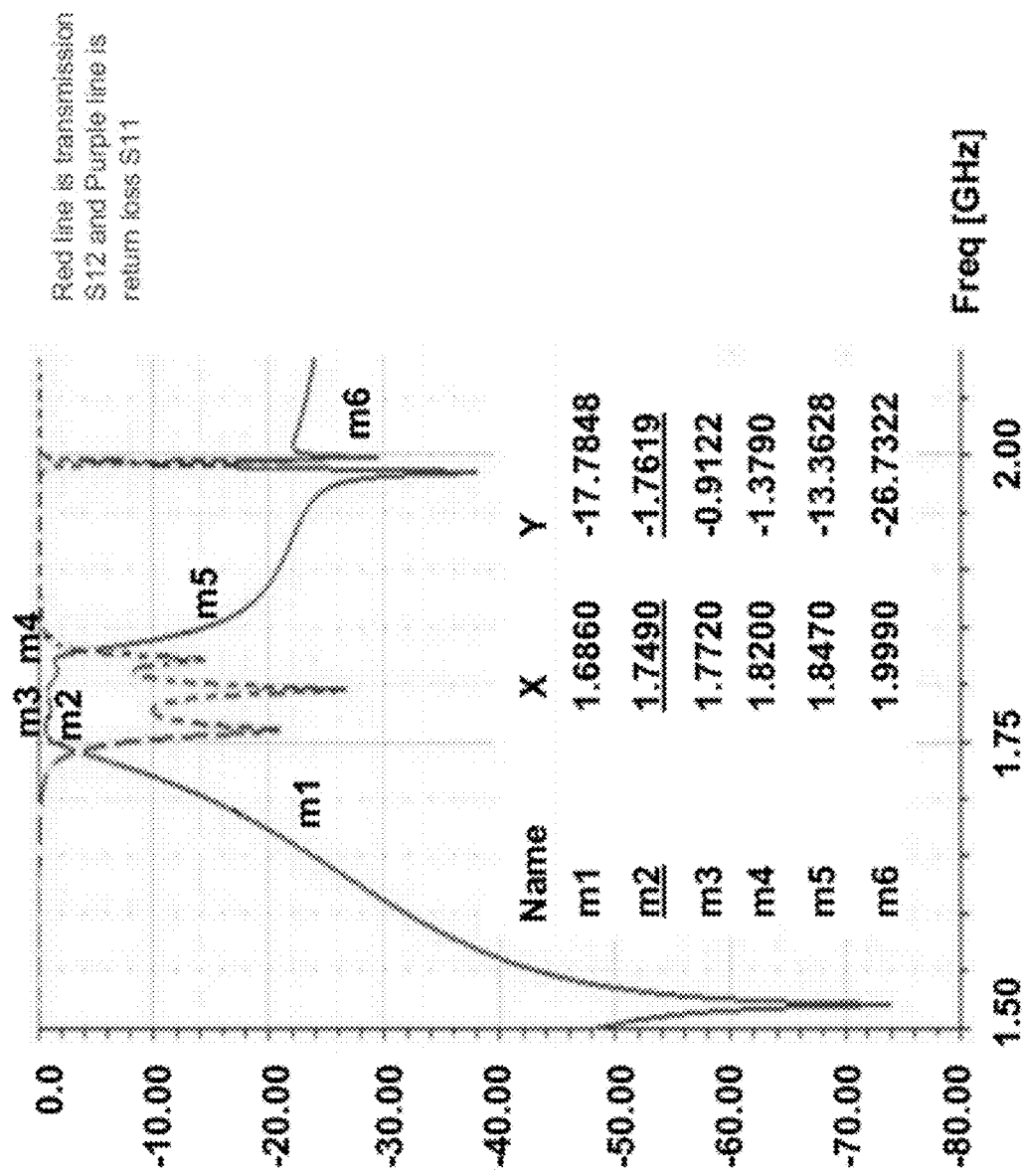
FIG. 40B illustrates a filter response of its corresponding the E-CRLH circuit having 50 ohm input/output ports.

FIG. 40B illustrates the filter response of the 12-layer E-CRLH circuit printed on LTCC having 50 ohm input/output ports.

Figure 40C:
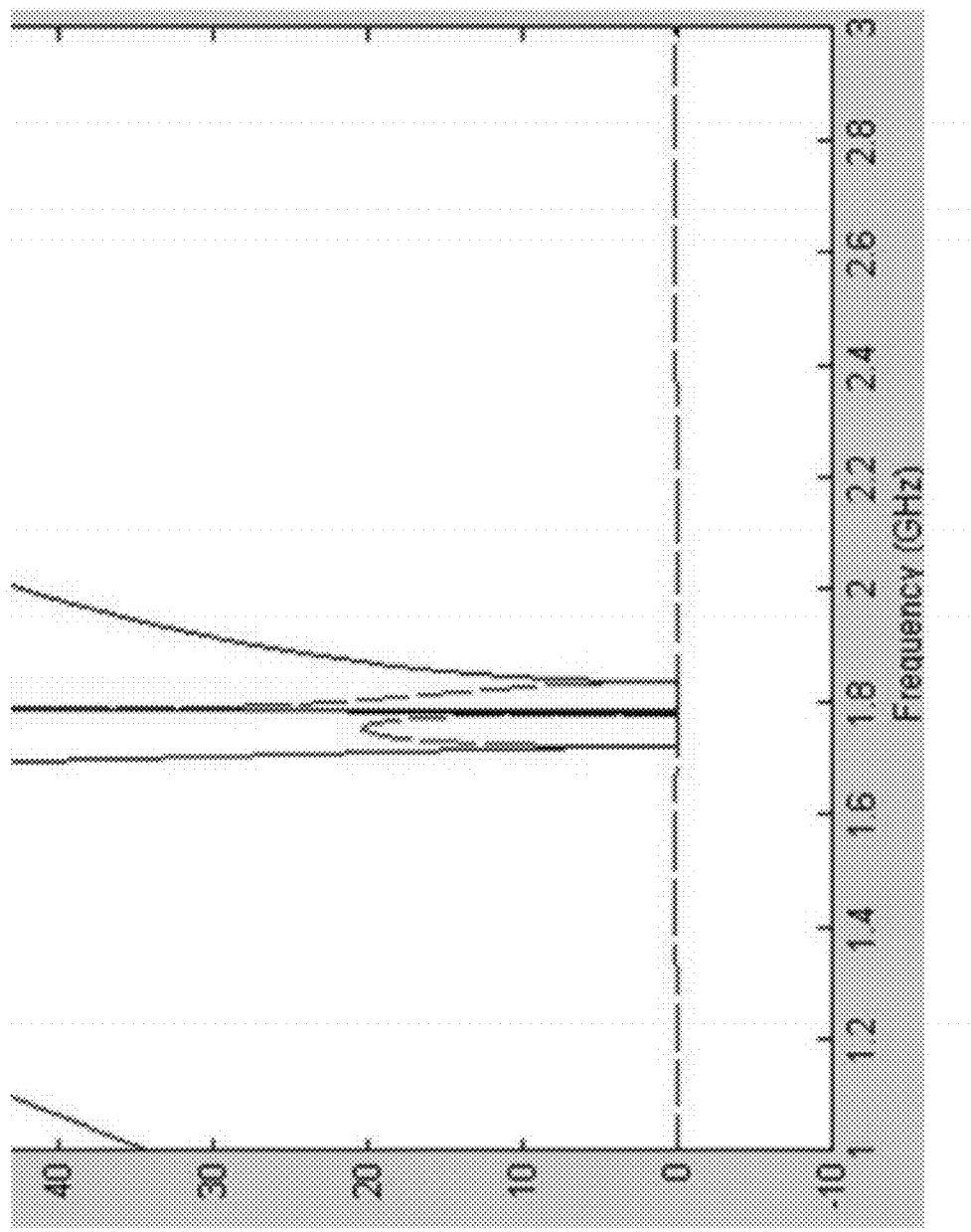
FIG. 40C illustrates an input impedance of the E-CRLH circuit having a matching at 20 ohms instead of 50 ohms.

FIG. 40C illustrates the input impedance of the E-CRLH circuit which has a matching at 20 ohms instead of 50 ohms. This mismatch occurs without taking into account the additional LTCC parasitic couplings.

Figure 40D:
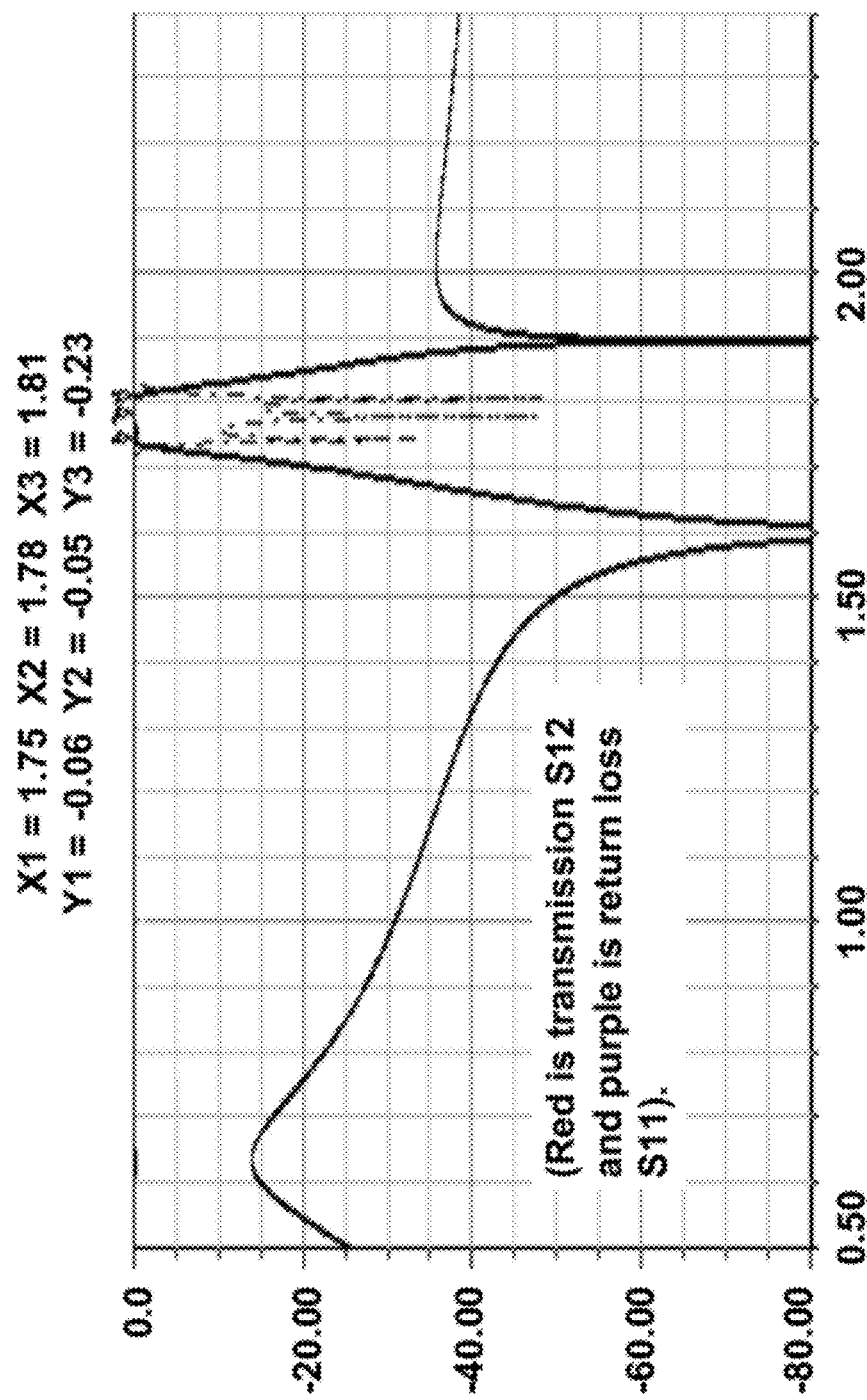
FIG. 40D illustrates a filter response of the E-CRLH circuit having 20 ohm input/output ports.
Figure 23:
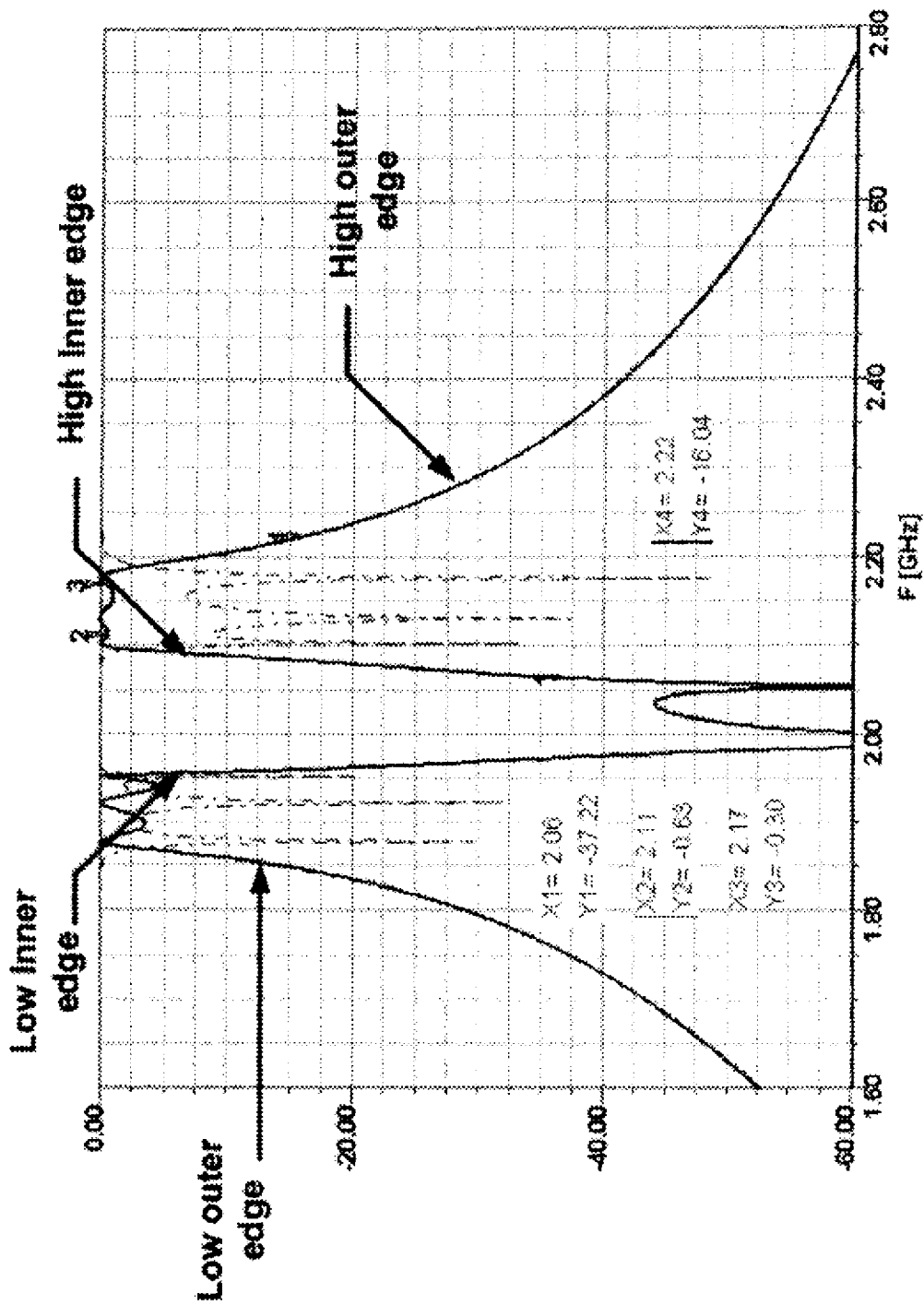

FIG. 40D illustrates the filter response of the E-CRLH circuit having 20 ohm input/output ports.

While this specification contains many specifics, these should not be construed as limitations on the scope of any invention or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above are acting in certain combinations and even initially claimed as such, one or more features from a claimed combination can in some cases be exercised from the combination, and the claimed combination may be directed to a subcombination or variation of a subcombination.

Thus, particular embodiments have been described. Variations, enhancements and other embodiments can be made based on what is described and illustrated.

What is claimed is:

1. A metamaterial filter apparatus, comprising:
a printed multilayer assembly having a plurality of printed, vertically-stacked layers;
a plurality of inductors and capacitors, wherein each inductor and each capacitor are formed on up to six layers of the printed multilayer assembly, wherein a number of inductors formed is greater than or equal to 4, and wherein a number of capacitors formed is greater than 4; and
a plurality of vias formed in the printed multilayer assembly to connect the inductors and the capacitors,
wherein the inductors, the capacitors, and the vias are structured to produce an extended composite right-handed/left-handed (E-CRLH) configuration.

2. The metamaterial filter apparatus of claim 1, wherein the inductors, the capacitors, and the vias are structured to produce a symmetric E-CRLH filter.

3. The metamaterial filter apparatus of claim 1, wherein the inductors, the capacitors, and the vias are structured to produce an asymmetric E-CRLH filter.

4. The metamaterial filter apparatus of claim 2, wherein the symmetric E-CRLH filter is configured as a broadband high-Q filter.

5. The metamaterial filter apparatus of claim 2, wherein the symmetric E-CRLH filter is configured as a narrowband high-Q filter.

6. The metamaterial filter apparatus of claim 3, wherein the asymmetric E-CRLH filter is configured as a broadband high-Q filter.

7. The metamaterial filter apparatus of claim 3, wherein the asymmetric E-CRLH filter is configured as a narrowband high-Q filter.

8. The metamaterial filter apparatus of claim 1, wherein the printed multilayer assembly is low-temperature co-fired ceramic (LTCC) or high-temperature co-fired ceramic (HTCC).

9. The metamaterial filter apparatus of claim 1, further comprising a mounting assembly configured to be connected to a top layer or to a bottom layer of the plurality of layers.

10. The metamaterial filter apparatus of claim 1, wherein respective ones of the plurality of layers comprise at least one dielectric substance, and wherein the respective ones of the plurality of layers are printed with a conductive substance.

11. The metamaterial filter apparatus of claim 1, wherein the number of the plurality of layers is four.

12. The metamaterial filter apparatus of claim 1, further comprising a plurality of vias connected to ground and to respective conducting grounding portions located around respective peripheries of respective layers of the plurality of printed, vertically-stacked layers.

13. A method of fabricating a metamaterial filter apparatus, the method comprising:
forming a plurality of printed vertically-stacked layers, comprising forming a plurality of structures on the layers, the structures configured to implement inductors and capacitors, wherein respective ones of the inductors and the capacitors are formed on up to six layers of the printed multilayer assembly, wherein a number of inductors formed is greater than or equal to four, and wherein a number of capacitors formed is greater than four; and
forming a plurality of vias among the plurality of layers to connect the inductors and capacitors,
wherein the inductors, the capacitors, and the vias are arranged to produce an extended composite right-handed/left-handed (E-CRLH) configuration.

14. The method according to claim 13, wherein said forming the plurality of printed vertically-stacked layers comprises using a low-temperature co-fired ceramic (LTCC) or a high-temperature co-fired ceramic (HTCC).

15. The method according to claim 13, further comprising connecting a mounting assembly to a top layer or a bottom layer of the plurality of printed vertically-stacked layers.

16. The method according to claim 13, wherein respective ones of the plurality of layers comprise at least one dielectric substance, and wherein the forming the plurality of structures on the layers comprises printing the respective ones of the plurality of layers with a conductive substance.

17. The method according to claim 13, further comprising forming a plurality of vias connected to ground and to respective conducting grounding portions located around respective peripheries of respective layers of the plurality of printed vertically-stacked layers.

* * * * *

UNITED STATES PATENT AND TRADEMARK OFFICE
CERTIFICATE OF CORRECTION

PATENT NO. : 8,334,734 B2
APPLICATION NO. : 12/547273
DATED : December 18, 2012
INVENTOR(S) : Achour It is certified that error appears in the above-identified patent and that said Letters Patent is hereby corrected as shown below:

In the Drawings

Figure 23:
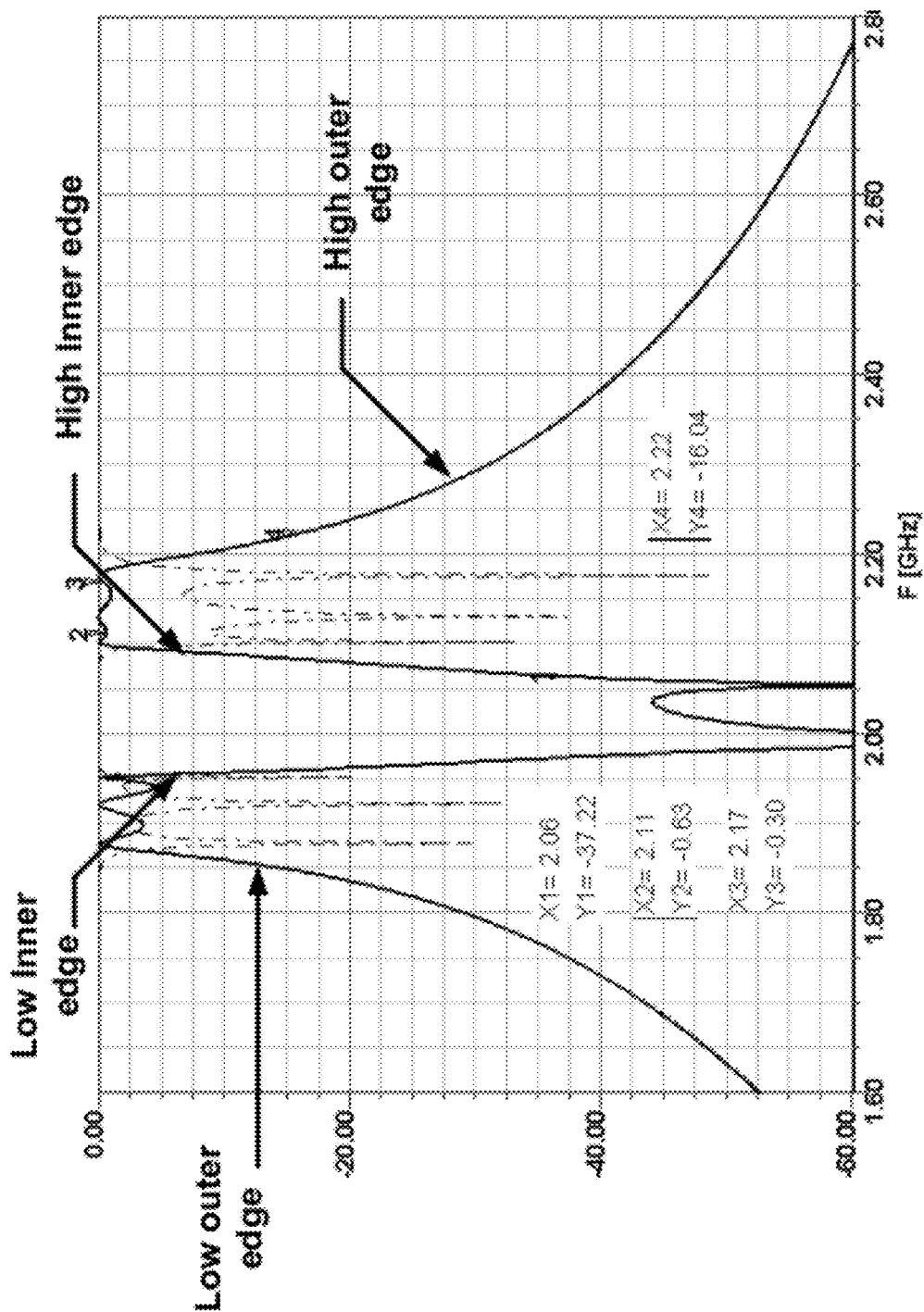
FIG. 23 illustrates a circuit simulation response for a narrowband filter having a sharp lower or upper edge.

Delete Drawing Sheet 27 of 51 and substitute therefore with the attached Drawing Sheet 27 of 51 consisting of corrected Fig. 23.

In the Specification

In Column 4, Line 10, delete "ohms;" and insert -- ohms; and --, therefore.

In Column 6, Line 2, delete "$\lambda_g=2 \pi/|\beta| \to \infty$," and insert -- $\lambda_g=2\pi/|\beta| \to \infty$, --, therefore.

In Column 6, Line 10, delete "CRHL" and insert -- CRLH --, therefore.

In Column 6, Line 23, delete "$\eta_m=\beta_m l=m\pi$" and insert -- $\theta_m=\beta_m l=m\pi$ --, therefore.

In Column 7, Line 24, delete "respectively," and insert -- respectively. --, therefore.

In Column 8, Line 15, in Eq. (4), delete "where $A_N = 1$ at even resonances $|n| = 2m \in \{0, 2, 3, \ldots 2 \times Int\left(\frac{N-1}{2}\right)\}$,"

and insert -- where $A_N = 1$ at even resonances $|n| = 2m \in \{0, 2, 4, \ldots 2 \times Int\left(\frac{N-1}{2}\right)\}$ --, therefore.

In Column 8, Line 24, delete "n=(2 m+1) and even n=2 m" and
insert -- n=(2m+1) and even n=2m --, therefore.

In Column 8, Line 64, delete "($\omega_{SE}$, $\omega_{SE}$)." and insert -- ($\omega_{SE}$, $\omega_{SH}$). --, therefore.

Signed and Sealed this
Twenty-fifth Day of February, 2014

Michelle K. Lee
*Deputy Director of the United States Patent and Trademark Office*

In Column 8, Line 67, delete "ω=4" and insert -- $\chi=4$ --, therefore.

In Column 10, Line 9, delete "0≤ZY=χ≤4." and insert -- $0 \leq -ZY = \chi \leq 4.$ --, therefore.

In Column 13, Line 3, delete "$\omega_{SE}$" and insert -- $\omega_{SII}$ --, therefore.

In Column 18, Line 26, delete "Freq_02," and insert -- Freq0_2, --, therefore.

In Column 19, Line 20, delete "OHMs" and insert -- Ohms --, therefore.

In Column 19, in Table 12, under "$\omega_{0,i}$ (GHz)", in Line 1, delete "$\omega_{0,i}=0.38$" and insert -- $\omega_{0,1}=0.38$ --, therefore.